(12) United States Patent
Hsu et al.

(10) Patent No.: US 12,087,772 B2
(45) Date of Patent: Sep. 10, 2024

(54) NANOSHEET DEVICE ARCHITECTURE FOR CELL-HEIGHT SCALING

(71) Applicant: Taiwan Semiconductor Manufacturing Co., Ltd., Hsinchu (TW)

(72) Inventors: Chung-Wei Hsu, Hsinchu (TW); Kuo-Cheng Chiang, Hsinchu (TW); Mao-Lin Huang, Hsinchu (TW); Lung-Kun Chu, Hsinchu (TW); Jia-Ni Yu, Hsinchu (TW); Kuan-Lun Cheng, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 377 days.

(21) Appl. No.: 17/476,140

(22) Filed: Sep. 15, 2021

(65) Prior Publication Data

US 2022/0320090 A1 Oct. 6, 2022

Related U.S. Application Data

(60) Provisional application No. 63/169,144, filed on Mar. 31, 2021.

(51) Int. Cl.
*H01L 21/02* (2006.01)
*B82Y 10/00* (2011.01)
(Continued)

(52) U.S. Cl.
CPC ........ *H01L 27/092* (2013.01); *H01L 21/0259* (2013.01); *H01L 21/28088* (2013.01);
(Continued)

(58) Field of Classification Search
CPC ............... H01L 27/092; H01L 21/0259; H01L 21/28088; H01L 21/823807;
(Continued)

(56) References Cited

U.S. PATENT DOCUMENTS 9,236,267 B2  1/2016  De et al.
9,502,265 B1  11/2016 Jiang et al.
(Continued)

FOREIGN PATENT DOCUMENTS

TW         202111809 A  *  3/2021  ........ H01J 37/32082

*Primary Examiner* — Herve-Louis Y Assouman
(74) *Attorney, Agent, or Firm* — Seed IP Law Group LLP

(57) ABSTRACT

A semiconductor device is provided. The semiconductor device includes first channel nanostructures in a first device region and second channel nanostructures in a second device region. The first channel nanostructures are disposed between first and second dielectric fins. The second channel nanostructures are disposed between first and third dielectric fins. A gate dielectric layer is formed to surround each of the first and the second channel nanostructures and over the first, the second and the third dielectric fins. A first work function layer is formed to surround each of the first channel nanostructures. A second work function layer is formed to surround each of the second channel nanostructures. A first gap is present between every adjacent first channel nanostructures and a second gap present is between every adjacent second channel nanostructures.

20 Claims, 50 Drawing Sheets

(51) Int. Cl.
| | |
|---|---|
| *H01L 21/28* | (2006.01) |
| *H01L 21/8234* | (2006.01) |
| *H01L 21/8238* | (2006.01) |
| *H01L 27/092* | (2006.01) |
| *H01L 29/06* | (2006.01) |
| *H01L 29/165* | (2006.01) |
| *H01L 29/267* | (2006.01) |
| *H01L 29/417* | (2006.01) |
| *H01L 29/423* | (2006.01) |
| *H01L 29/49* | (2006.01) |
| *H01L 29/66* | (2006.01) |
| *H01L 29/775* | (2006.01) |
| *H01L 29/78* | (2006.01) |
| *H01L 29/786* | (2006.01) |

(52) U.S. Cl.
CPC ........ *H01L 21/823807* (2013.01); *H01L 21/823814* (2013.01); *H01L 21/823842* (2013.01); *H01L 21/823871* (2013.01); *H01L 29/0665* (2013.01); *H01L 29/41733* (2013.01); *H01L 29/42392* (2013.01); *H01L 29/4908* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC ..... H01L 21/823814; H01L 21/823842; H01L 21/823871; H01L 29/0665; H01L 29/41733; H01L 29/42392; H01L 29/4908; H01L 29/66545; H01L 29/66553; H01L 29/66742; H01L 29/78618; H01L 29/78696; H01L 21/823878; H01L 29/0673; H01L 29/1079; H01L 29/66439; H01L 29/165; H01L 29/267; H01L 29/42376; H01L 29/7848; H01L 29/775; H01L 21/823412; H01L 21/823431; H01L 21/823437; H01L 21/823481; H01L 27/0886; B82Y 10/00

See application file for complete search history.

(56) References Cited

U.S. PATENT DOCUMENTS

| | | | |
|---|---|---|---|
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 10,490,559 | B1 * | 11/2019 | Ando ............... H01L 21/0262 |
| 10,510,620 | B1 * | 12/2019 | Chanemougame ......... H01L 27/0924 |

* cited by examiner

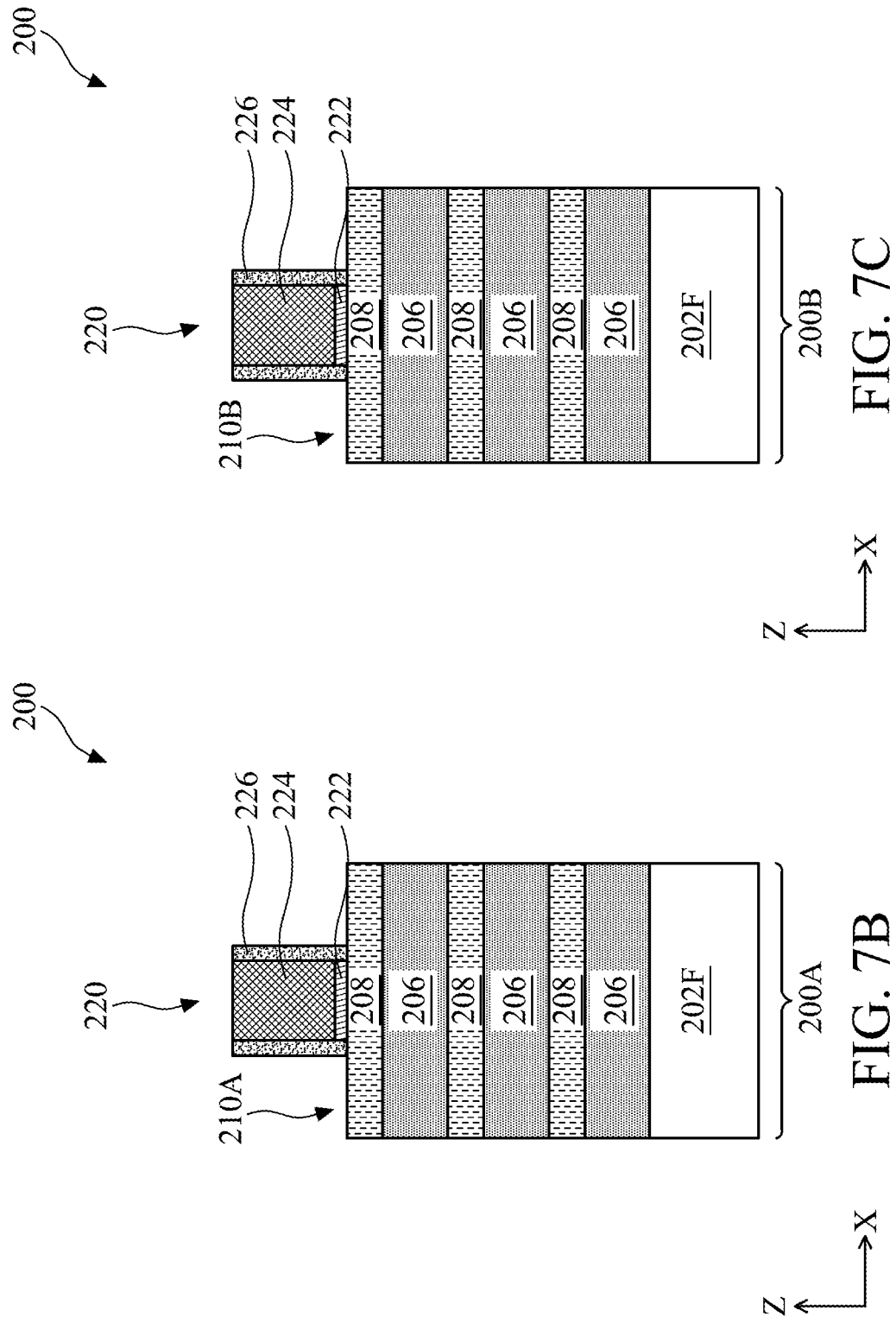

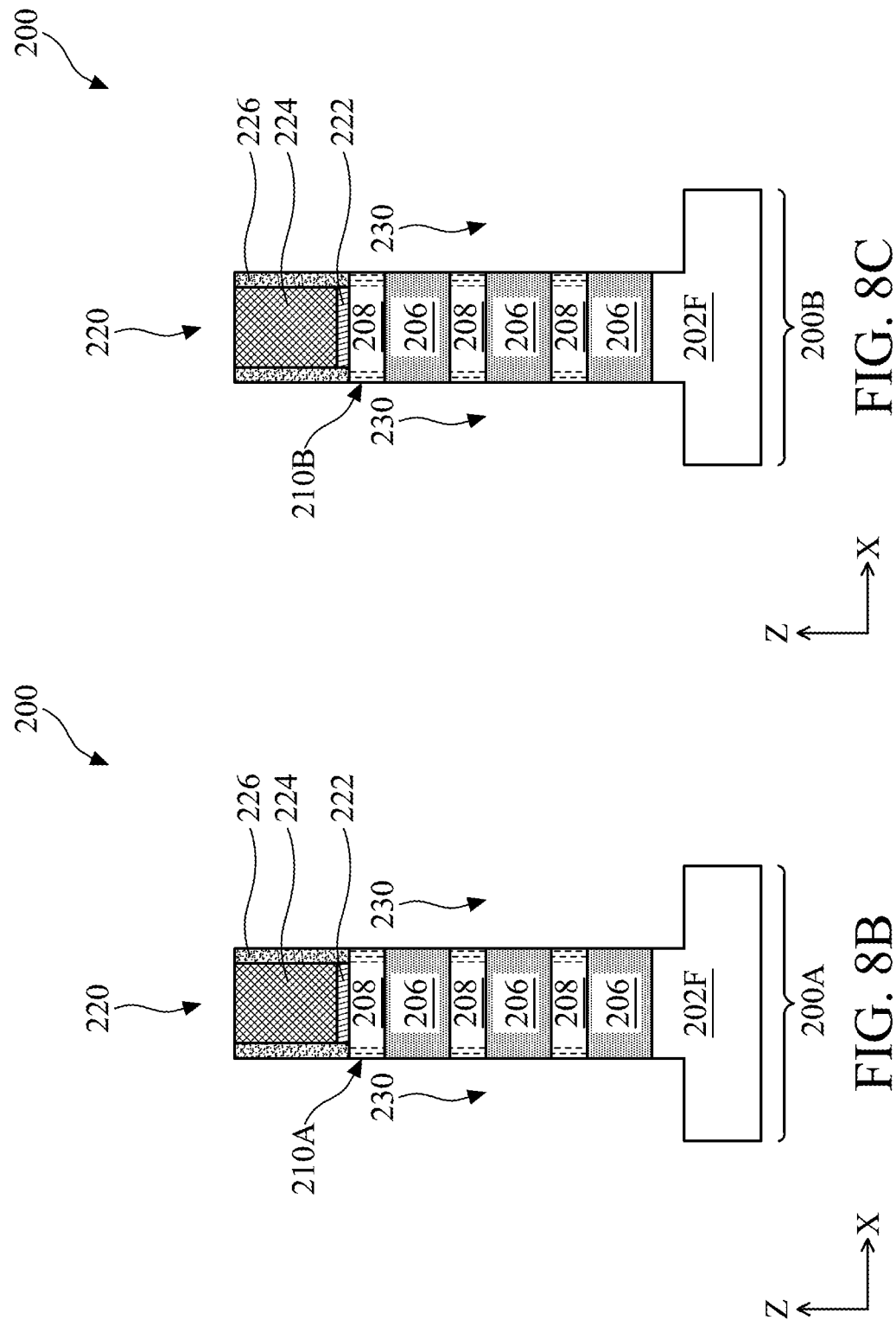

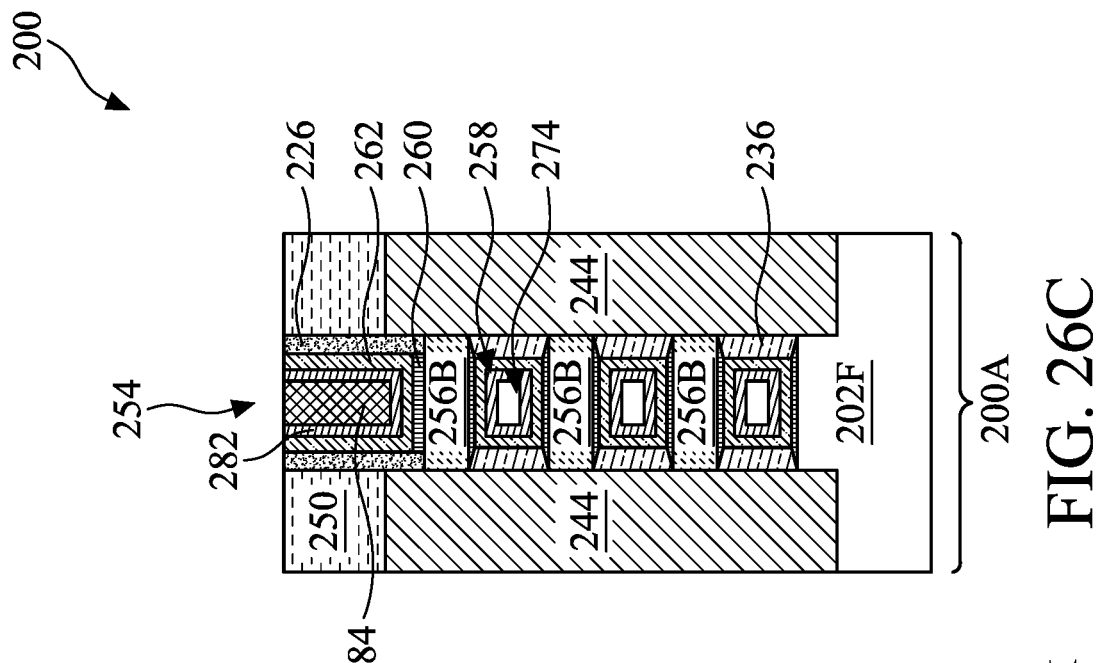
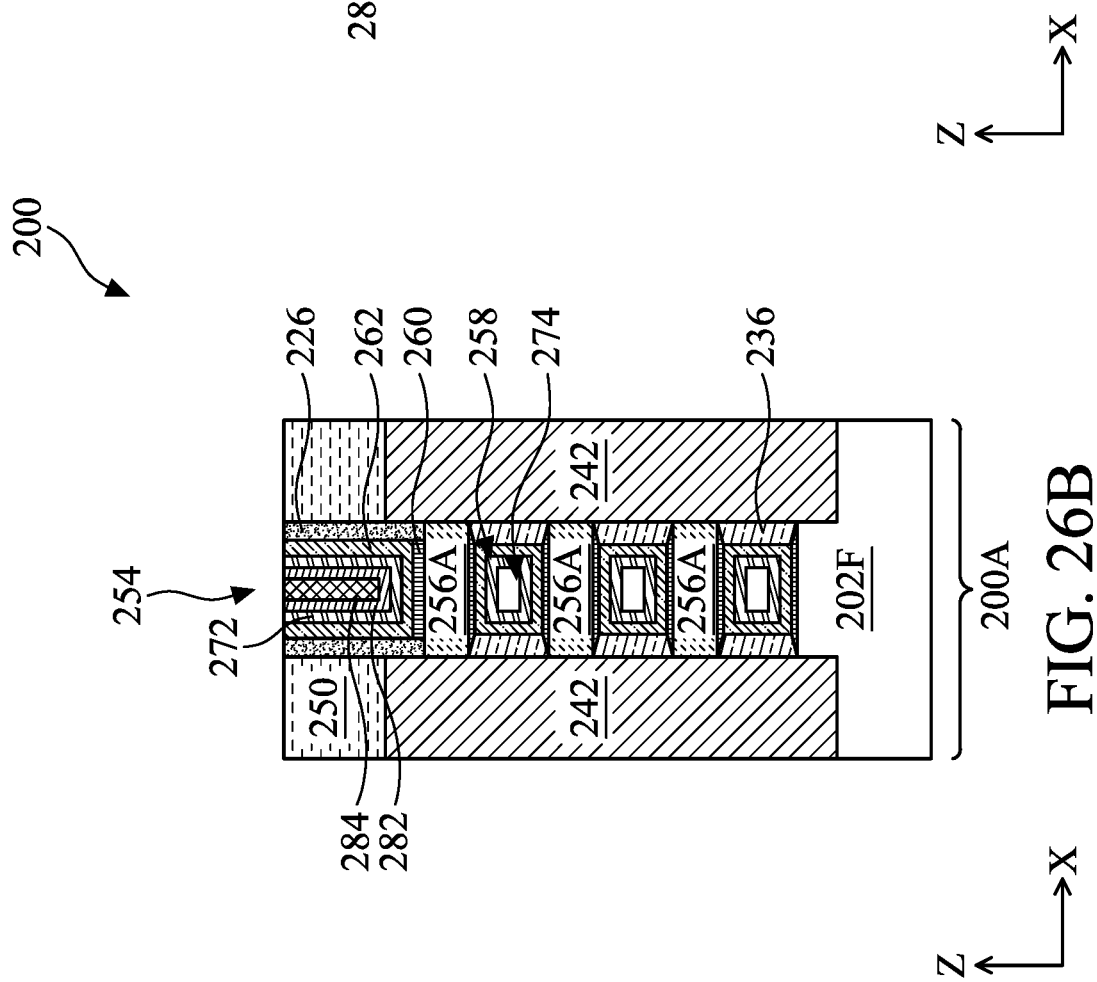
FIG. 26B
FIG. 26C

NANOSHEET DEVICE ARCHITECTURE FOR CELL-HEIGHT SCALING

PRIORITY CLAIM AND CROSS-REFERENCE

This application claims the benefit of U.S. Provisional Patent Application No. 63/169,144, filed Mar. 31, 2021, which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
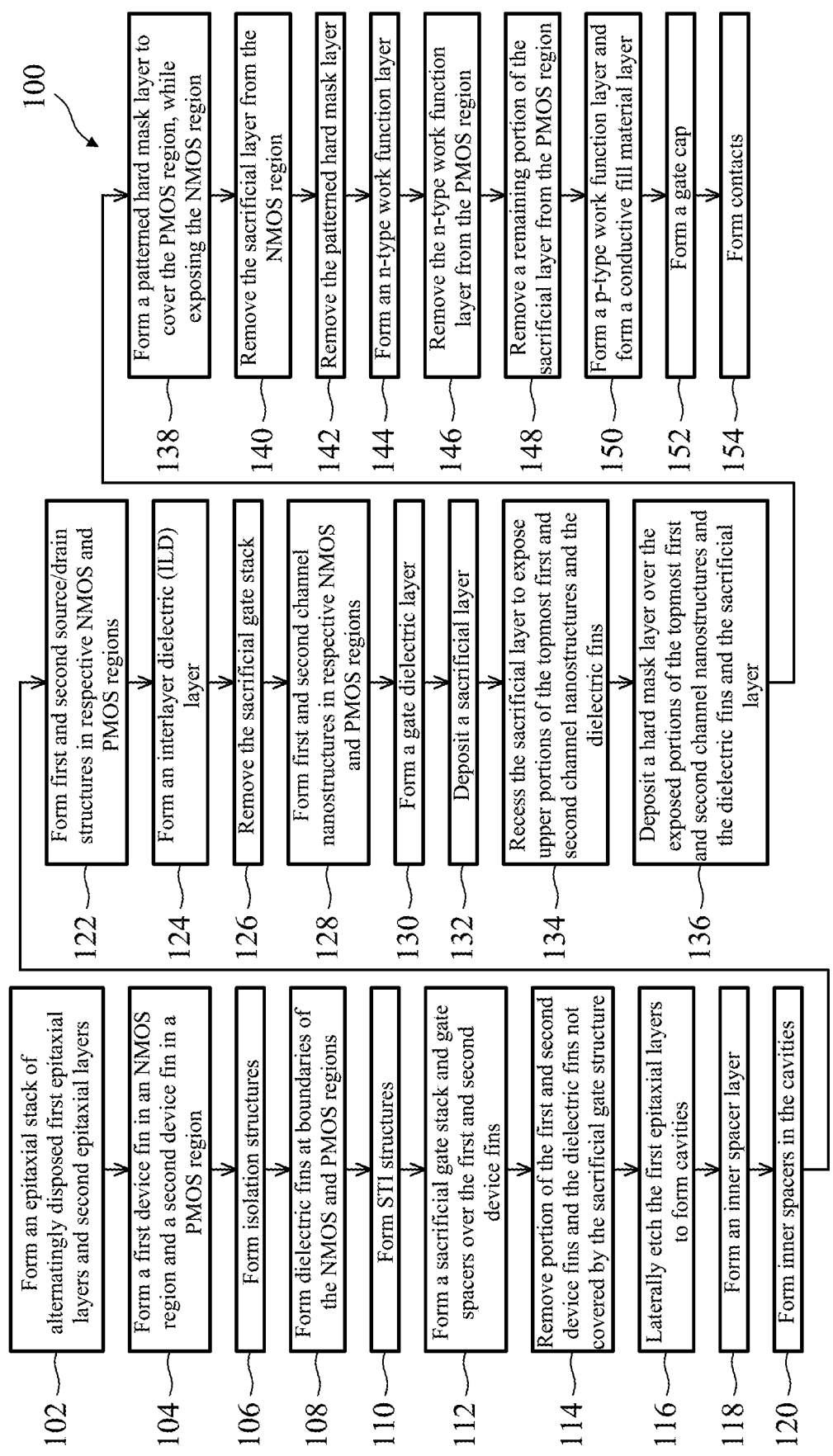
FIG. 1 is a flow chart outlining a method for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

For advanced technology of semiconductor devices, multiple threshold voltages (Vts) for device function flexibility become more and more important. However, multiple patterning gates (MPGs) to enable multiple Vts face difficulties because of shrinkage of device dimension and cell heights. Multiple Vts are arranged one next to another in various regions of a semiconductor device and may be referred to as mixed Vts. When a wet over-etching is applied to ensure complete removal of the gate material in one region, the gate material in another neighboring region may suffer loss and a patterning boundary is thereby varied. There are challenges in fabrication of MPGs having mixed Vts, especially in advanced semiconductor devices such as Fin Field Effect Transistor (FinFET) devices with nanowires or nanosheets for GAA structures at technology nodes of 3 nm (N3) and below.

Embodiments disclosed herein relate generally to fabricating semiconductor devices with mixed threshold voltages (Vts) boundary isolation of multiple patterning gates and structures formed thereby. The embodiments of the disclosure provide an etching back process to produce mixed Vts boundary isolation of multiple patterning gates. The etching back process uses a sacrificial layer to allow removing a first-type work function layer (e.g., an n-type work function layer) from a neighboring p-type device region without metal gate material loss in the n-type device region. The embodiments of the disclosure can avoid metal gate material loss and prevent metal gate retreat along the N/P boundary. Therefore, the embodiments of the disclosure can achieve high Vt in both n-type and p-type device regions, better Vt control in terms of Vt level and uniformity for semiconductor devices such as FinFET devices with nanowires or nanosheets for multiple GAA structures having mixed Vts at technology nodes of N3 and below. Moreover, cell height budget of the semiconductor devices can be saved due to minimized lateral material loss of metal gate.

The foregoing broadly outlines some aspects of the embodiments described herein. Some embodiments described herein are described in the context of FinFET devices, and more particularly, in the context of forming mixed Vts boundary isolation of multiple patterning gates for FinFET devices with GAA structures. The GAA structures in the p-type and n-type device regions are formed using the etching back process of a sacrificial layer. Some variations of the exemplary methods and structures are described. A person having ordinary skill in the art will readily understand other modifications may be made that are contemplated within the scope of other embodiments.

Implementations of some aspects of the present disclosure may be used in other processes and/or in other devices. Throughout the various views and illustrative embodiments, like reference numbers are used to designate like elements. Although embodiments of the method may be described in a particular order, various other embodiments of the method may be performed in any logical order and may include fewer or more steps than what is described herein.

FIG. 1 is a flowchart of a method 100 of forming a semiconductor device 200, according to various aspects of the present disclosure. FIGS. 2-28C are various cross-sectional views of the semiconductor device 200 at various stages of the method 100, in accordance with some embodiments. Some embodiments of method 100 are described below in conjunction with FIGS. 2-28C with reference to the semiconductor device 200. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method.

Figure 2:
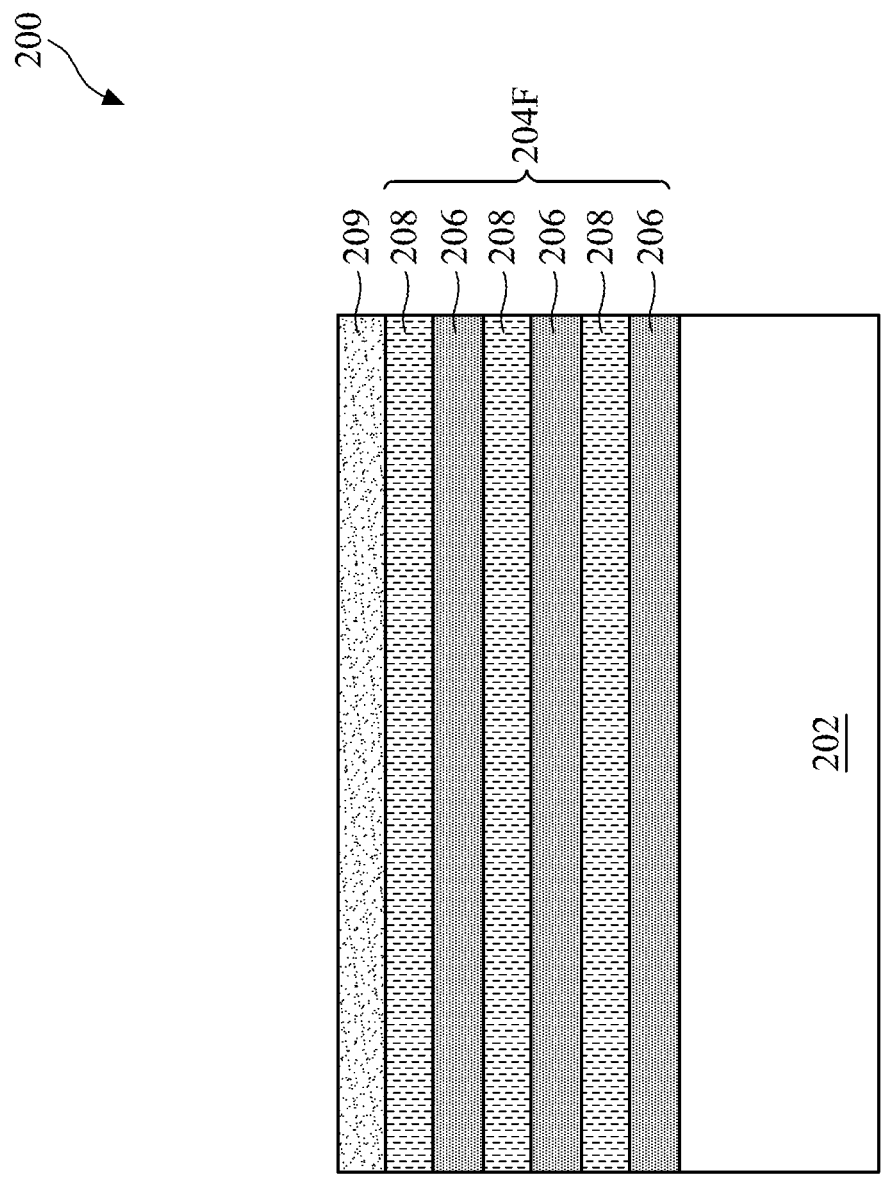
FIGS. 2-28C are various cross-sectional views of a semiconductor device at various stages of the method of FIG. 1, in accordance with some embodiments.

Referring to FIGS. 1 and 2, the method 100 includes operation 102, in which an epitaxial stack 204 is formed over a substrate 202 of the semiconductor device 200, in accordance with some embodiments. FIG. 2 is a cross-sectional view of the semiconductor device 200 after forming the epitaxial stack 204 over the substrate 202.

The substrate 202 can be any suitable substrate, and can be processed with various features. In some embodiments, the substrate 202 may be a semiconductor substrate such as a silicon substrate. In some embodiments, the substrate 202 includes various layers, including conductive or insulating layers formed on a semiconductor substrate. The substrate 202 may include various doping configurations. For example, different doping profiles (e.g., n wells, p wells) may be formed on the substrate 202 in regions designed for different device types (e.g., n-type FETs, p-type FETs). The suitable doping may include ion implantation of dopants and/or diffusion processes. The substrate 202 typically has isolation features (e.g., shallow trench isolation (STI) features) interposing the regions providing different device types. The substrate 202 includes other semiconductors such as germanium or diamond. Alternatively, the substrate 202 includes a compound semiconductor such as silicon carbide (SiC), gallium arsenic, gallium phosphide, indium phosphide, indium arsenide, indium antimonide; an alloy semiconductor, such as SiGe, GaAsP, AlInAs, AlGaAs, GaInAs, GaInP, GaInAsP, and/or other suitable materials. Further, the substrate 202 may optionally include an epitaxial layer, may be strained for performance enhancement, may include a silicon-on-insulator structure, and/or have other suitable enhancement features.

The epitaxial stack 204 includes first epitaxial layers 206 of a first composition interposed by second epitaxial layers 208 of a second composition. The materials of the first and second epitaxial layers, 206 and 208, may be chosen based on providing differing etch selectivity properties. In some embodiments, the first composition and the second composition are different. In some embodiments, the second epitaxial layers 208 include the same material as the substrate 202. In some embodiments, the first and second epitaxial layers 206 and 208 include a different material than the substrate 202. In some examples, the first epitaxial layer 206 includes SiGe and the second epitaxial layer 208 includes Si. Alternatively, in some embodiments, either of the first and second epitaxial layers 206 and 208 include other materials such as germanium, a compound semiconductor such as SiC, gallium arsenide, gallium phosphide, indium phosphide, indium arsenide, and/or indium antimonide, an alloy semiconductor such as SiGe, GaAsP, AlInAs, AlGaAs, InGaAs, GanP, and/or GaInAsP, or combinations thereof. In various embodiments, the first and second epitaxial layers 206 and 208 are substantially dopant-free (i.e., having an extrinsic dopant concentration less than about $1 \times 10^{17}$ cm$^{-3}$).

As described in more detail below, in an example, channel nanostructures of a transistor are respectively formed using the second epitaxial layers 208. The thickness of the second epitaxial layers 208 is thus chosen based on, for example, manufacturing considerations, transistor performance considerations, and the like. In an example, the thickness of the first epitaxial layers 206 is used to define a space between adjacent channel nanostructures, and the respective thickness of the first epitaxial layers 206 is chosen based on, for example, manufacturing considerations, transistor performance considerations, and the like. In some embodiments, the first and second epitaxial layers 206 and 208 have different thicknesses. Further, the first epitaxial layers 206 may have different thicknesses from one layer to another layer, and the second epitaxial layers 208 may have different thicknesses from one layer to another layer. In some embodiments, the thickness of each of the first and second epitaxial layers 206 and 208 ranges from several nanometers to tens of nanometers. In some embodiments, each of the first epitaxial layers 206 has a thickness ranging from about 10 nm to about 20 nm. In some embodiments, each of the second epitaxial layers 208 has a thickness ranging from about 5 nm to 12 nm.

The number of epitaxial layers depends on the desired number of channel nanostructures for the semiconductor device 200. In some embodiments, the number of second epitaxial layers 208 is from 2 to 10, for example, to form a stack of 2 to 10 channel nanostructures. In some embodiments and as illustrated in FIG. 2, the epitaxial stack 204 includes three (3) layers of first epitaxial layers 206 and three (3) layers of second epitaxial layers 208.

In some embodiments, the first and second epitaxial layers 206 and 208 are epitaxially grown layer-by-layer from a top surface of the substrate 202. In an example, each of the first and second epitaxial layers 206 and 208 are grown by a molecular beam epitaxy (MBE) process, a chemical vapor deposition (CVD) process such as a metal organic CVD (MOCVD) process, and/or other suitable epitaxial growth processes. The epitaxial growth results in the first and second epitaxial layers 206 and 208 having the same crystal orientation as the substrate 202.

As also shown in the example of FIG. 2, a hard mask layer 209 is formed over the epitaxial stack 204. In some embodiments, the hard mask layer 209 includes a dielectric material such as, for example, silicon nitride (SiN), silicon carbon nitride (SiCN), silicon oxycarbide (SiOC), silicon oxycarbon nitride (SiOCN), or a combination thereof. In some embodiments, the hard mask layer 209 is formed by chemical vapor deposition (CVD), including low pressure CVD (LPCVD) and plasma enhanced CVD (PECVD), physical vapor deposition (PVD), atomic layer deposition (ALD), or other suitable deposition processes. In some embodiments, the hard mask layer 209 may have a double-layer structure including a pad oxide layer and a pad nitride layer formed over the pad oxide layer. In some embodiments, the pad oxide layer includes silicon oxide, which can be formed by thermal oxidation. The pad nitride layer includes SiN, which can be formed by CVD, including LPCVD and PECVD, PVD, ALD, or other suitable deposition processes. The hard mask layer 209 is used to protect portions of the substrate 202 and/or the epitaxial stack 204 and/or is used to define a pattern (e.g., fins) as described below.

Figure 3:
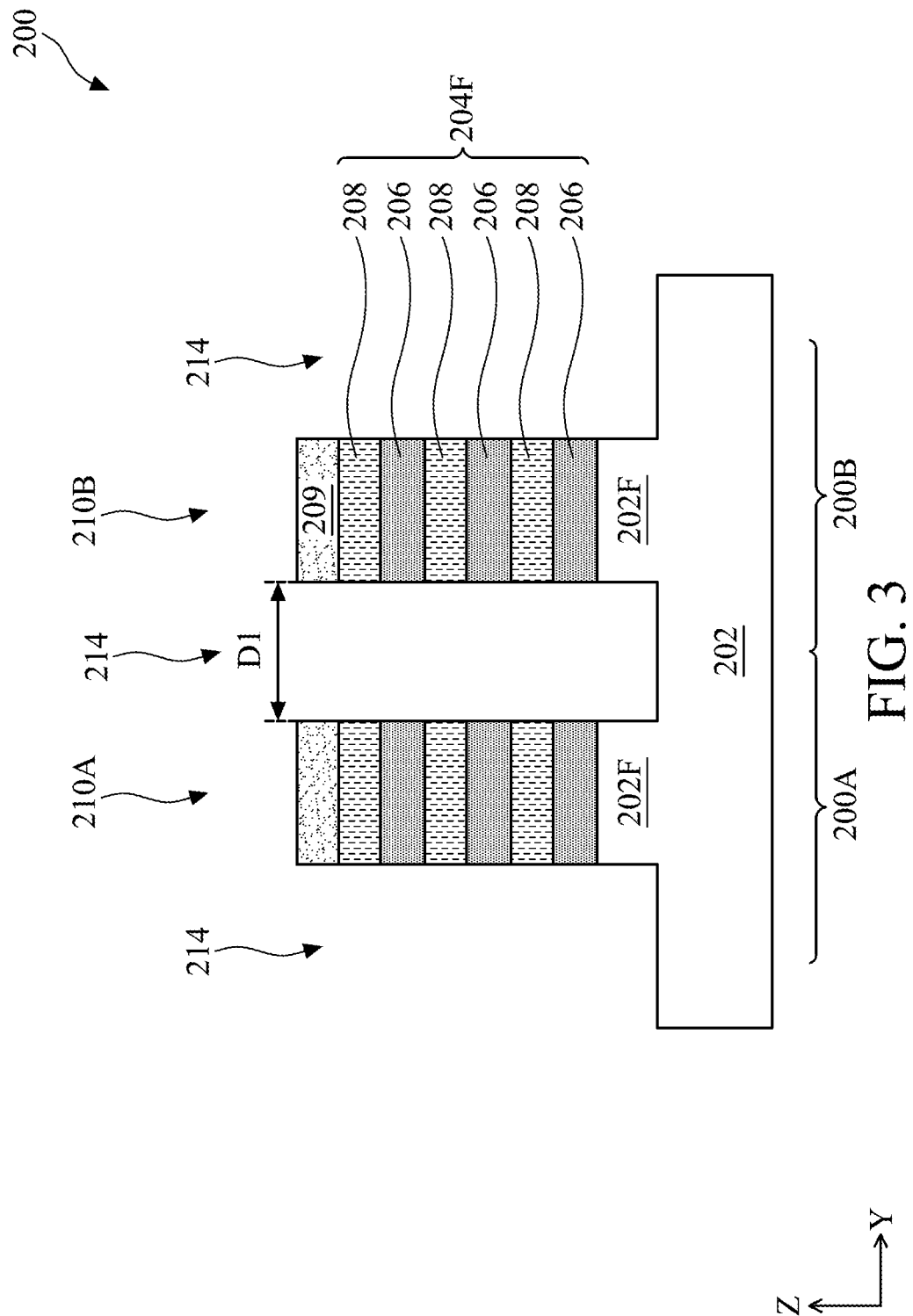

Referring to FIGS. 1 and 3, the method 100 proceeds to operation 104, in which the epitaxial stack 204 is patterned to form a plurality of device fins (also referred to as semiconductor fins) 210A, 210B, in accordance with some embodiments. FIG. 3 is a cross-sectional view of the semiconductor device 200 of FIG. 2 after forming the device fins 210A, 210B. FIG. 3 is a y-cut cross-sectional view of the semiconductor device 200. In FinFET devices, fins extend in a first direction called an x-cut direction, and metal gates extend in a second direction called a y-cut direction. Thus, the y-cut cross-sectional view runs in parallel with a length direction of the metal gates and perpendicular to a lengthwise direction of the fins.

In some embodiments, the device fins includes a first device fin 210A disposed in a first region of the semiconductor device 200 and a second device fin 210B disposed in a second region of the semiconductor device 200. In some embodiments, the first region is a first-type device region such as an n-type metal-oxide-semiconductor (NMOS) region 200A, and the second region is a second-type device region such as a p-type metal-oxide-semiconductor (PMOS) region 200B. It should be noted that although a single first device fin 210A is illustrated in the NMOS region 200A and a single second device fin 210B is illustrated in the PMOS region 200B, any number of the device fins can be formed in each of the NMOS region 200A and the PMOS region 200B. It should also be noted that although the first-type device region is illustrated as an NMOS region and the second-type device region is illustrated as a PMOS region, the first-type device region can also be a PMOS region and the second-type device region can also be an NMOS region.

The device fins 210A and 210B protrudes upwards from the substrate 202 in z-direction. In various embodiments, each of the device fins 210A and 210B includes a fin base 202F and a fin stack 204F on the fin base 202F. The fin base 202F is formed from the substrate 202, while the fin stack 204F is formed from the epitaxial stack 204. The fin stack 204F includes portions of the first epitaxial layers 206 and the second epitaxial layer 208. As shown in FIG. 3, the first device fin 210A and the second device fin 210B are spaced apart from each other along a y-direction. In some embodiments, the distance D1 between the first device fin 210A and the second device fin 210B is from about 14 nm to about 60 nm. When the distance D1 is too great, the density of the resulting FETs is unnecessary reduced.

In some embodiments, the device fins 210A and 210B are fabricated using suitable processes including photolithography and etch processes. During a photolithography process, a photoresist layer is first applied to the hard mask layer 209 by, for example, spin coating. Then, the photoresist layer is exposed according to a mask of patterns, and is developed to form the patterns in the photoresist layer. The photoresist layer with the patterns can be used as an etch mask to pattern other layers. In some embodiments, patterning the photoresist layer is performed using an extreme ultraviolet light lithography process. The patterned photoresist layer is then used to protect regions of the substrate 202 and layers 206, 208 formed thereupon, while an etching process forms trenches 214 in unprotected regions through the hard mask layer 209, through the epitaxial stack 204, and into the substrate 202, thereby leaving the device fins 210A and 210B. In some examples, the trenches 214 are formed using a dry etch such as reactive ion etching (RIE), a wet etch, or a combination thereof.

In various other embodiments, the device fins 210A and 210B may be formed by any suitable method. For example, the device fins 210A and 210B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the epitaxial stack 204 to provide the device fins 210A and 210B.

Figure 4:
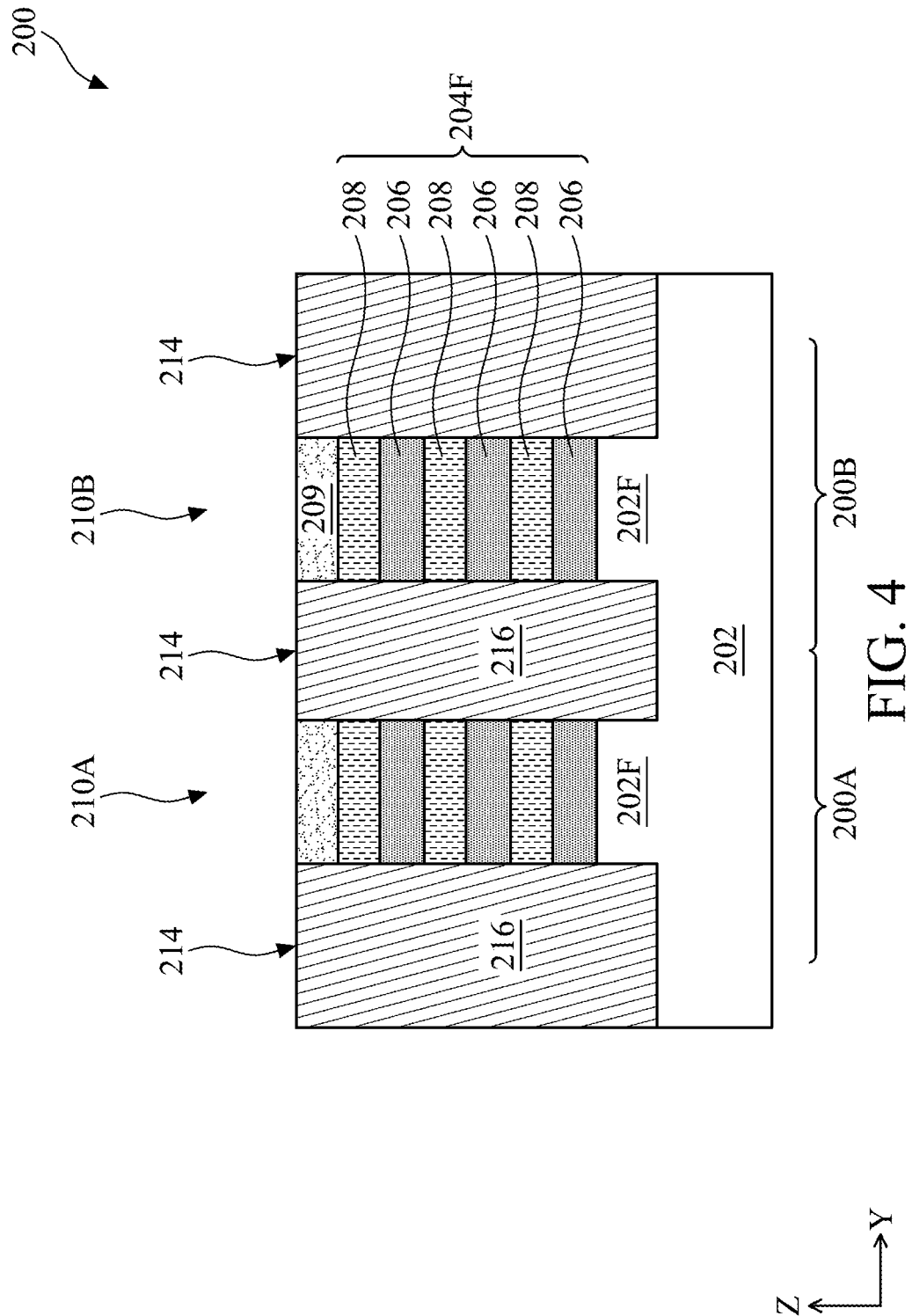

Referring to FIGS. 1 and 4, the method 100 proceeds to operation 106, in which isolation structures 216 are formed in the trenches 214, in accordance with some embodiments. FIG. 4 is a cross-sectional view of the semiconductor device 200 of FIG. 3 after forming isolation structures 216.

The isolation structures 216 may include one or more dielectric materials. Examples of dielectric materials for formation of the isolation structures 216 include, but are not limited to, silicon oxide, silicon nitride, silicon oxynitride, fluoride-doped silicate glass (FSG), a low dielectric constant (low-k) dielectric material, and/or other suitable dielectric materials. The dielectric material may be deposited by any suitable technique such as CVD, flowable CVD (FCVD), or spin coating to fill the trenches 214. After the deposition process, a planarization process such as a chemical mechanical polishing (CMP) process is performed on the deposited dielectric material to remove the dielectric material from the top surface of the hard mask layer 209 so that isolation structures 216 may be coplanar with the hard mask layer 209.

Figure 5:
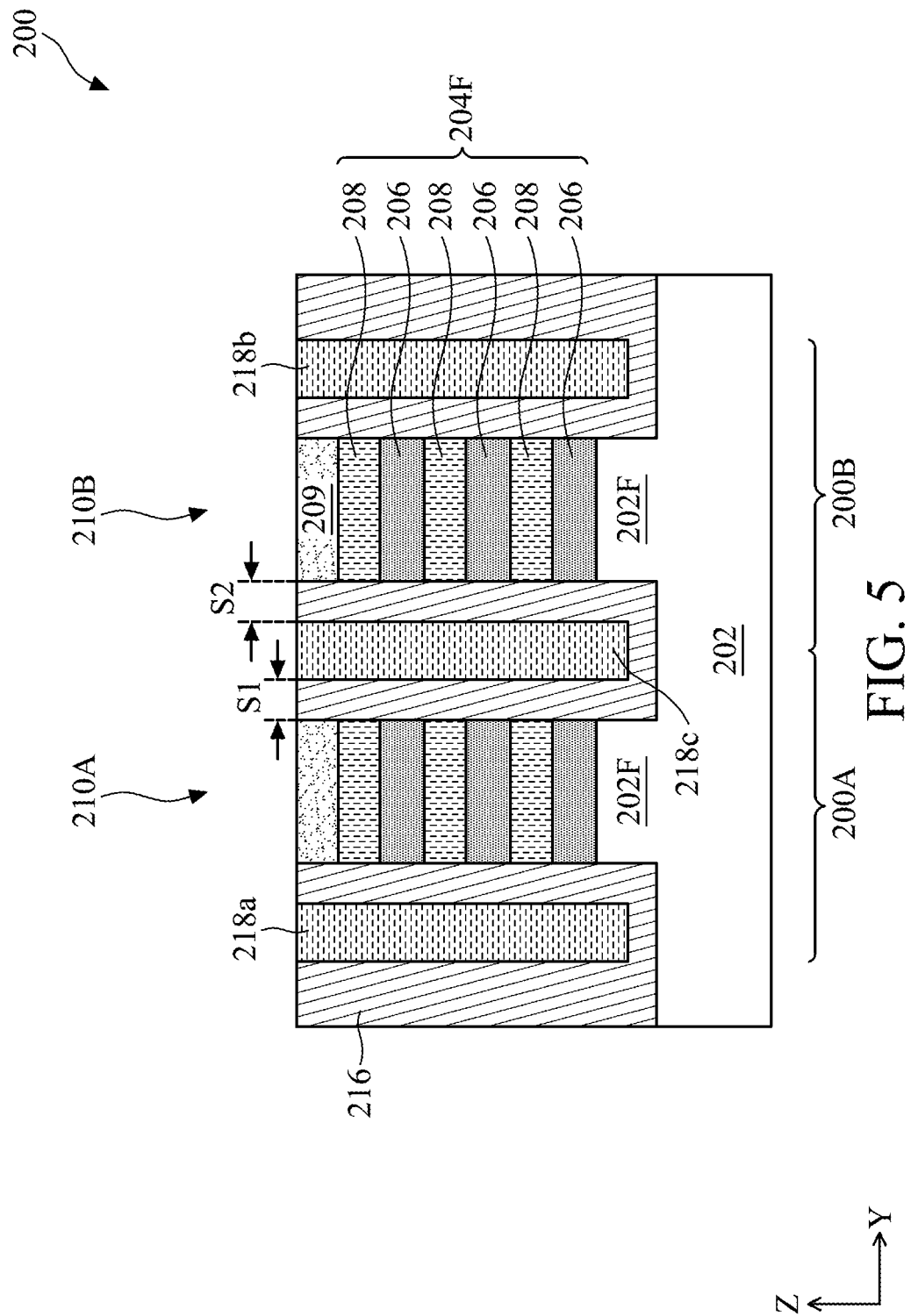

Referring FIGS. 1 and 5, the method 100 proceeds to operation 108, in which dielectric fins 218a-218c (also referred to as hybrid fins or isolation fins) are formed within the corresponding isolation structures 216, in accordance with some embodiments. FIG. 5 is a cross-sectional view of the semiconductor device 200 of FIG. 4 after forming dielectric fins 218a-218c.

Unlike the device fins 210A and 210B configured to provide active regions, the dielectric fins 218a-218c are inactive and not configured to form active regions. The dielectric fins 218a-218c define boundaries of the NMOS region 200A and the PMOS region 200B, and thus serve as end-cap fins. In an example and as illustrated in FIG. 5, the dielectric fins 218a and 218b are located at the respective outer boundaries of the NMOS region 200A and the PMOS region 200B, while the dielectric fin 218c is located at the boundary between the NMOS region 200A and the PMOS region 200B. The dielectric fin 218c prevents source/drain EPI bridging of an n-type FET formed in the NMOS region 200A and a p-type FET formed in the PMOS region 200B. In some embodiments, the dielectric fin 218c is placed in the middle of the first device fin 210A and the second device fin 210B, for example, with distances S1 and S2 having a difference smaller than about 20% for smaller than about 10% percent of either of distances S1 and S2. With the dielectric fin 218c being in the middle of the first device fin 210A and the second device fin 210B, both S1 and S2 may be kept minimal while still leaving adequate spacing between the p-type and n-type FETs, and hence the density of the resulting FETs may be maximized.

To form dielectric fins 218a-218c, in some embodiments, trenches are first formed in respective isolation structures 216 using photolithography and etching processes. The bottom surface of the trenches may be higher than or level with the bottom surfaces of the isolation structures 216. The trenches are then filled with one or more dielectric materials such as silicon carbide nitride (SiCN), silicon oxycarbide (SiOC), silicon oxycarbon nitride (SiOCN), a metal oxide, such as hafnium oxide, zirconium oxide, and aluminum oxide, and/or other suitable dielectric materials using a deposition process, such as CVD, FCVD, PVD, or ALD. Following the deposition, a planarization process such as a CMP process may be performed to remove the excess dielectric material. After the planarization process, the isolation structures 216, the dielectric fins 218, and the hard mask layer 209 may have coplanar top surfaces.

Figure 6:
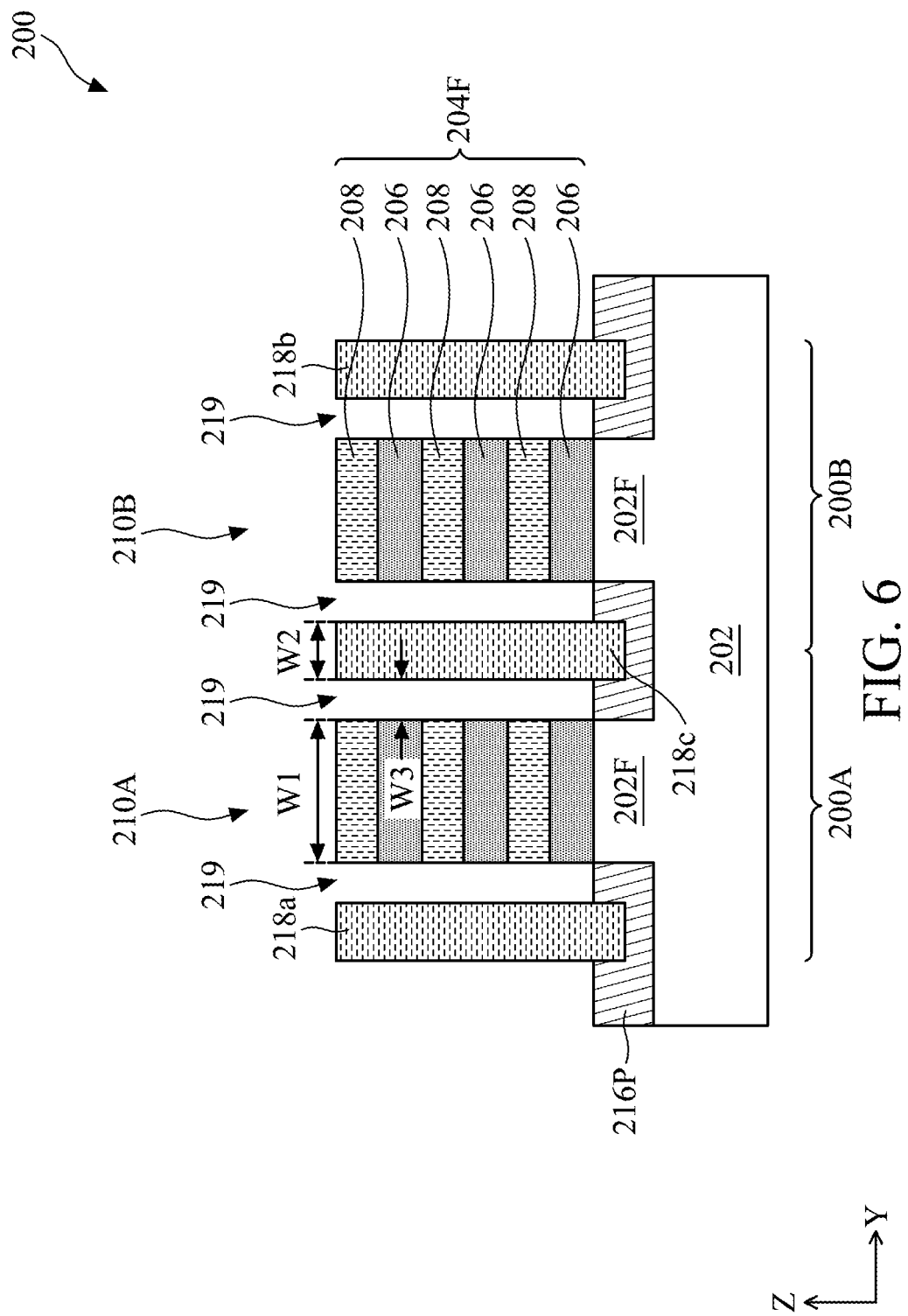

Referring to FIGS. 1 and 6, the method 100 proceeds to operation 110, in which the isolation structures 216 are recessed to form shallow trench isolation (STI) structures 216P, in accordance with some embodiments. FIG. 6 is a cross-sectional view of the semiconductor device 200 of FIG. 5 after forming the STI structures 216P.

The STI structures 216P surrounds the dielectric fins 218a-218c and the fin base 202F. In some embodiments, the recessing process includes a dry etching process, a wet etching process, or a combination thereof. In some embodiments, the recessing depth is controlled (e.g., by controlling an etching time) so as to result in a desired height of the exposed upper portions of the first and second device fins 210A and 210B. In some embodiments, after recessing, the top surfaces of the STI structures 216P may be lower than or level with the top surfaces of the fin base 202F so that the recessing exposes each of the first and second epitaxial layers 206 and 208 of the fin stack 204F.

The hard mask layer 209 may also be removed before, during, and/or after recessing of the isolation structures 216. In some embodiments, the hard mask layer 209 is removed by a CMP process performed prior to the recessing of the isolation structures 216. In some embodiments, the hard mask layer 209 is removed by an etchant used to recess the isolation structures 216.

The recessing of the isolation structures 216 also forms trenches 219 that separate the device fin 210A or 210B from respective dielectric fin 218a-218c. In some embodiments, each of the device fins 210A, 210B has a width W1 ranging from about 20 nm to about 100 nm, each of the dielectric fins 218a-218c has a width W2 ranging from about 3 nm to about 30 nm, and each of the trenches 219 has a width W3 ranging from about 5 nm to about 15 nm. A ratio of the width W1 of the device fins 210A and 210B over the width W2 of the dielectric fins 218a-218c is set to be from about 4:1 to about 7:1. If the ratio is too great, the dielectric fins 218a-218c may be too thin for enough mechanical strength. If the ratio is too small, the dielectric fins 218a-218c may be too wide which increases fin pitch and enlarge circuit area.

Figure 7A:
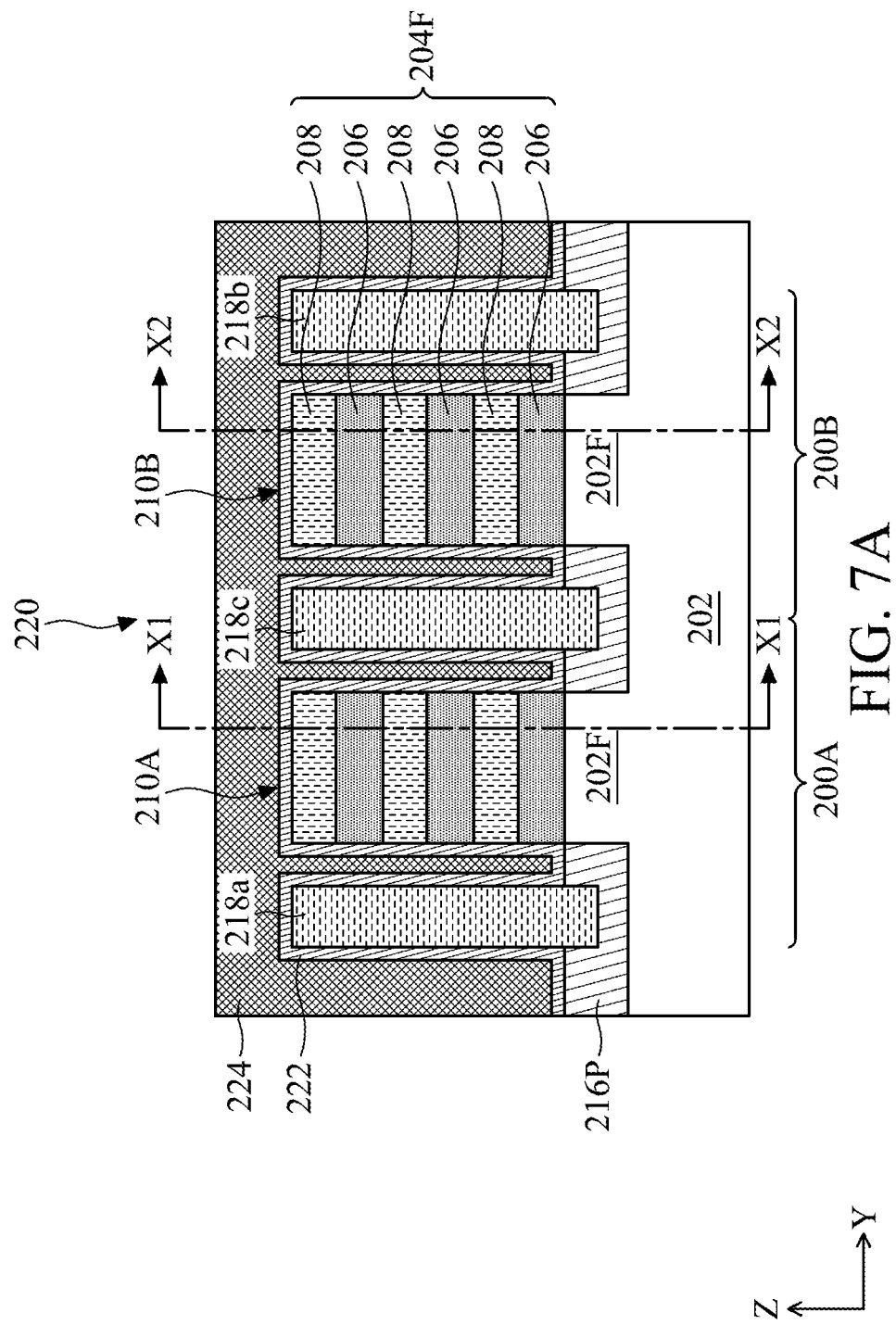

Referring to FIGS. 1 and 7A-7C, the method 100 proceeds to operation 112, in which a sacrificial gate structure 220 is formed over the device fins 210A and 210B and the dielectric fins 218a-218c, in accordance with some embodiments. FIG. 7A is a cross-sectional view of the semiconductor device 200 of FIG. 6 after forming the sacrificial gate structure 220. FIG. 7B is a cross-sectional view of the semiconductor device 200 of FIG. 7A along line X1-X1. FIG. 7C is a cross-sectional view of the semiconductor device 200 of FIG. 7A along line X2-X2. For simplicity, only a single sacrificial gate structure is depicted in FIG. 7A. However, any number of the sacrificial gate structures is contemplated.

The sacrificial gate structure 220 is formed over the device fins 210A and 210B and the dielectric fins 218a-218c. In some embodiments, the sacrificial gate structure 220 is disposed along the sidewalls and over the top surfaces of the device fins 210A and 210B and the dielectric fins 218a-218c. In some embodiments, the sacrificial gate structure 220 includes a sacrificial gate stack (222, 224) and gate spacers 226 formed along the sidewalls of the sacrificial gate stack (222, 224). According to embodiments of the present disclosure, the sacrificial gate stack (222, 224) will be replaced with replacement gate stacks in a gate-last process to form GAA structures without metal gate material loss and having excellent mixed Vts boundary isolation for metal gates in the NMOS region 200A and the PMOS region 200B.

The sacrificial gate stack (222, 224) defines the channel region of a GAA device in each of the NMOS region 200A and the PMOS region 200B. In some embodiments, the sacrificial gate stack (222, 224) includes a sacrificial gate dielectric 222 and a sacrificial gate electrode 224 over the sacrificial gate dielectric 222. In some embodiments, the sacrificial gate dielectric 222 may further include a sacrificial gate cap on top of the sacrificial gate electrode 224.

In some embodiments, the sacrificial gate dielectric 222 may be made of silicon oxide, silicon nitride, or silicon oxynitride. The sacrificial gate electrode 224 may be made of silicon such as polycrystalline silicon or amorphous silicon. In some embodiments, the sacrificial gate stack 222, 224 is formed by first blanketly depositing a sacrificial gate dielectric layer over the device fins 210A and 210B, the dielectric fins 218a-218c and the STI structures 216P. A sacrificial gate electrode layer is then blanketly deposited on the sacrificial gate dielectric layer such that the device fins 210A and 210B and the dielectric fins 218a-218c are fully embedded in the sacrificial gate electrode layer. In some embodiments, the thickness of the sacrificial gate dielectric layer is in a range from about 1 nm to about 5 nm. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer may be deposited using CVD including LPCVD and PECVD, PVD, ALD, or other suitable process. Subsequently, the sacrificial gate dielectric layer and the sacrificial gate electrode layer are patterned using photolithography and etching processes. For example, a photoresist layer (not shown) is applied over the sacrificial electrode layer and lithographically patterned by lithographic exposure and development. The pattern in the photoresist layer is sequentially transferred into the sacrificial electrode layer and the sacrificial dielectric layer by at least one anisotropic etch, thereby forming the sacrificial gate stack 222, 224. The anisotropic etch may be a dry etch, for example RIE, a wet etch, or a combination thereof. If not completely consumed, the remaining photoresist layer after formation of the sacrificial gate stacks 222, 224 is removed by, for example, ashing. By patterning the sacrificial gate stack 222, 224, the fin stack 204F of the first and second epitaxial layers 206 and 208 are partially exposed on opposite sides of the sacrificial gate stack 222, 224, thereby defining source/drain regions. In this disclosure, a source and a drain are interchangeably used and the structures thereof are substantially the same.

In some embodiments, the gate spacers 226 include a dielectric material such as, for example, an oxide, a nitride, an oxynitride, or combinations thereof. In some embodiments, the gate spacers 226 is made of silicon nitride. In some embodiments, the gate spacers 226 are formed by first depositing a conformal gate spacer material layer on exposed surfaces of the sacrificial gate stack 222, 224, the device fins 210A and 210B, the dielectric fins 218a-218c, and the STI structures 216P and then etching the gate spacer material layer to remove horizontal portions of the gate spacer material layer. In some embodiments, the gate spacer material layer is deposited, for example, by CVD, PECVD, or ALD. In some embodiments, the gate spacer material layer is etched by dry etch such as, for example, RIE. Vertical portions of the gate spacer material layer present on the sidewalls of sacrificial gate stack 222, 224 constitute the gate spacers 226.

Figure 8A:
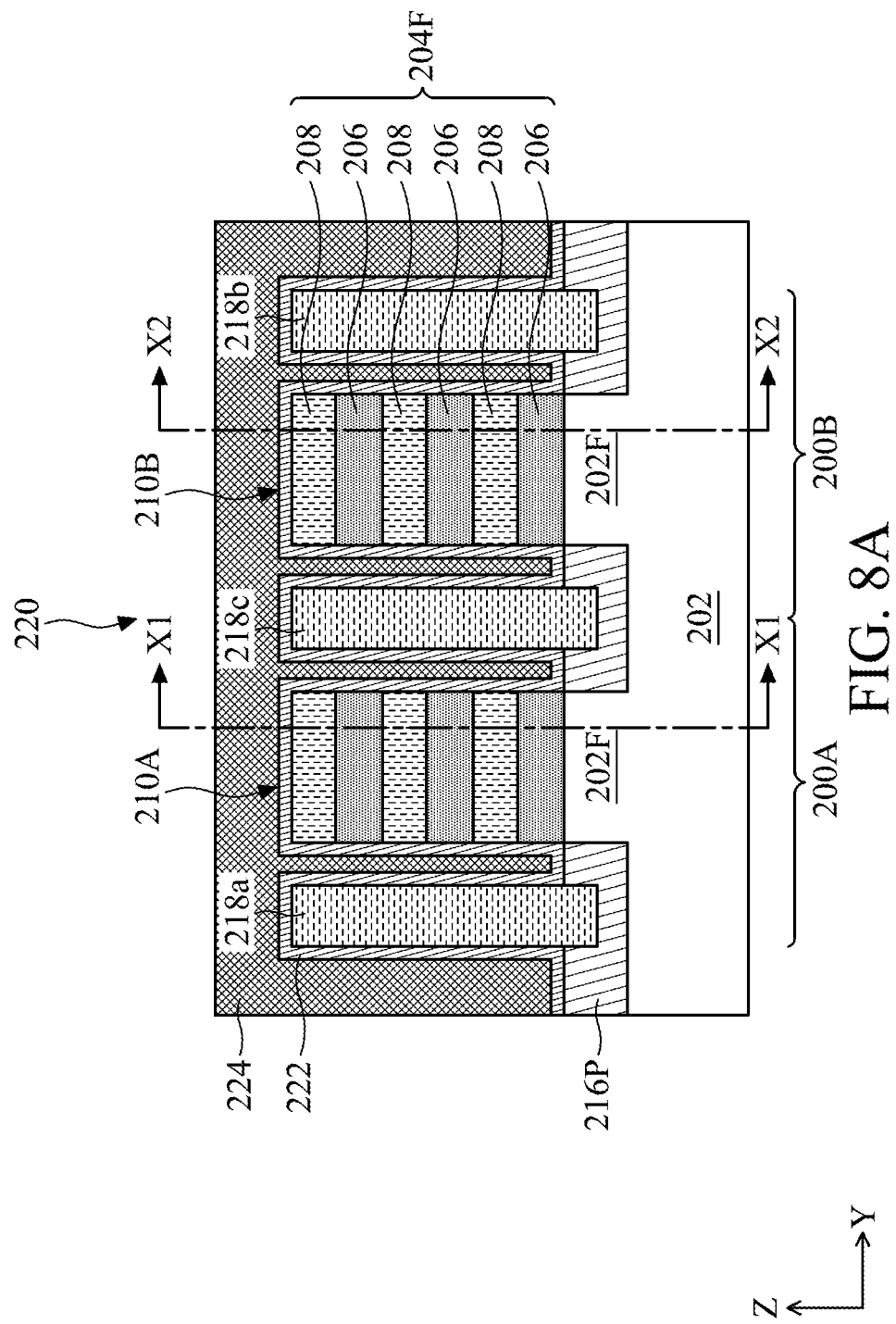

Referring to FIGS. 1 and 8A-8C, the method 100 proceeds to operation 114, in which portions of the device fins 210A and 210B as well as the portions of the dielectric fins 218a-218c that are not covered by the sacrificial gate structure 220 are removed to form recesses 230, in accordance with some embodiments. FIG. 8A is a cross-sectional view of the semiconductor device 200 of FIG. 7A after forming the recesses 230. FIG. 8B is a cross-sectional view of the semiconductor device 200 of FIG. 8A along line X1-X1. FIG. 8C is a cross-sectional view of the semiconductor device 200 of FIG. 8A along line X2-X2.

The recesses 230 expose the substrate 202 where the source/drain structures will be formed. The recesses 230 may be formed using an anisotropic etching process such as plasma etching, RIE or other suitable dry etching processes. Alternatively, the anisotropic etching process may be a wet etching process that uses an etchant solution such as ammonium hydroxide-peroxide water mixture (APM), tetramethylammonium hydroxide (TMAH), ammonium hydroxide ($NH_4OH$), or another etchant. In some embodiments, the substrate 202 is also partially etched. Accordingly, the bottom surfaces of the recesses 230 may be leveled with the top surface of the fin base 202F or lower than the top surface of the fin base 202F.

Figure 9A:
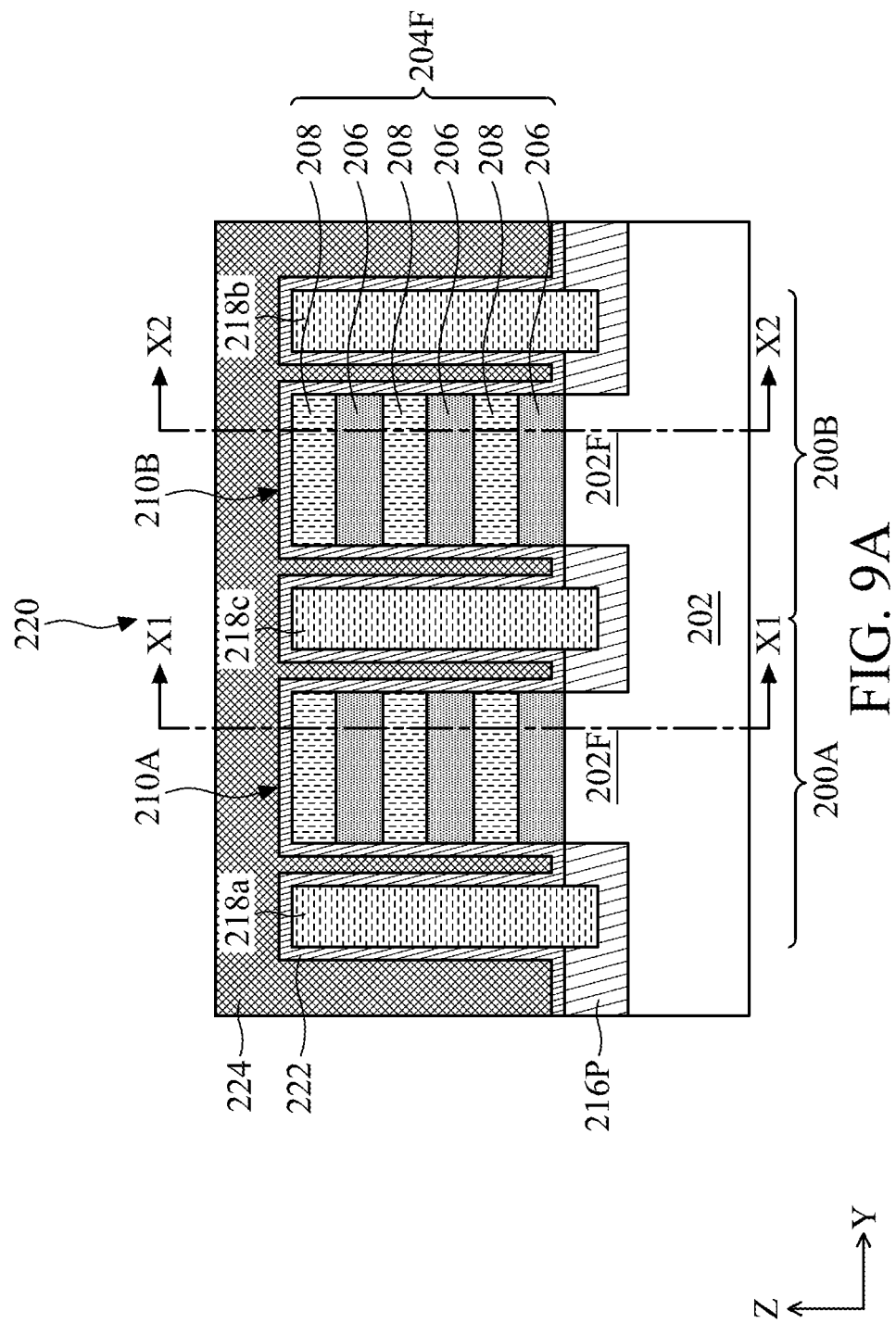
Figure 9C:
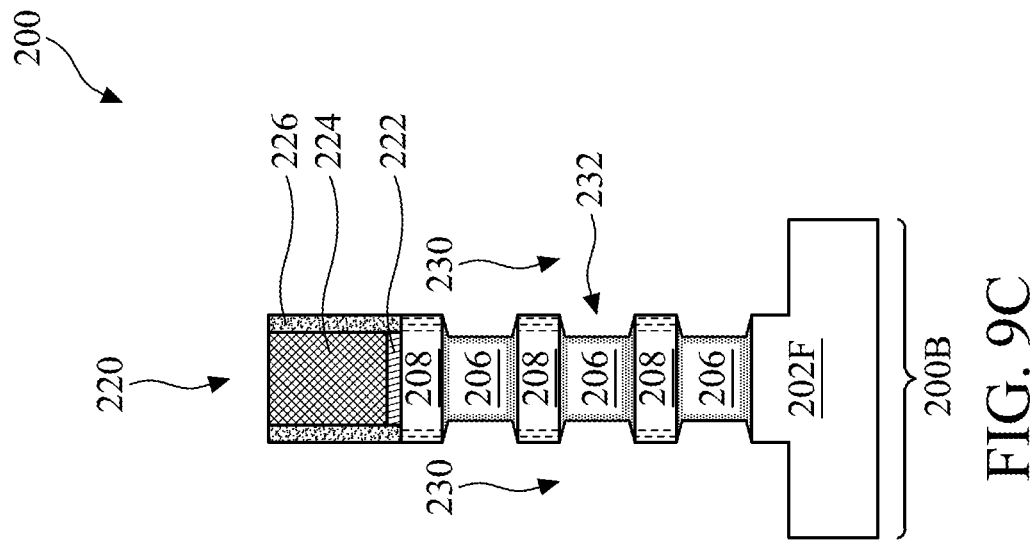
Figure 9B:
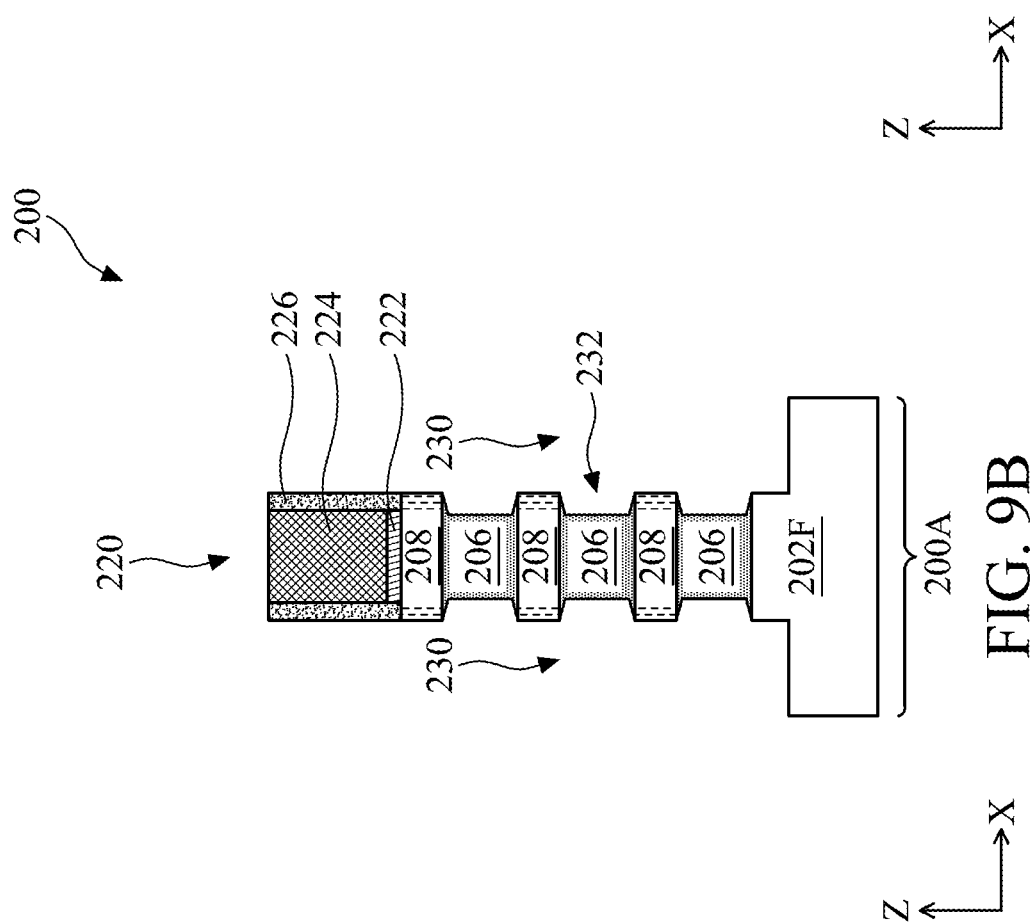

Referring to FIGS. 1 and 9A-9C, the method 100 proceeds to operation 116, in which the first epitaxial layers 206 are laterally etched to form cavities 232, in accordance with some embodiments. FIG. 9A is a cross-sectional view of the semiconductor device 200 of FIG. 8A after forming the cavities 232. FIG. 9B is a cross-sectional view of the semiconductor device 200 of FIG. 9A along line X1-X1. FIG. 9C is a cross-sectional view of the semiconductor device 200 of FIG. 9A along line X2-X2.

The cavities 232 are formed between the second epitaxial layers 208 beneath the sacrificial gate structure 220. A wet etching process is performed to selectively remove the portions of the first epitaxial layers 206 that underlie the gate spacers 226. In some embodiments, the amount of the first epitaxial layers 206 etched is controlled so that the lateral etching distance is no greater than the width of the gate spacers 226. Depending on the materials forming the first and the second epitaxial layers 206, 208, the wet etching process may use an etchant such as, but not limited to, ammonium hydroxide ($NH_4OH$), tetramethylammonium hydroxide (TMAH), ethylenediamine pyrocatechol (EDP), or potassium hydroxide (KOH) solutions. Alternatively, operation 116 may first selectively oxidize lateral ends of the first epitaxial layers 206 that are exposed in the recesses 230 to increase the etching selectivity between the first epitaxial layers 206 and the second epitaxial layer 208. In some examples, the oxidation process may be performed by exposing the semiconductor device 200 to a wet oxidation process, a dry oxidation process, or a combination thereof.

Figure 10A:
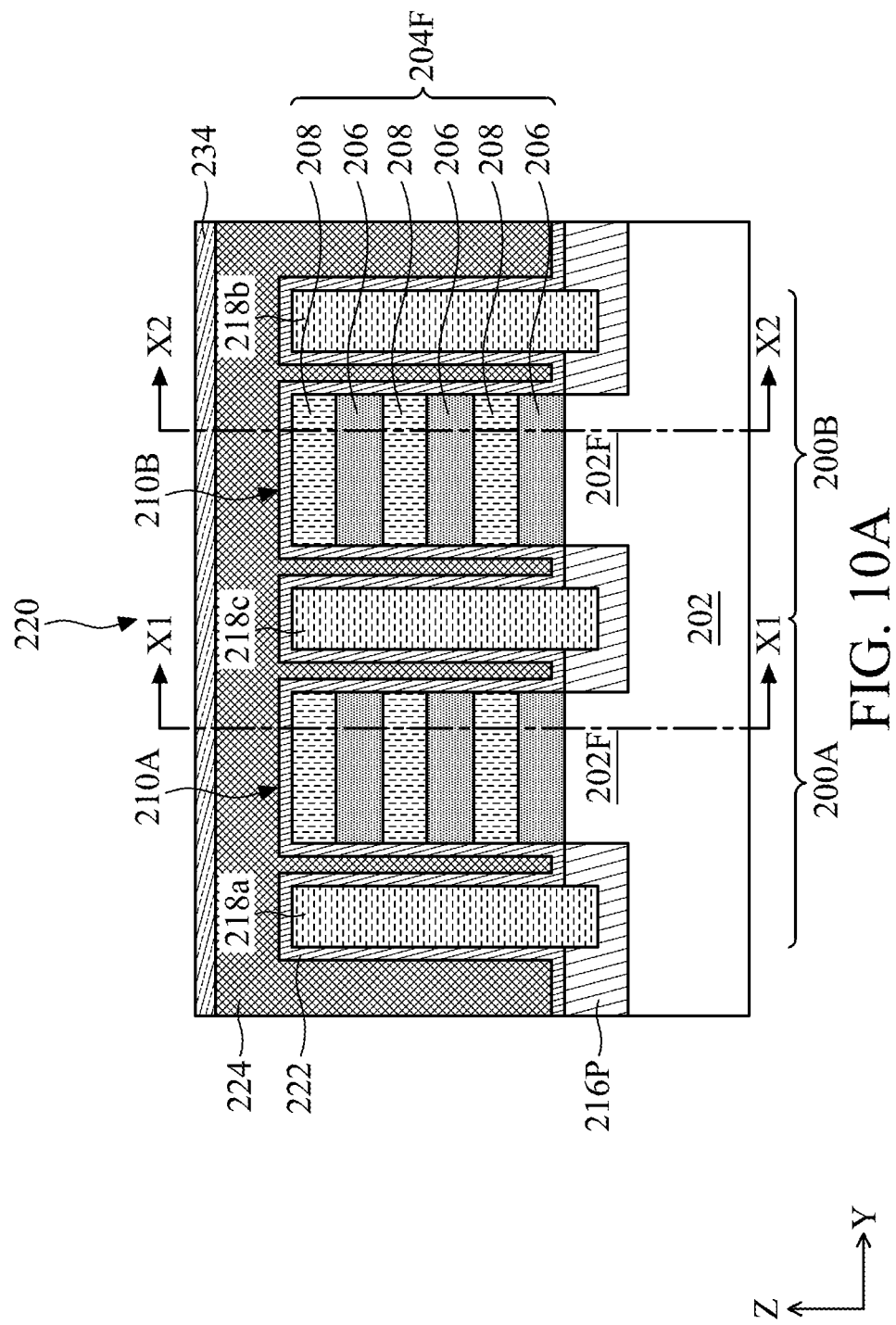
Figure 10C:
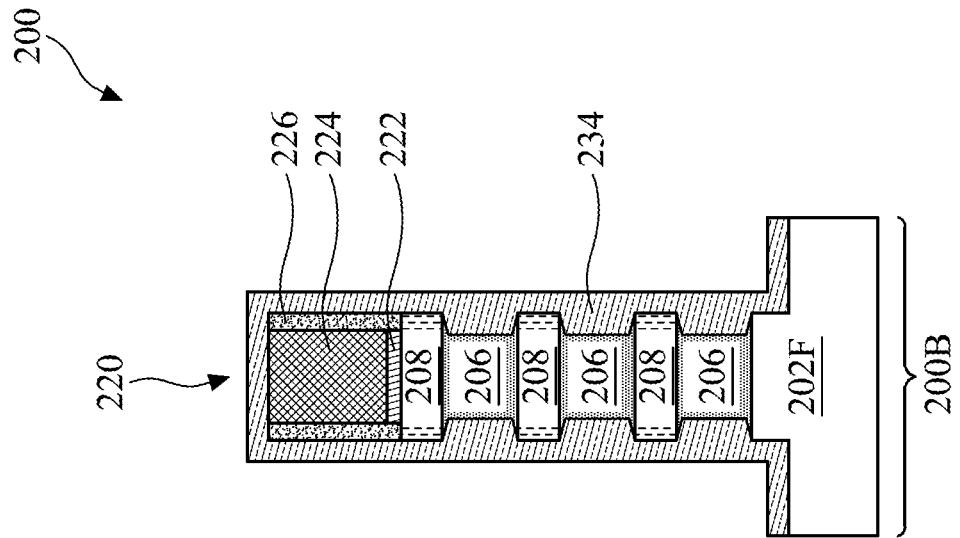
Figure 10B:
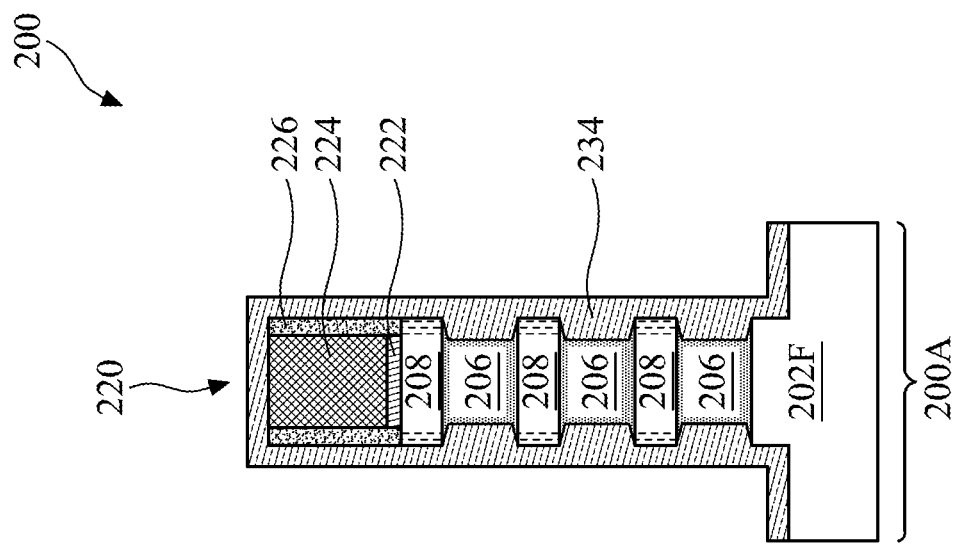

Referring to FIGS. 1 and 10A-10C, the method 100 proceeds to operation 118, in which an inner spacer layer 234 is formed over the substrate 202, in accordance with some embodiments. FIG. 10A is a cross-sectional view of the semiconductor device 200 of FIG. 9A after forming the inner spacer layer 234. FIG. 10B is a cross-sectional view of the semiconductor device 200 of FIG. 10A along line X1-X1. FIG. 10C is a cross-sectional view of the semiconductor device 200 of FIG. 10A along line X2-X2.

In an example, the inner spacer layer 234 is a conformal dielectric layer formed on the lateral ends of the first and second epitaxial layers 206 and 208. In some embodiments, the inner spacer layer 234 wraps around the gate spacers 226 and fills the cavities 232. The inner spacer layer 234 may include silicon oxides, silicon nitrides, silicon carbides, silicon carbide nitride, silicon oxide carbide, silicon carbide oxynitride, and/or other suitable dielectric materials. The inner spacer layer 234 can be formed by ALD or any other suitable methods. By conformally forming the inner spacer layer 234, the size of cavity 232 is reduced or completely filled.

Figure 11A:
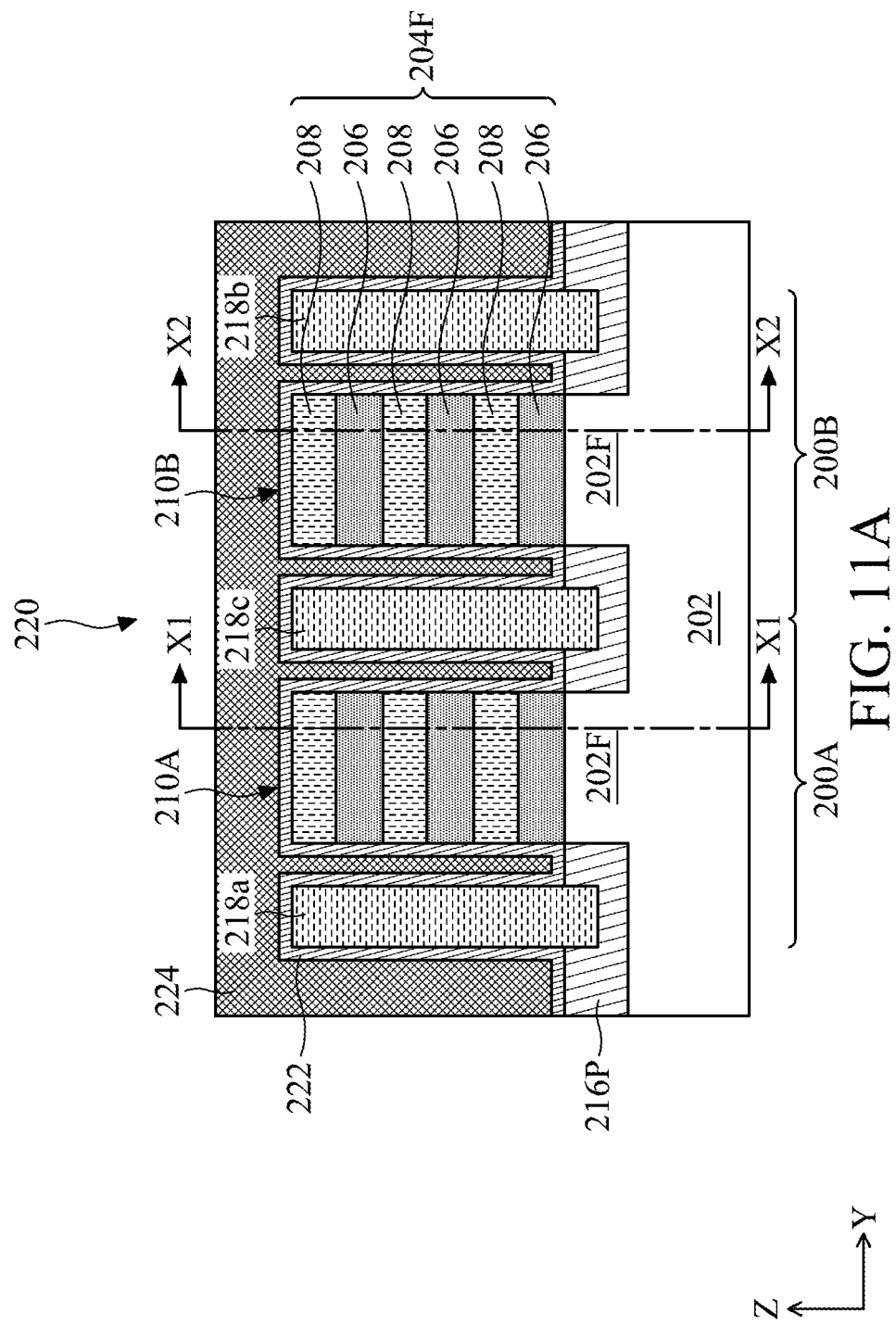
Figure 11C:
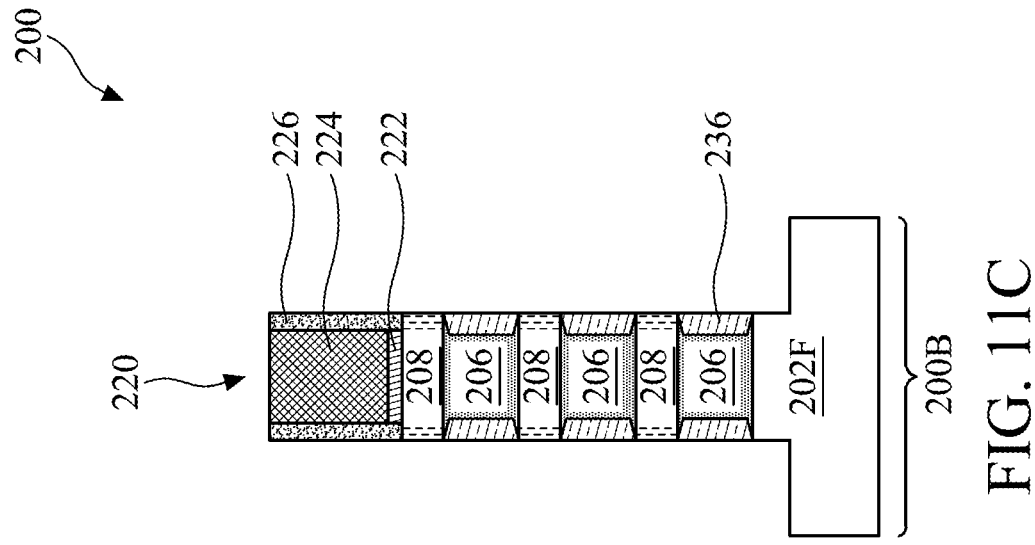
Figure 11B:
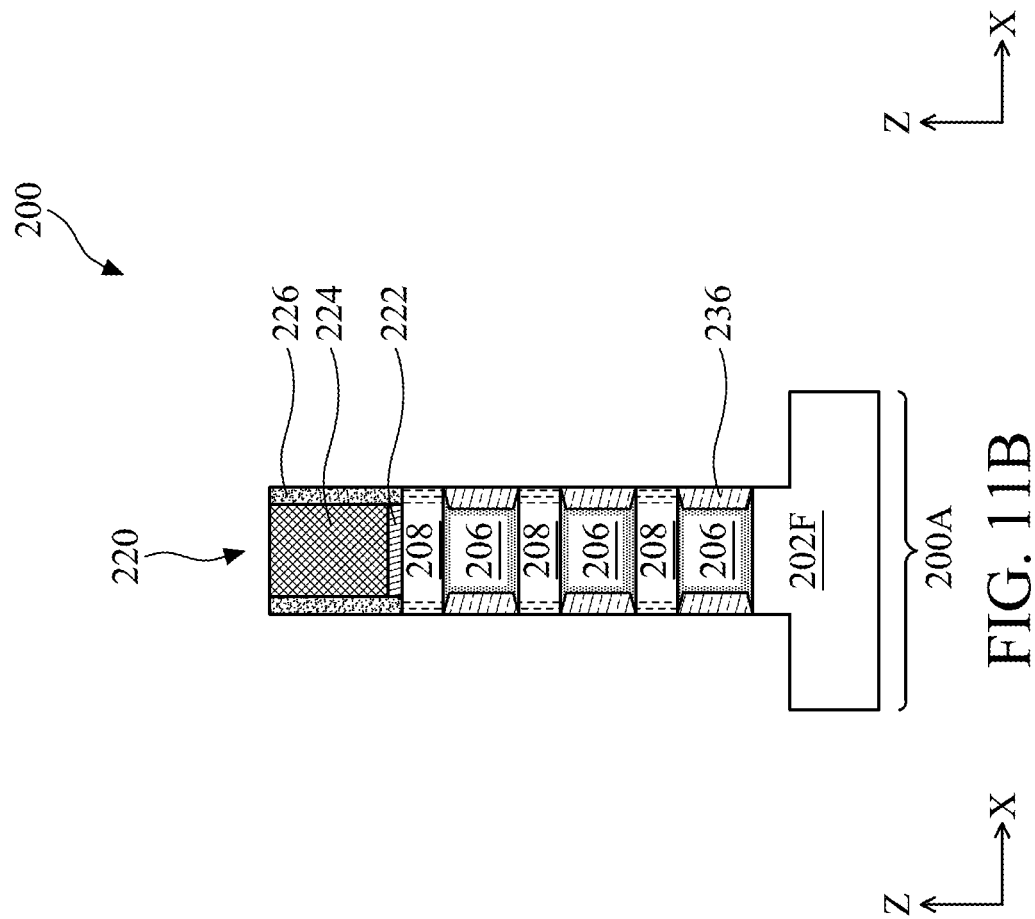

Referring to FIGS. 1 and 11A-11C, the method 100 proceeds to operation 120, in which inner spacers 236 are formed in the cavities 232, in accordance with some embodiments. FIG. 11A is a cross-sectional view of the semiconductor device 200 of FIG. 10A after forming the inner spacers 236. FIG. 11B is a cross-sectional view of the semiconductor device 200 of FIG. 11A along line X1-X1. FIG. 11C is a cross-sectional view of the semiconductor device 200 of FIG. 11A along line X2-X2.

The inner spacers 236 fill the cavities 232, contacting end surfaces of the first epitaxial layers 206. An etching process is performed to remove the portions of the inner spacer layer 234 from the sidewalls of the second epitaxial layer 208. Portions of the inner spacer layer 234 remained in the cavities 232 constitute the inner spacers 236. In some embodiments, a wet etching process is performed using an etchant such as, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 12A:
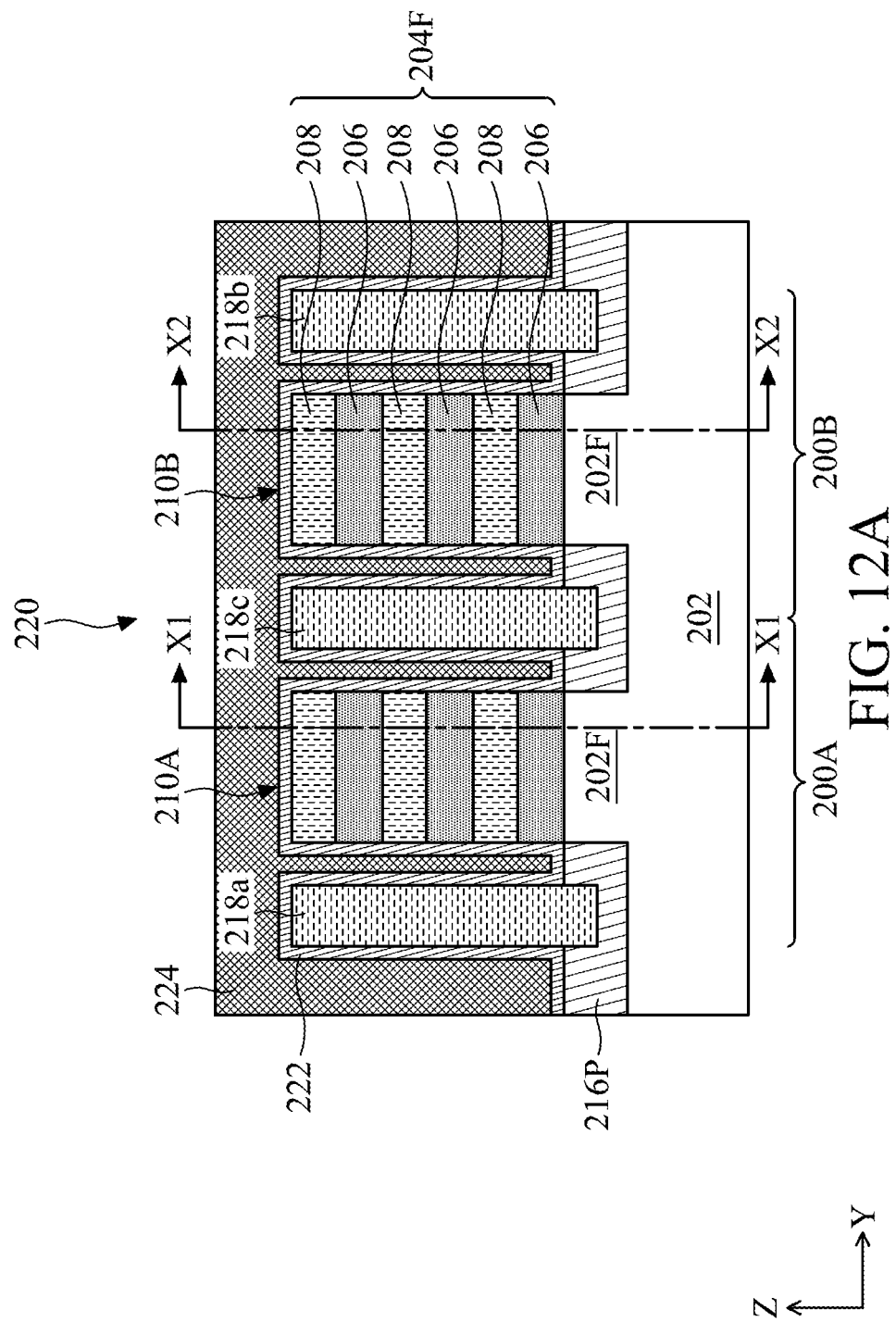
Figure 12B:
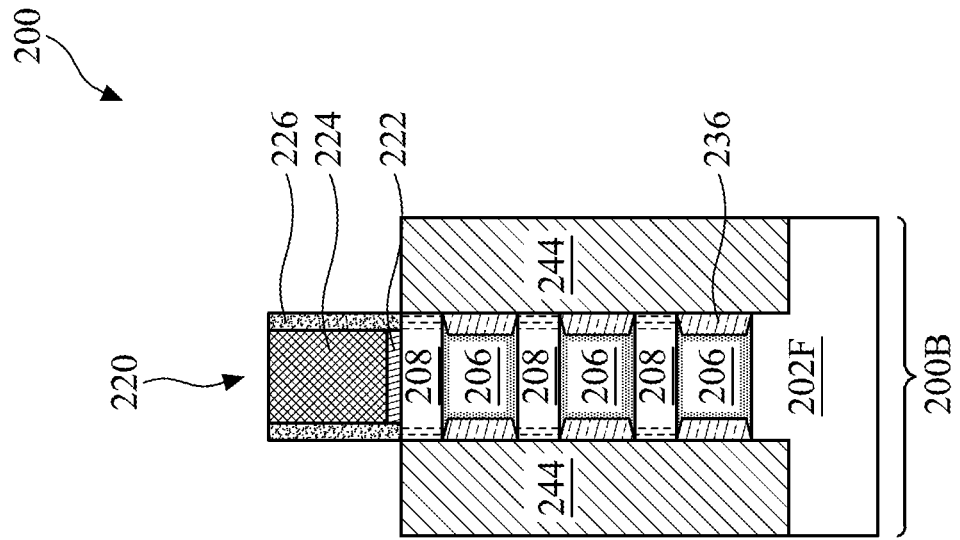
Figure 12C:
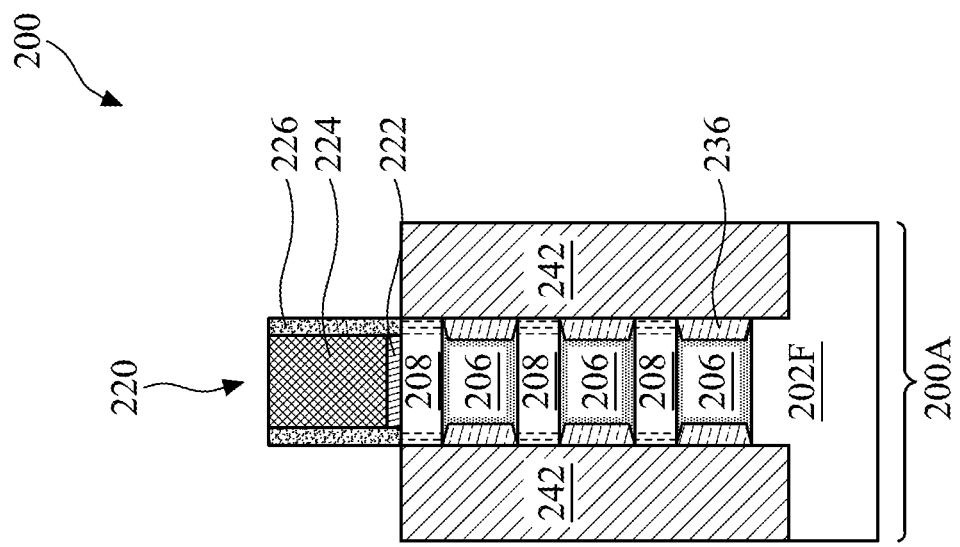

Referring to FIGS. 1 and 12A-12C, the method 100 proceeds to operation 122, in which first source/drain structures 242 are formed in the recesses 230 in the NMOS region 200A and second source/drain structures 244 are formed in the recesses 230 in the PMOS region 200B, in accordance with some embodiments. FIG. 12A is a cross-sectional view of the semiconductor device 200 of FIG. 11A after forming the first and second source/drain structures 242 and 244. FIG. 12B is a cross-sectional view of the semiconductor device 200 of FIG. 12A along line X1-X1. FIG. 12C is a cross-sectional view of the semiconductor device 200 of FIG. 12A along line X2-X2.

In the NMOS region 200A, the first source/drain structures 242 are on opposite sides of the sacrificial gate structure 220, in contact with the second epitaxial layers 208 and separated from the first epitaxial layers 206 by the inner spacers 236. In the NMOS region 200B, the second source/drain structures 244 are on opposite sides of the sacrificial gate structure 220, in contact with the second epitaxial layers 208 and separated from the first epitaxial layers 206 by the inner spacers 236.

In some embodiments, the first source/drain structures 242 in the NMOS region 200A include an n-doped semiconductor material for an n-type FET and the second source/drain structures 244 in the PMOS region 200B include a p-doped semiconductor material for a p-type FET. The first source/drain structures 242 in the NMOS region 200A and the second source/drain structures 244 in the PMOS region 200B may include the same or different semiconductor materials. Exemplary semiconductor materials include, but are not limited to, silicon germanium (SiGe), silicon carbide (SiC), silicon phosphorus, germanium, an III-V compound semiconductor, and an II-VI compound semiconductor. The materials of an III-V compound semiconductor may include InAs, AlAs, GaAs, InP, GaN, InGaAs, InAlAs, GaSb, AlSb, AlP or GaP. In some examples, the first source/drain structures 242 in the NMOS region 200A are made of n-doped SiC, and the second source/drain structures 244 in the PMOS region 200B are made of p-doped SiGe. Exemplary n-type dopants include, but are not limited to, P, As, and Sb. Exemplary p-type dopants include, but are not limited to, B, Al, Ga, and In.

The first source/drain structures 242 in the NMOS region 200A and the second source/drain structures 244 in the PMOS region 200B may be independently formed by metal-organic CVD (MOCVD), molecular beam epitaxy (MBE), liquid phase epitaxy (LPE), vapor phase epitaxy (VPE), selective epitaxial growth (SEG), or a combination thereof. The source/drain structures 242 and 244 may have several facets. In addition, the first source/drain structures 242 and the second source/drain structures 244 may be independently doped by in-situ doping during the epitaxial growth and/or by implantation after the epitaxial growth. In some instances, the top surfaces of the source/drain structures 242 and 244 may be higher than or at the same level with a top surface of a topmost second epitaxial layer 208 in the fin stack 204F.

Figure 13A:
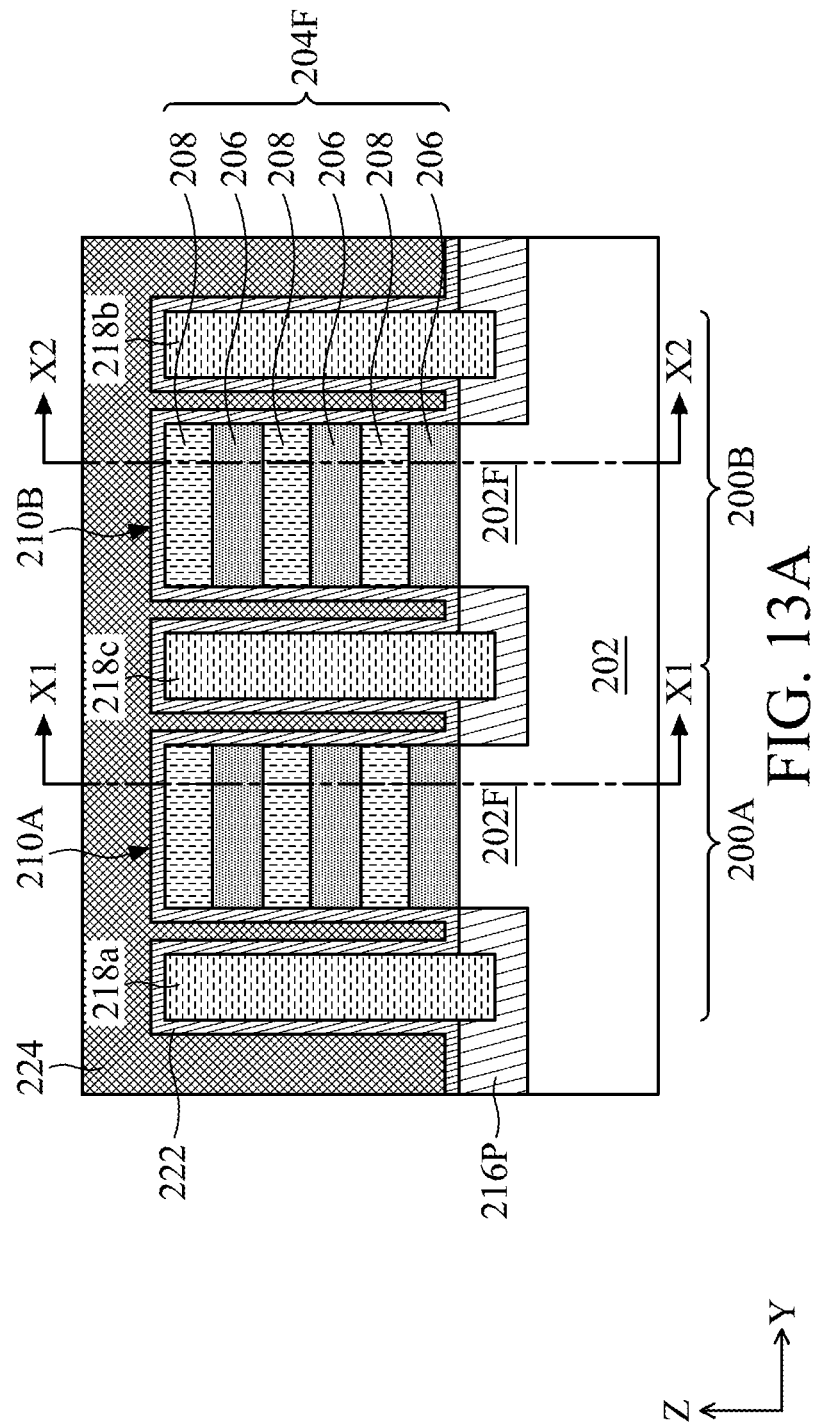
Figure 13B:
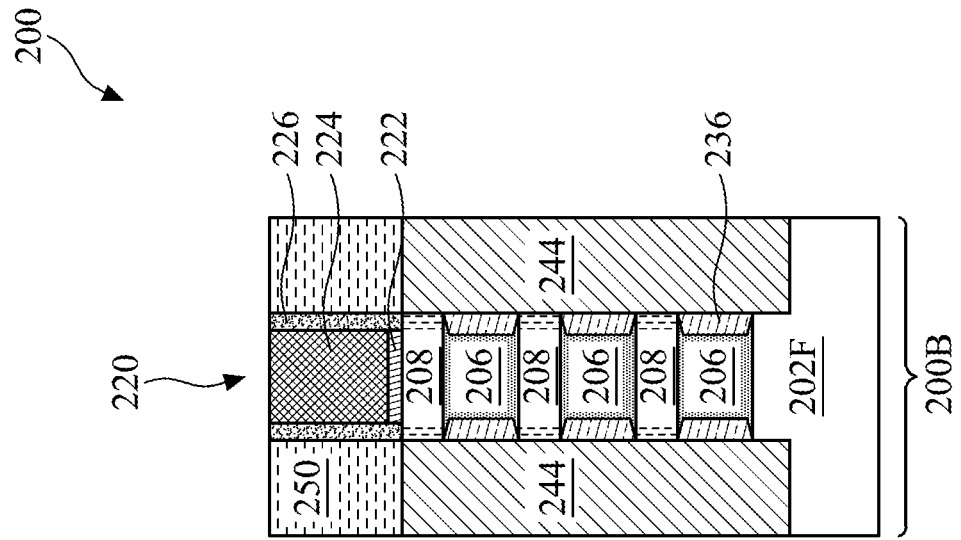
Figure 13C:
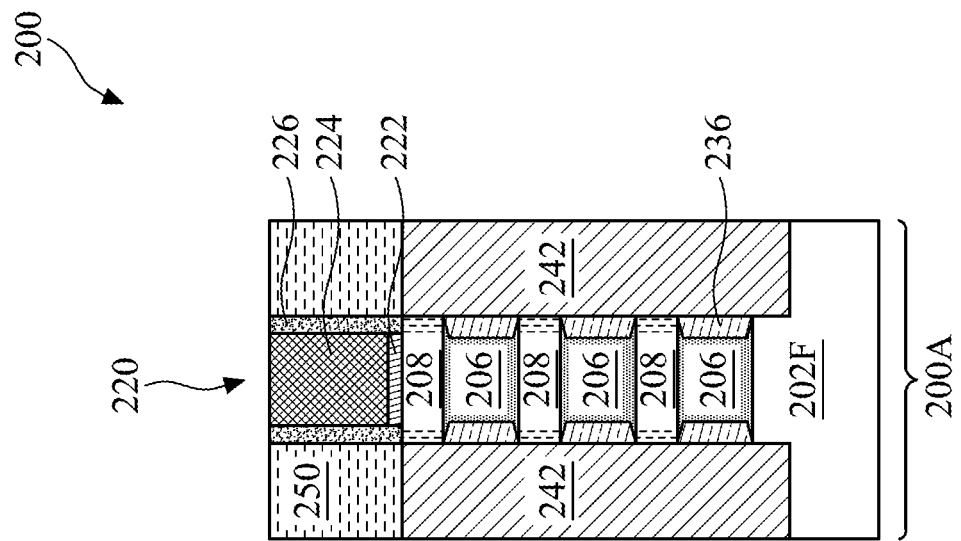

Referring to FIGS. 1 and 13A-13C, the method 100 proceeds to operation 124, in which an interlayer dielectric (ILD) layer 250 is formed over the source/drain structures 242 and 244, in accordance with some embodiments. FIG. 13A is a cross-sectional view of the semiconductor device 200 of FIG. 12A after forming the ILD layer 250. FIG. 13B is a cross-sectional view of the semiconductor device 200 of FIG. 13A along line X1-X1. FIG. 13C is a cross-sectional view of the semiconductor device 200 of FIG. 13A along line X2-X2.

In some embodiments, the ILD layer 250 includes a low-k dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 250 may include a multi-layer structure having multiple dielectric materials and may be formed by a deposition process such as, for example, CVD, flowable CVD (FCVD), spin-on coating, other suitable methods, or combinations thereof. In some embodiments, forming the ILD layer 250 further includes performing a CMP process to planarize a top surface of the ILD layer 250, such that the top surface of the sacrificial gate structure 220 are exposed.

Figure 14A:
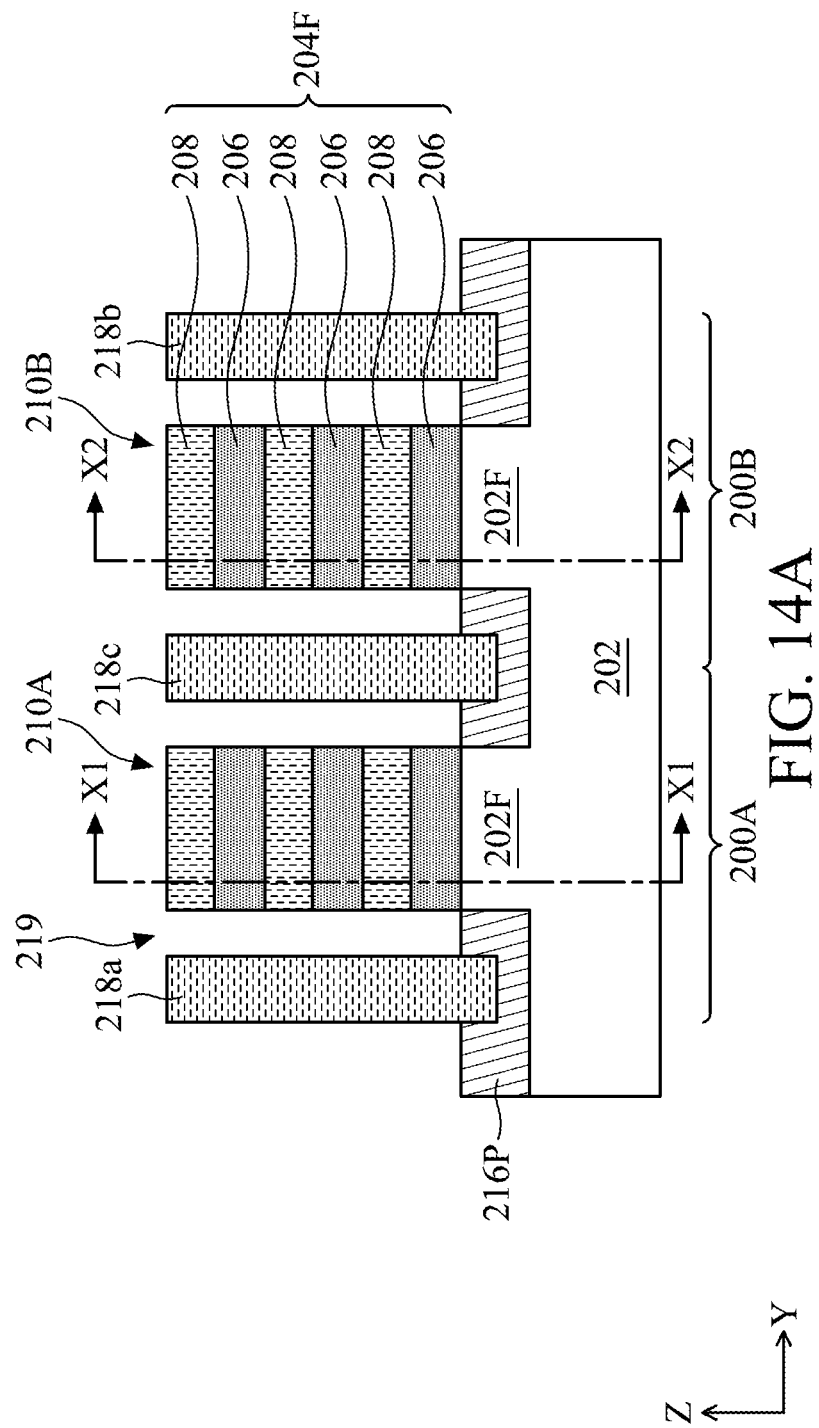
Figure 14B:
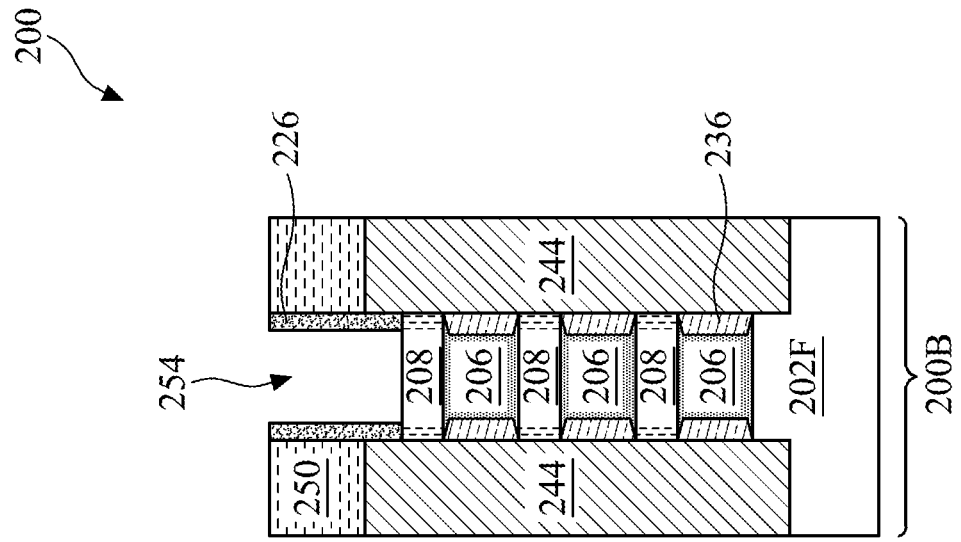
Figure 14C:
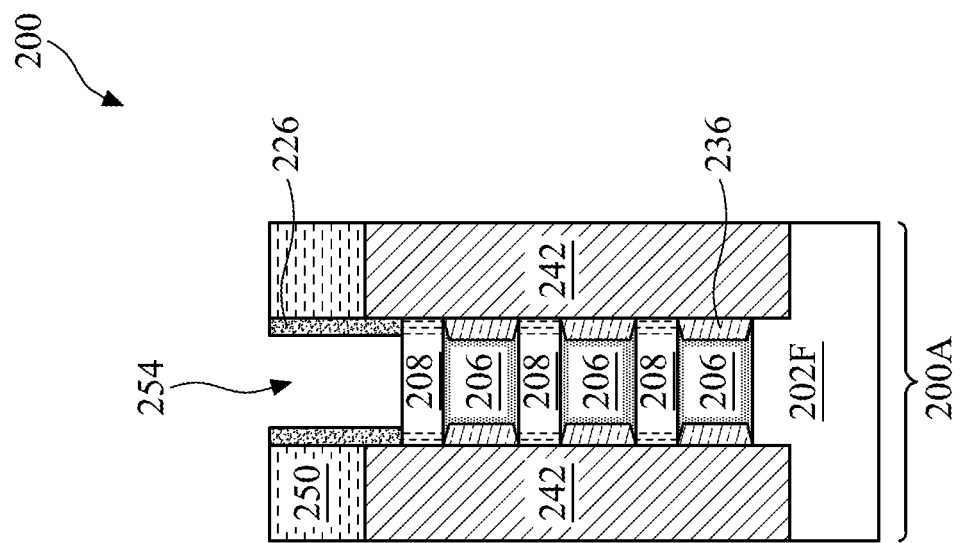

Referring to FIGS. 1 and 14A-14C, the method 100 proceeds to operation 126, in which the sacrificial gate dielectric 222 and the sacrificial gate electrode 224 are removed to form a gate trench 254, in accordance with some embodiments. FIG. 14A is a cross-sectional view of the semiconductor device 200 of FIG. 13A after forming the gate trench 254. FIG. 14B is a cross-sectional view of the semiconductor device 200 of FIG. 14A along line X1-X1. FIG. 14C is a cross-sectional view of the semiconductor device 200 of FIG. 14A along line X2-X2.

The gate trench 254 exposes the device fin 210A and 210B in the channel regions. The ILD layer 250 protects the source/drain structures 242 and 244 during the removal of the sacrificial gate dielectric 222 and the sacrificial gate electrode 224. The sacrificial gate dielectric 222 and the sacrificial gate electrode 224 may be removed using one or more selective etching processes. Each etching process can be a dry etch, a wet etch, or a combination thereof. In instances where the sacrificial gate electrode 224 is poly-silicon and the ILD layer 250 is silicon oxide, a wet etchant such as a TMAH solution can be used to selectively remove the sacrificial gate electrode 224. The sacrificial gate dielectric 222 is thereafter removed using plasma dry etching and/or wet etching.

Figure 15A:
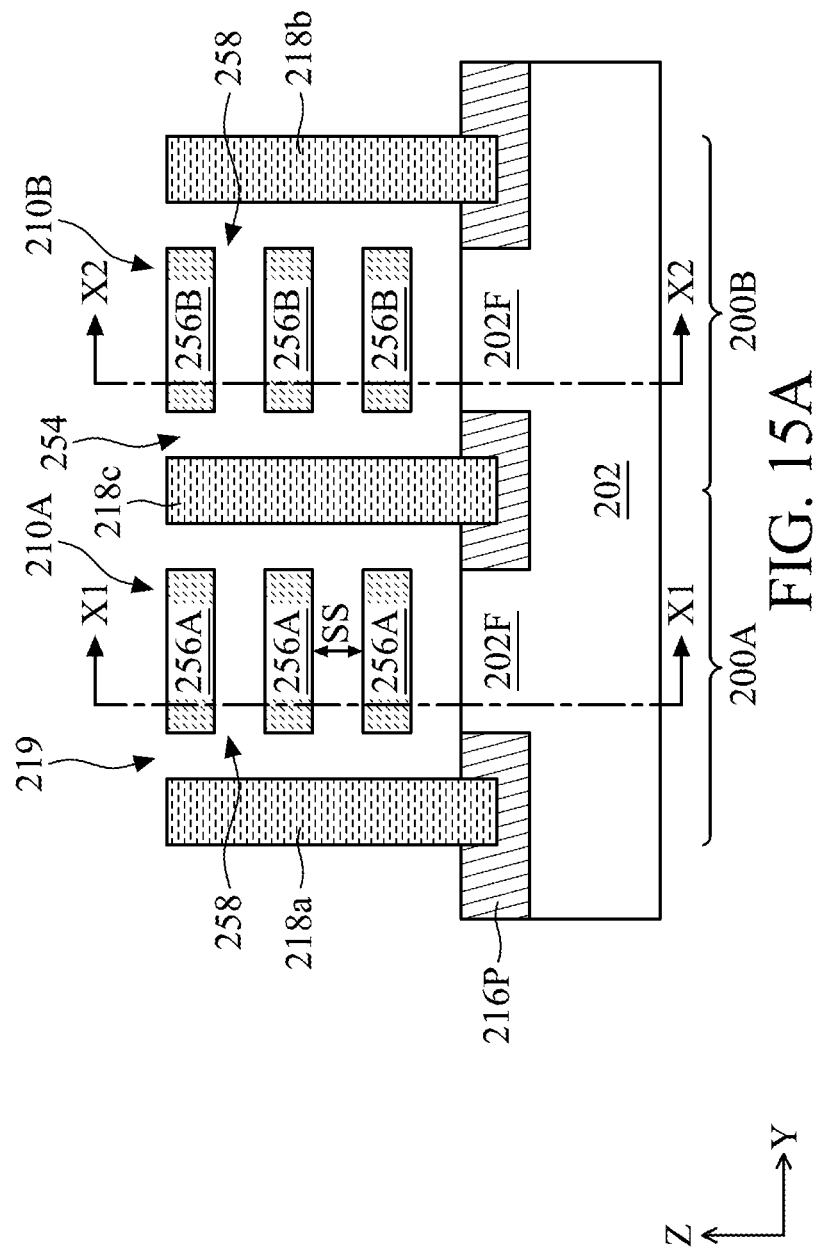
Figure 15C:
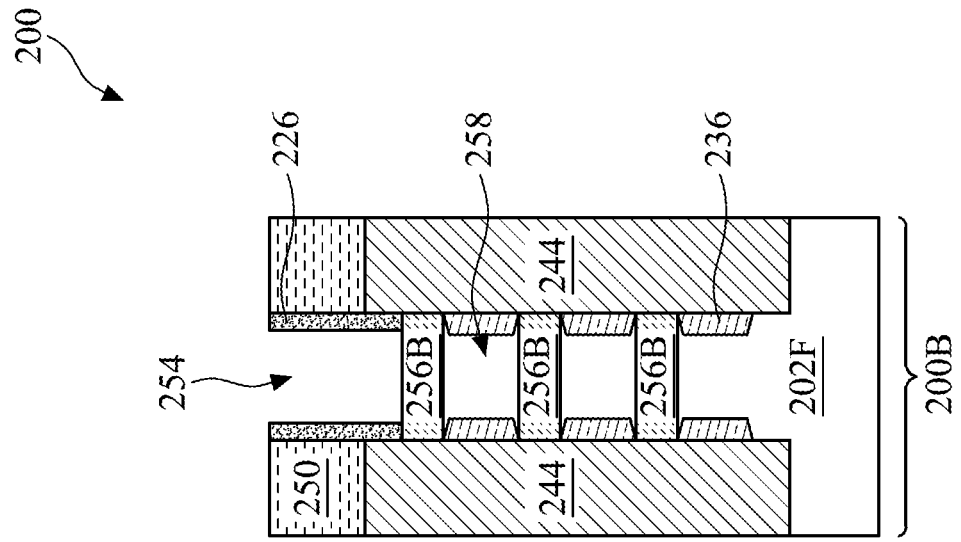
Figure 15B:
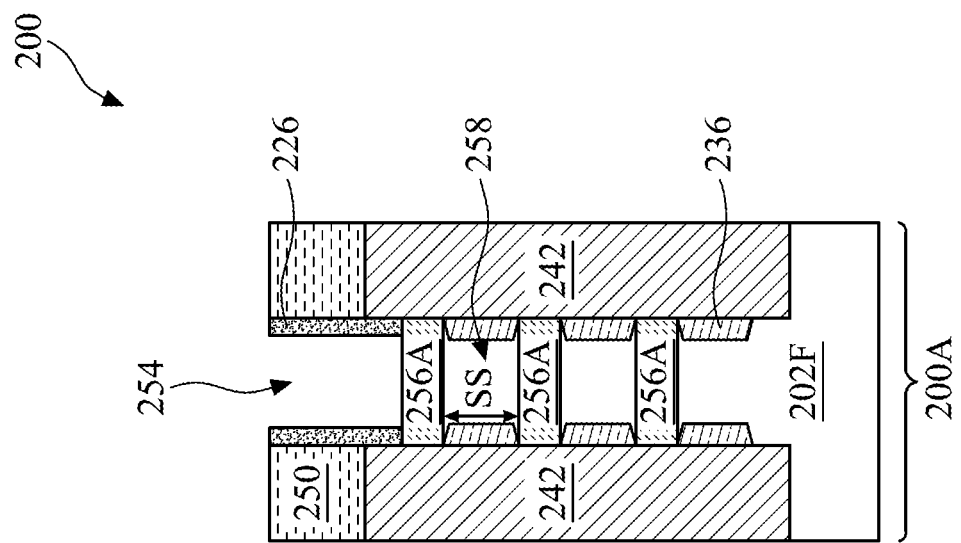

Referring to FIGS. 1 and 15A-15C, the method 100 proceeds to operation 128, in which the first epitaxial layers 206 are removed to form first channel nanostructures 256A in the NMOS region 200A and second channel nanostructures 256B in the PMOS region 200B using the remaining second epitaxial layer 208, in accordance with some embodiments. FIG. 15A is a cross-sectional view of the semiconductor device 200 of FIG. 14A after forming the first channel nanostructures 256A in the NMOS region 200A and the second channel nanostructures 256B in the PMOS region 200B. FIG. 15B is a cross-sectional view of the semiconductor device 200 of FIG. 15A along line X1-X1. FIG. 15C is a cross-sectional view of the semiconductor device 200 of FIG. 15A along line X2-X2.

The first epitaxial layers 206 may be removed or etched using an etchant that can selectively etch the first epitaxial layers 206 against the second epitaxial layers 208. In some embodiments, the selectively removal process includes oxidizing the first epitaxial layers 206 using a suitable oxidizer, such as ozone. Thereafter, the oxidized first epitaxial layers 206 may be selectively removed from the gate trench 254. In some other embodiments, the selective removal process includes a dry etching process. In some embodiments, when the second epitaxial layers 208 include silicon and the first epitaxial layers 206 include silicon germanium, the first epitaxial layer 206 may be selectively removed by applying an HCl gas at a temperature of about 500° C. to about 700° C., or applying a gas mixture of $CF_4$, $SF_6$, and $CHF_3$. The inner spacers 236 serve as etch stop layers to protect the source/drain structures 242 and 244 during removal of the first epitaxial layers 206 in the gate trench 254. As a result, the remaining second epitaxial layers 208 form the first channel nanostructures 256A in the NMOS region 200A and the second channel nanostructures 256B in the PMOS region 200B. The channel nanostructures 256A and 256B may be nanowires or nanosheets.

The removal of the first epitaxial layers 206 also forms multiple spaces 258 between the channel nanostructures 256A and 256B. The spaces 258 define spacing (ss) between adjacent channel nanostructures 256A and 256B. In some embodiments, the spacing (ss) between the adjacent channel nanostructures 256A and 256B is from about 10 nm to 20 nm.

Figure 16A:
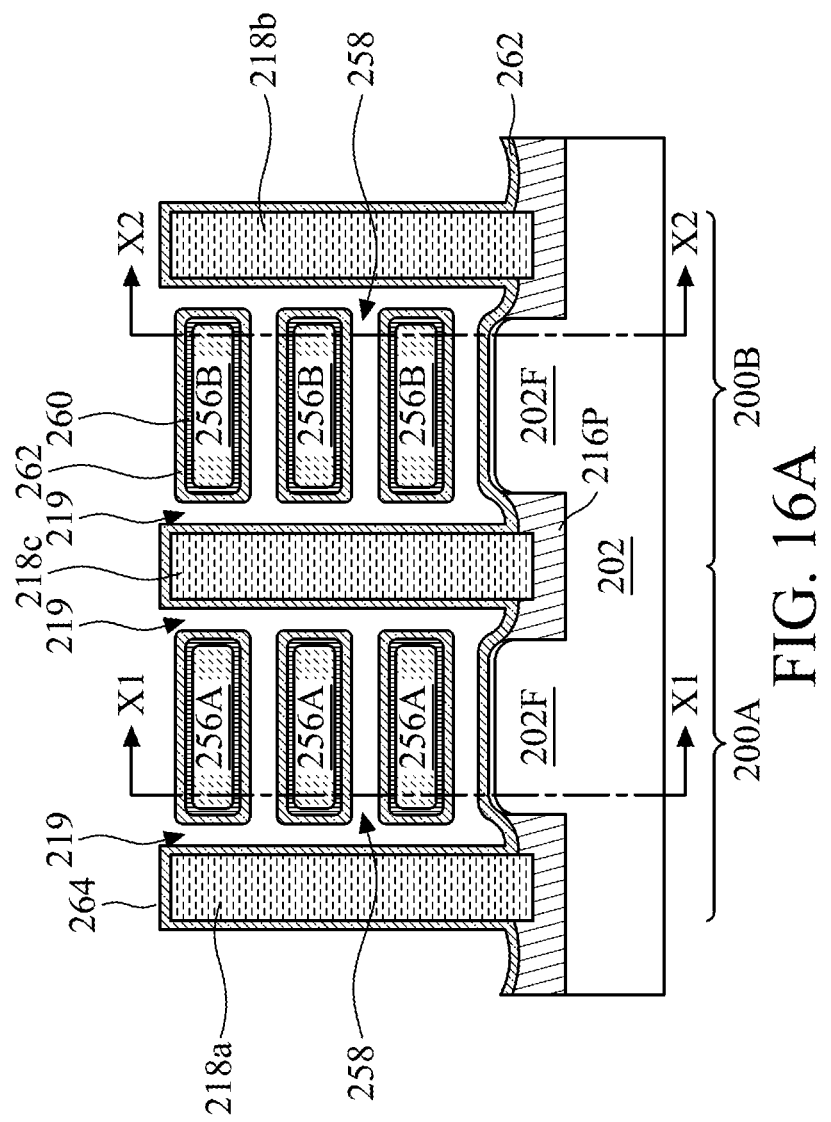
Figure 16C:
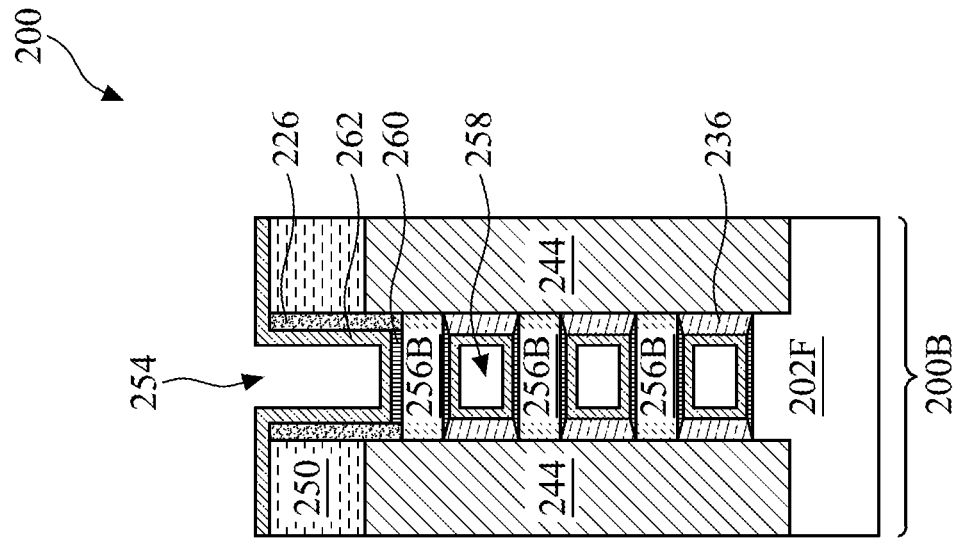
Figure 16B:
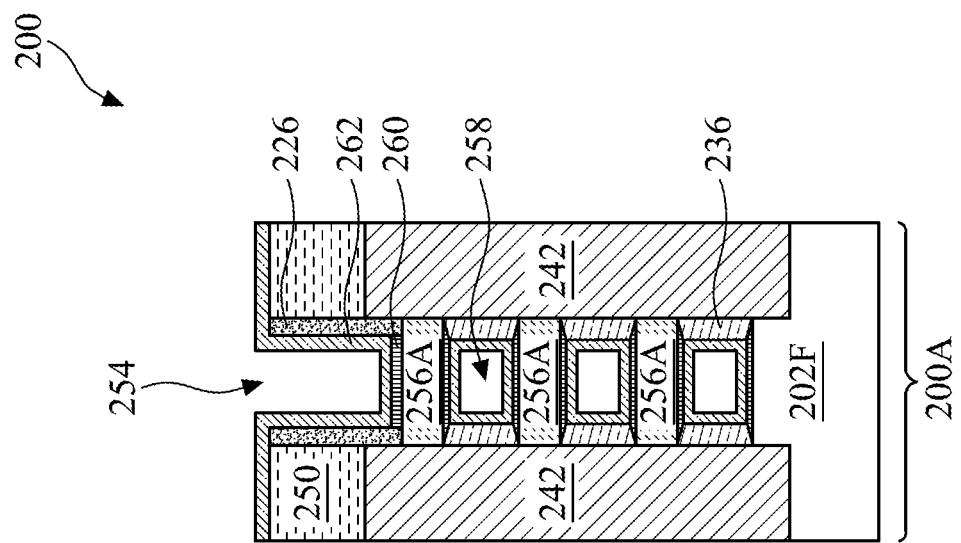

Referring to FIGS. 1 and 16A-16C, the method 100 proceeds to operation 130, in which a gate dielectric layer (260, 262) is formed, in accordance with some embodiments. FIG. 16A is a cross-sectional view of the semiconductor device 200 of FIG. 15A after forming the gate dielectric layer (260, 262). FIG. 16B is a cross-sectional view of the semiconductor device 200 of FIG. 16A along line X1-X1. FIG. 16C is a cross-sectional view of the semiconductor device 200 of FIG. 16A along line X2-X2.

In some embodiments, the gate dielectric layer (260, 262) includes multiple layers. In an example, the gate dielectric layer (260, 262) includes an interfacial layer 260 and a high-k gate dielectric layer 262. In some embodiments, the interfacial layer 260 wraps around each of channel nanostructures 256A in the NMOS region 200A and each of channel nanostructures 256B in the PMOS region 200B. The high-k gate dielectric layer 262 wraps around the respective interfacial layers 260. Note that the spaces 258 between the respective first and second channel nanostructures 256A and 256B are reduced.

In some embodiments, the interfacial layer 260 includes a dielectric material such as silicon oxide. In some embodiments, the interfacial layer 260 is formed by chemical oxidation or thermal oxidation of surface portions of the channel nanostructures 256A and 256B and substrate 202. Alternatively, in some embodiments, the interfacial layer 260 is formed by deposition of a dielectric material using ALD, CVD, and/or other suitable methods. Accordingly, the interfacial layer 260 is also deposited on portions of the dielectric fins 218a-218c that are exposed by the gate trench 254.

In some embodiments, the high-k gate dielectric layer 262 includes a high-k dielectric material having a dielectric constant greater than silicon oxide. Examples of high-k dielectric materials include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide ($ZrO_2$), aluminum oxide ($Al_2O_3$), titanium oxide ($TiO_2$), and hafnium oxide-alumina ($HfO_2$—$Al_2O_3$) alloy. The high-k gate dielectric layer 262 may be formed by CVD, ALD or other suitable methods. In some embodiments, the high-k gate dielectric layer 262 is formed using a conformal deposition process such as ALD in order to ensure the high-k gate dielectric layer 262 having a uniform thickness around each channel nanostructure 256A, 256B.

Figure 17A:
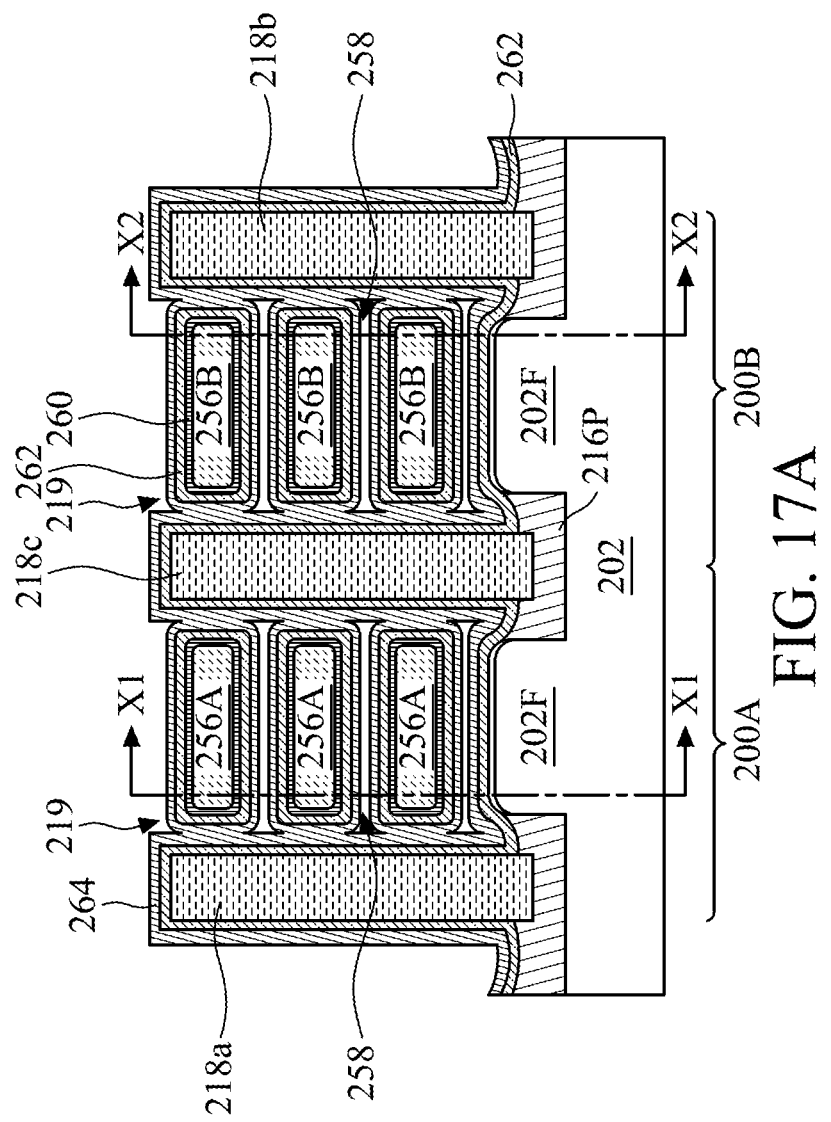
Figure 17B:
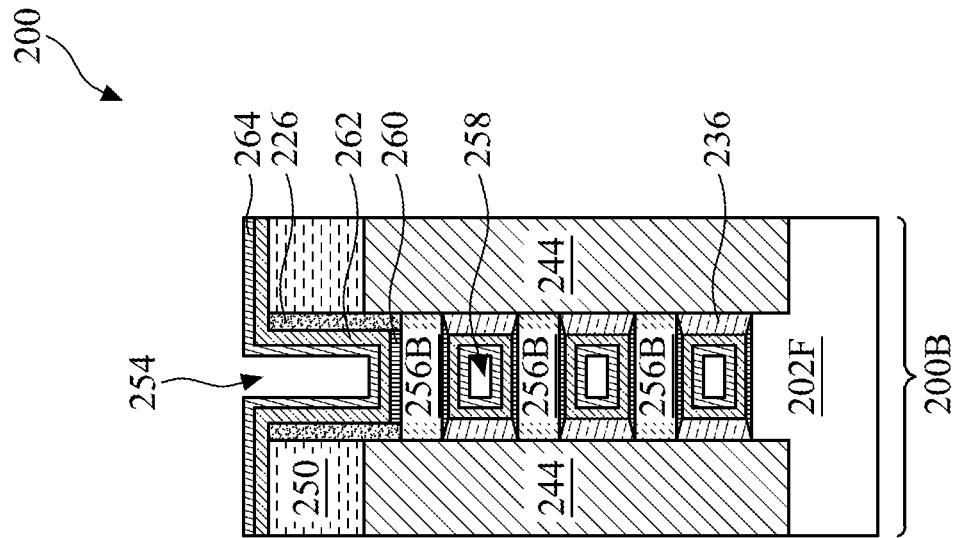
Figure 17C:
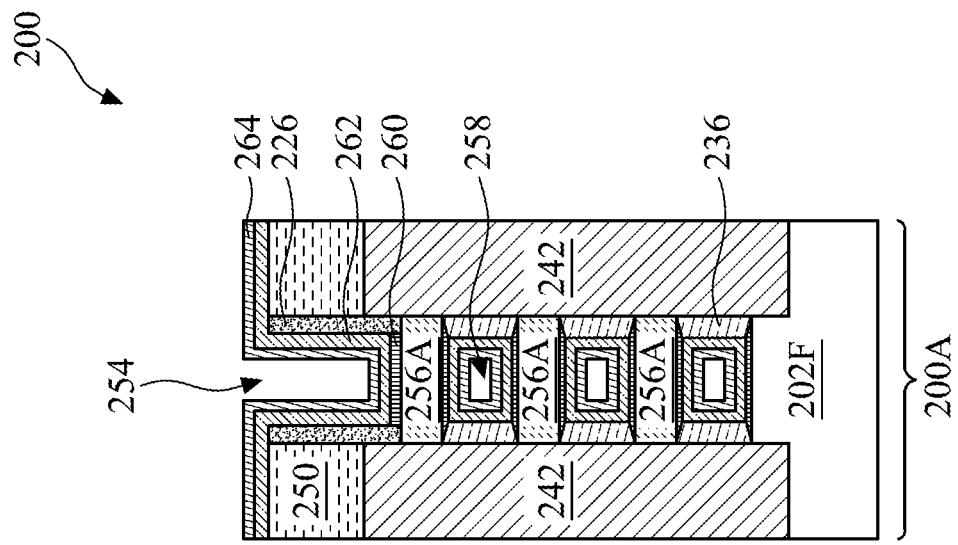

Referring to FIGS. 1 and 17A-17C, the method 100 proceeds to operation 132, in which a sacrificial layer 264 is conformally deposited on the high-k gate dielectric layer 262, in accordance with some embodiments. FIG. 17A is a cross-sectional view of the semiconductor device 200 of FIG. 16A after forming the sacrificial layer 264. FIG. 17B is a cross-sectional view of the semiconductor device 200 of FIG. 17A along line X1-X1. FIG. 17C is a cross-sectional view of the semiconductor device 200 of FIG. 17A along line X2-X2.

The sacrificial layer 264 is disposed in the trenches 219, the gate trench 254 and the spaces 258 in both the NMOS region 200A and the PMOS region 200B. In some embodiments, the thickness of the sacrificial layer 264 is controlled such that in the trenches 219, portions of the sacrificial layer 264 between the channel nanostructures 256A, 256B and the dielectric fins 218a-c are merged, while in the spaces 258, portions of the sacrificial layer 264 between adjacent channel nanostructures 256 are not merged. Accordingly, the sacrificial layer 264 fully fills the gaps between respective channel nanostructures 256A, 256B and the corresponding dielectric fins 218a-c, but not the gaps between the adjacent channel nanostructures 256A, 256B.

The sacrificial layer 264 may include a material that can be selectively etched relative to the high-k gate dielectric layer 262. In some embodiments, the sacrificial layer 264 includes an oxide such as silicon oxide, aluminum oxide, or zirconium oxide or a nitride such as silicon nitride or titanium nitride. In some embodiments, the sacrificial layer 264 is deposited by a conformal deposition process such as CVD or ALD.

Figure 18A:
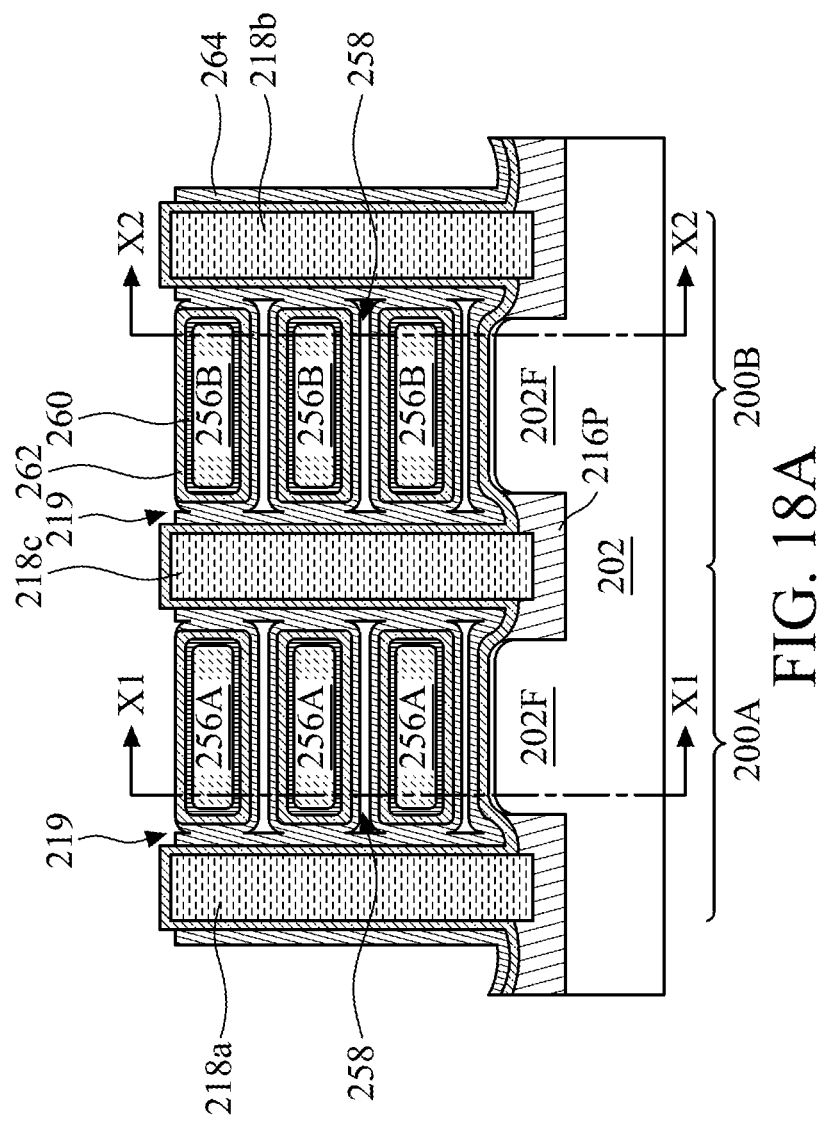
Figure 18C:
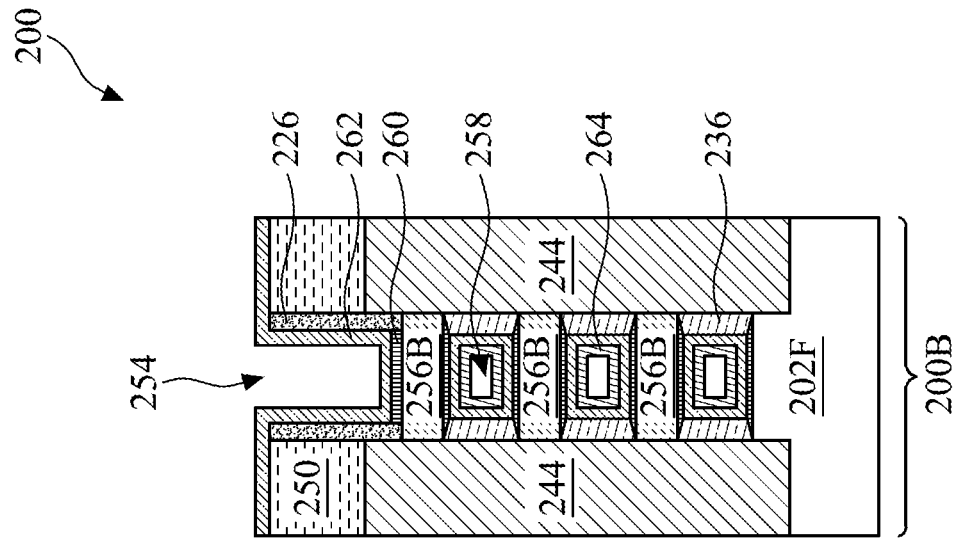
Figure 18B:
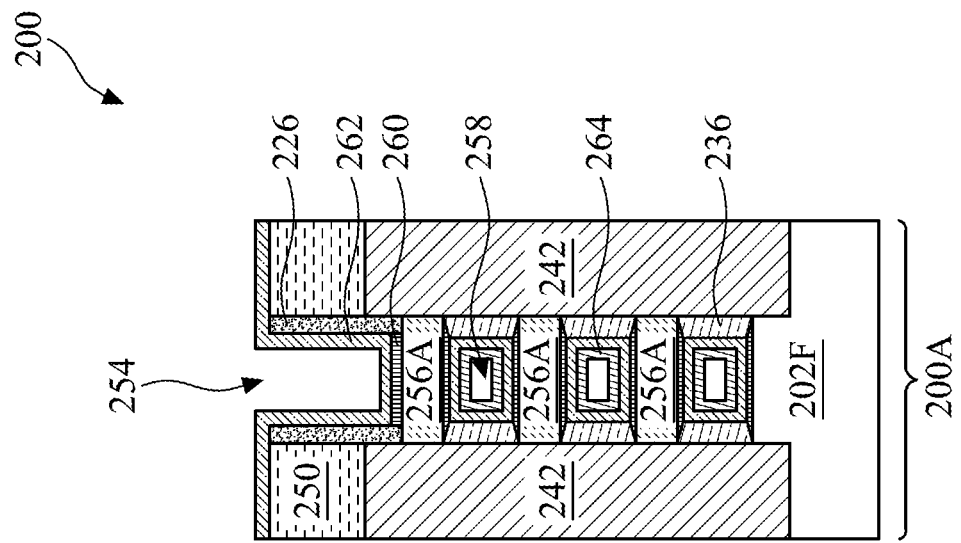

Referring to FIGS. 1 and 18A-18C, the method 100 proceeds to operation 134, in which the sacrificial layer 264 is recessed so that the upper portions of the topmost channel nanostructures 256A and 256B and the upper portions of the dielectric fins 218a-218c are exposed, in accordance with some embodiments. FIG. 18A is a cross-sectional view of the semiconductor device 200 of FIG. 17A after recessing the sacrificial layer 264. FIG. 18B is a cross-sectional view of the semiconductor device 200 of FIG. 18A along line X1-X1. FIG. 18C is a cross-sectional view of the semiconductor device 200 of FIG. 18A along line X2-X2.

In some embodiments, an isotropic etch such as a wet etch is performed to recess the sacrificial layer 264. After recessing, the top surface of the sacrificial layer 264 may be lower or leveled with the top surface of the topmost first channel nanostructure 256A in the NMOS region 200A and the top surface of the topmost second channel nanostructure 256B in the PMOS region 200B. The top surface of the sacrificial layer 264 may also be lower than the top surfaces of the dielectric fins 218a-218c. In some embodiments, the top surface of the sacrificial layer 264 is below the top surfaces of the dielectric fins 218a-218c in a range from about from 3 nm to about 5 nm.

Figure 19A:
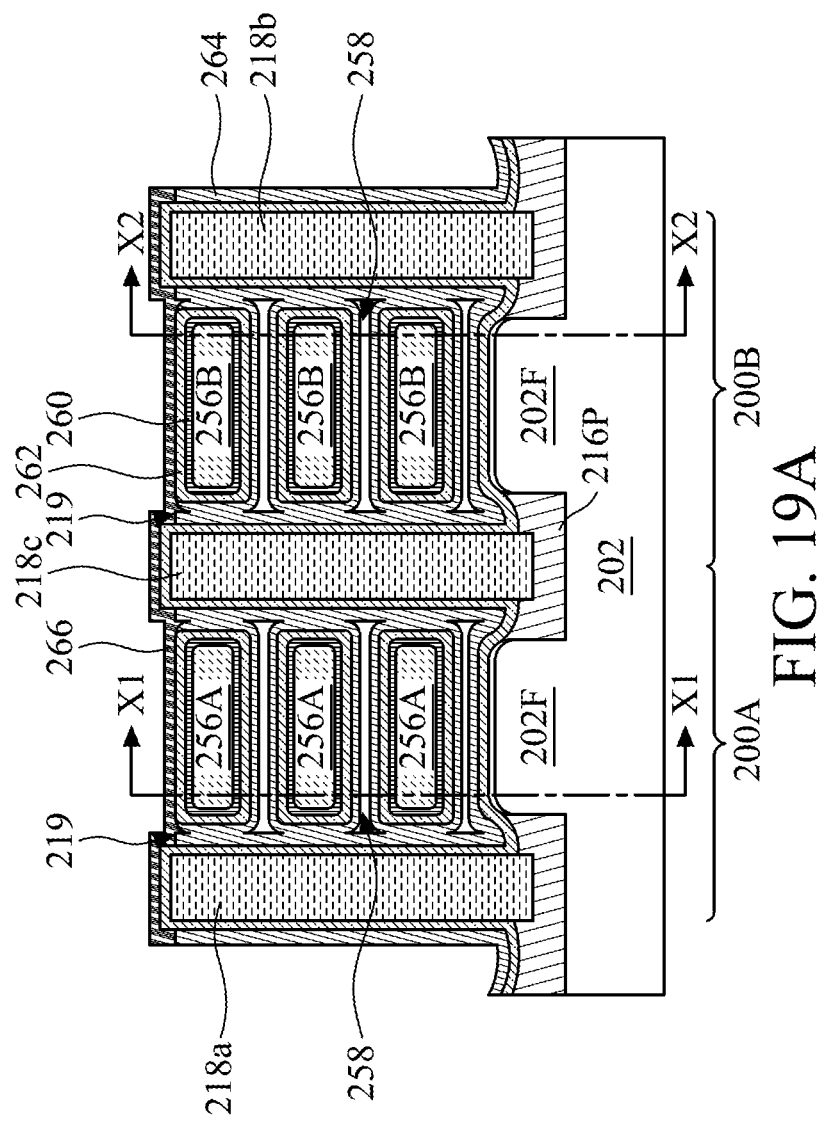
Figure 19C:
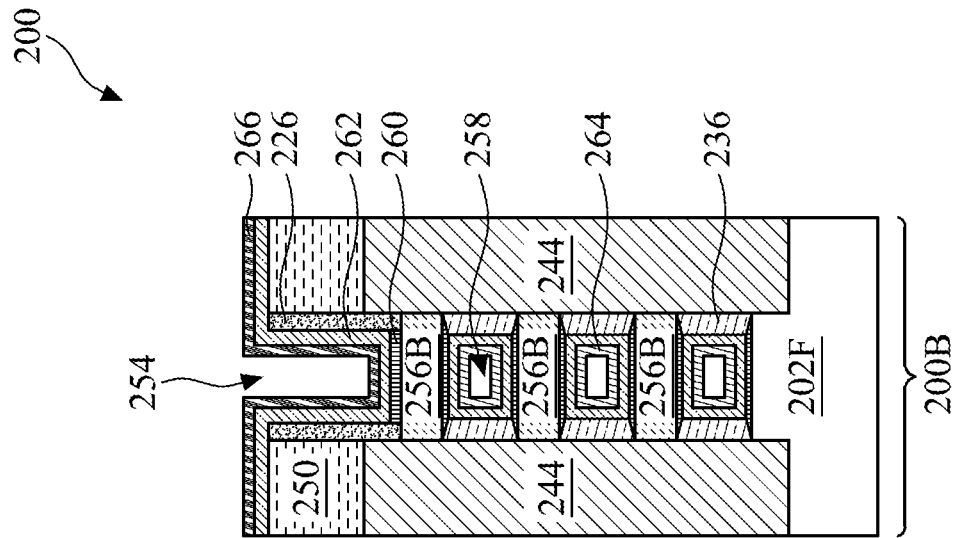
Figure 19B:
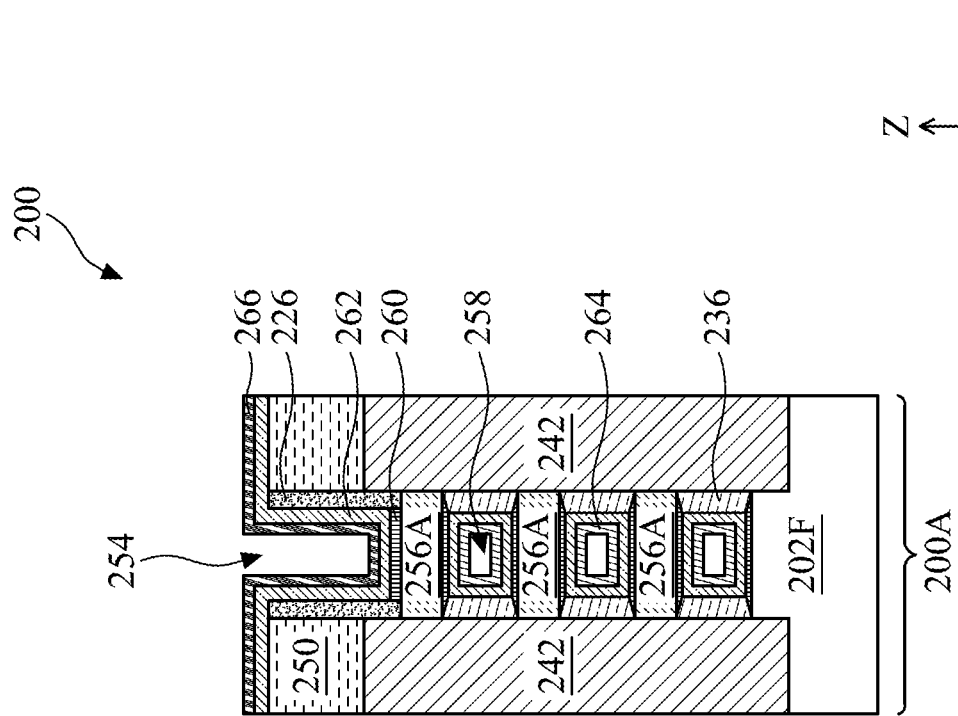

Referring to FIGS. 1 and 19A-19C, the method 100 proceeds to operation 136, in which a hard mask layer 266 is deposited over the exposed portions of the dielectric fins 218a-218c and the topmost channel nanostructures 256A, 256B as well as on the sacrificial layer 264, in accordance with some embodiments. FIG. 19A is a cross-sectional view of the semiconductor device 200 of FIG. 18A after depositing the hard mask layer 266. FIG. 19B is a cross-sectional view of the semiconductor device 200 of FIG. 19A along line X1-X1. FIG. 19C is a cross-sectional view of the semiconductor device 200 of FIG. 19A along line X2-X2.

The hard mask layer 266 may include a material that can be selectively removed relative to the sacrificial layer 264 and the high-k gate dielectric layer 262. In some embodiments, the hard mask layer 266 includes silicon oxide, aluminum oxide, zirconium oxide, silicon nitride, or titanium nitride. The hard mask layer 266 may be deposited by a conformal deposition process such as CVD or ALD.

Figure 20A:
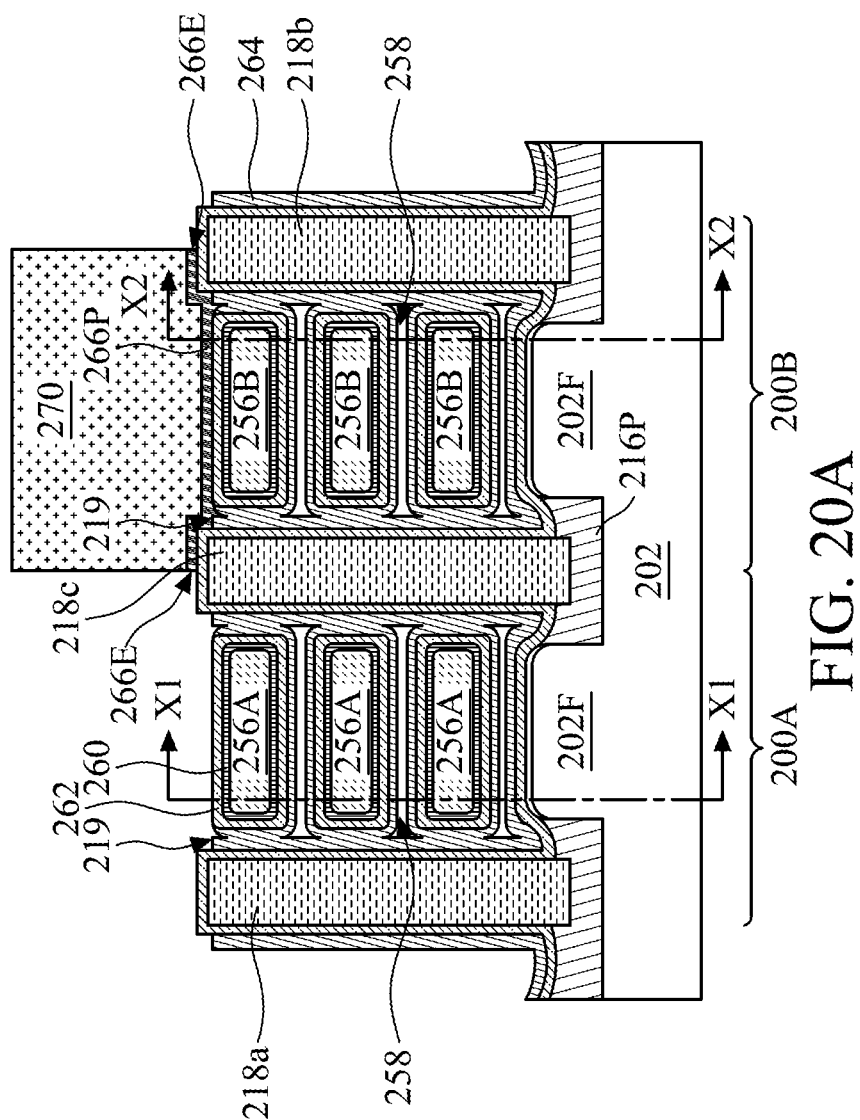
Figure 20C:
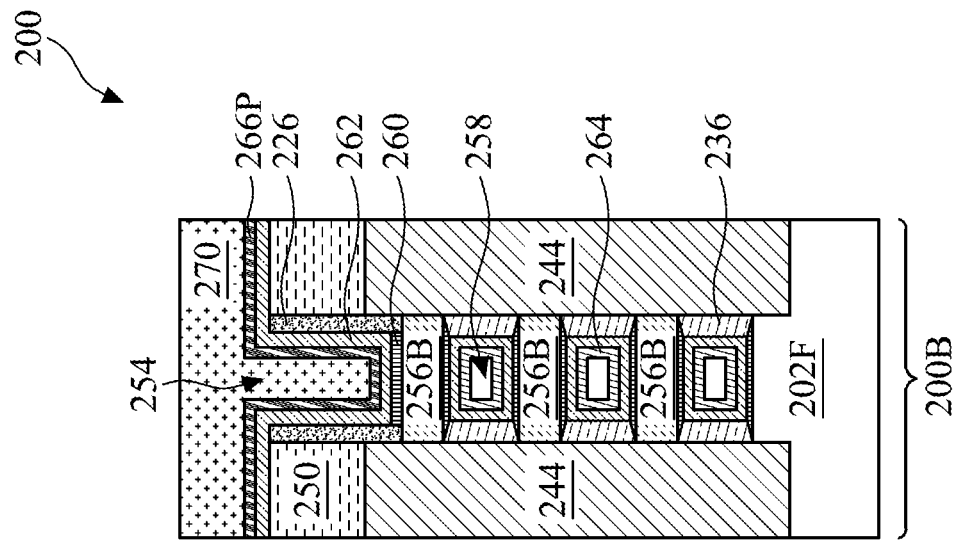
Figure 20B:
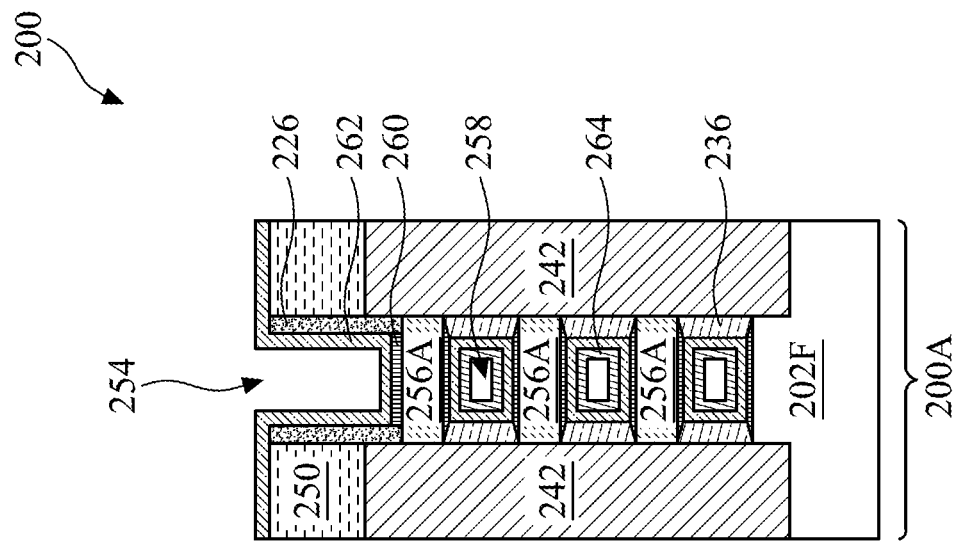

Referring to FIGS. 1 and 20A-20C, the method 100 proceeds to operation 138, in which the hard mask layer 266 is etched to form a patterned hard mask layer 266P, in accordance with some embodiments. FIG. 20A is a cross-sectional view of the semiconductor device 200 of FIG. 19A after forming the patterned hard mask layer 266P. FIG. 20B is a cross-sectional view of the semiconductor device 200 of FIG. 20A along line X1-X1. FIG. 20C is a cross-sectional view of the semiconductor device 200 of FIG. 20A along line X2-X2.

The patterned hard mask layer 266P covers a portion of the sacrificial layer 264 in the PMOS region 200B, while exposing another portion of the sacrificial layer 264 in the NMOS region 200A. In some embodiments and as shown in FIG. 20A, the patterned hard mask layer 266P has edges 266E above the dielectric fins 218b and 218c at the boundary of the PMOS region 200B.

In some embodiments, prior to etching the hard mask layer 266, a patterned mask layer 270 is formed to cover the PMOS region 200B, while exposing NMOS region 200A. In an example, the patterned mask layer 270 includes a patterned photoresist layer and is formed by a lithography process. In another example, the patterned mask layer 270 includes a patterned anti-reflective coating (ARC) layer. The patterned ARC layer is formed by depositing an ARC material layer, forming a patterned photoresist layer by a lithography process and etching the ARC material layer through the patterned photoresist layer to form the patterned mask layer 270. Subsequently, a portion of the hard mask layer 266 in the NMOS region 200A that is exposed by the patterned mask layer 270 is removed, while leaving the hard mask layer 266 in the PMOS region 200B intact. In some embodiments, removal of the hard mask layer 266 is performed using an anisotropic etching process which can be a dry etch, a wet etch, or a combination thereof. After formation of the patterned hard mask layer 266P, the patterned mask layer 270 is removed by an etching process such as plasma etch.

Figure 21A:
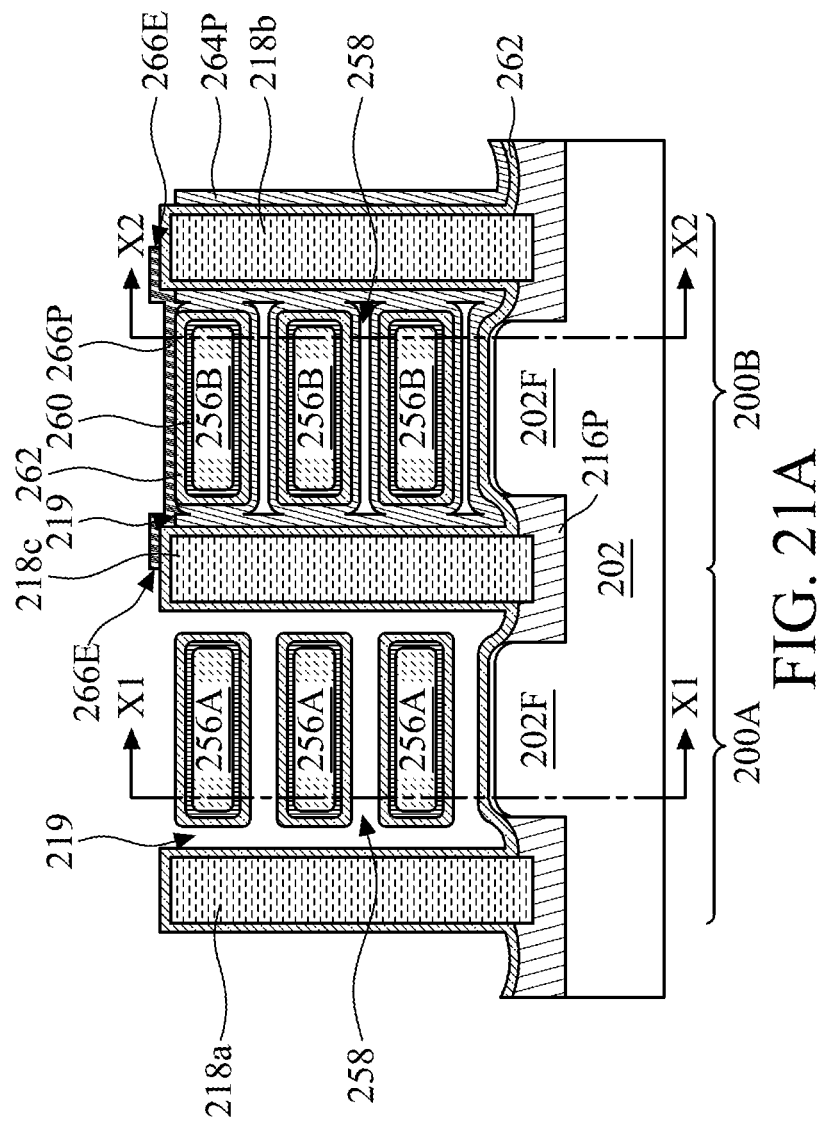
Figure 21C:
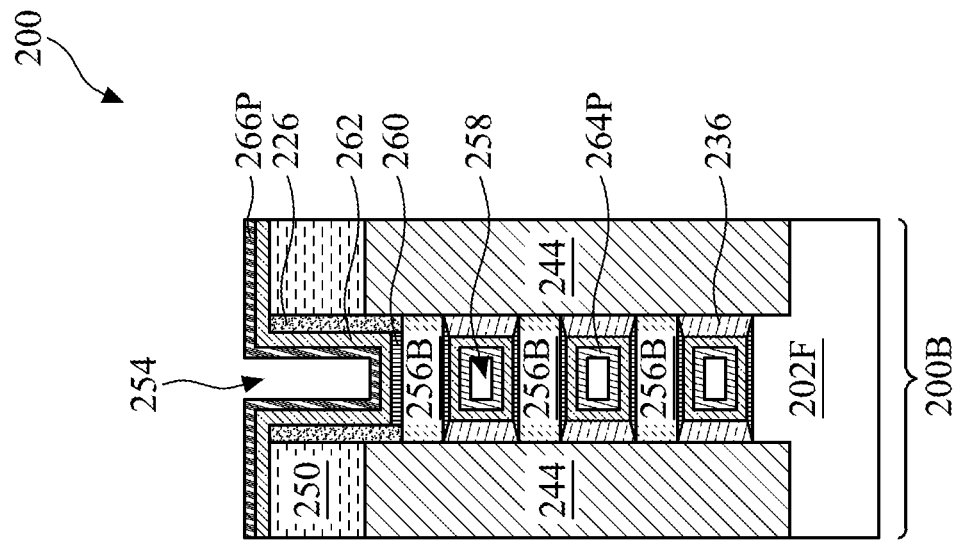
Figure 21B:
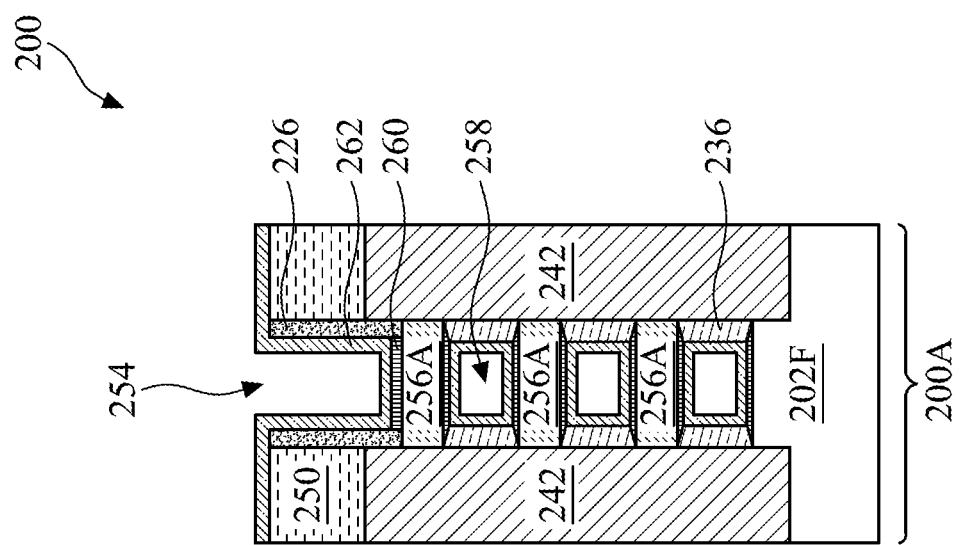

Referring to FIGS. 1 and 21A-21C, the method 100 proceeds to operation 140, in which a portion of the sacrificial layer 264 in the NMOS region 200A that is not covered by the patterned hard mask layer 266P is removed, in accordance with some embodiments. FIG. 21A is a cross-sectional view of the semiconductor device 200 of FIG. 20A after etching the sacrificial layer 264. FIG. 21B is a cross-sectional view of the semiconductor device 200 of FIG. 21A along line X1-X1. FIG. 21C is a cross-sectional view of the semiconductor device 200 of FIG. 21A along line X2-X2.

The removal of the sacrificial layer 264 from the NMOS region 200A re-exposes the portion of the high-k gate dielectric layer 262 in the NMOS region 200A. In some embodiments, the portion of the sacrificial layer 264 in the NMOS region 200A that is not covered by the patterned hard mask layer 266P is removed by an etching process. The etching process may include an isotropic etch with an adequate etching selectivity with respect to the patterned hard mask layer 266P to minimize loss of sidewalls of the patterned hard mask layer 266P during the etching process. As a result, after etching, the boundary between the patterned hard mask layer 266P and the underlying sacrificial layer 264 in the PMOS region 200B is kept. In some embodiments, a wet etch is performed to selectively etch the sacrificial layer 264 without substantially affecting the high-k gate dielectric layer 262 and the patterned hard mask layer 266P. The remaining portion of the sacrificial layer 264 in the PMOS region 200B herein refers to as a sacrificial layer portion 264P.

Figure 22A:
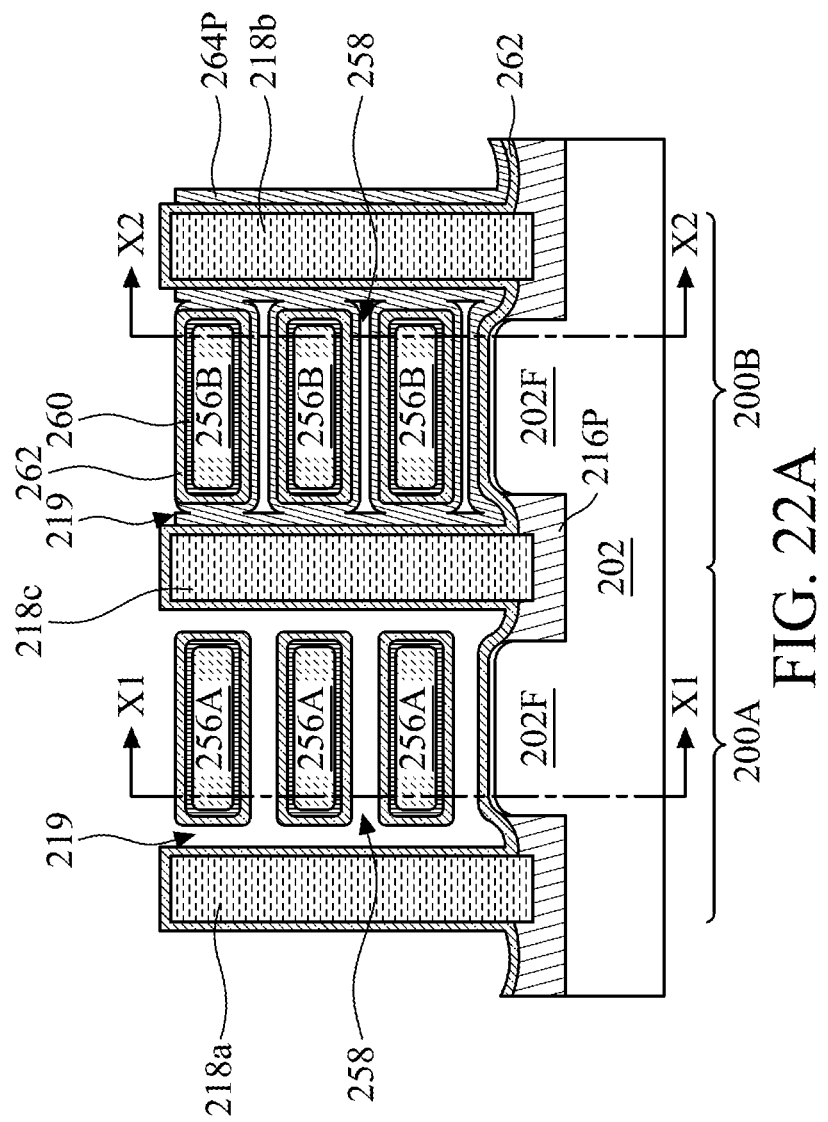
Figure 22C:
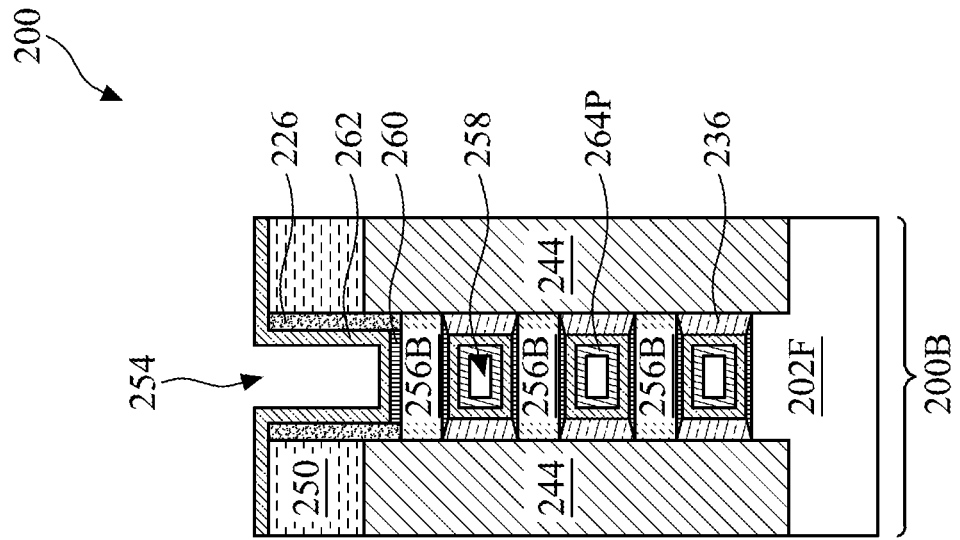
Figure 22B:
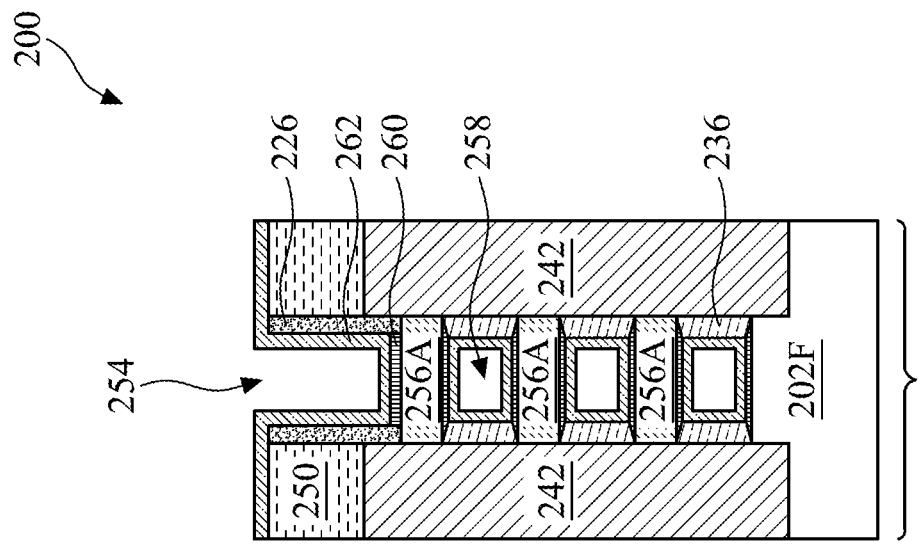

Referring to FIGS. 1 and 22A-22C, the method 100 proceeds to operation 142, in which the patterned hard mask layer 266P is removed, in accordance with some embodiments. FIG. 22A is a cross-sectional view of the semiconductor device 200 of FIG. 21A after removing the patterned hard mask layer 266P. FIG. 22B is a cross-sectional view of the semiconductor device 200 of FIG. 22A along line X1-X1. FIG. 22C is a cross-sectional view of the semiconductor device 200 of FIG. 22A along line X2-X2.

The removal of the patterned hard mask layer 266P exposes the sacrificial layer portion 264P remaining in the PMOS region 200B. In some embodiments, the patterned hard mask layer 266P is removed by an etching process which can be a dry etch, a wet etch, or a combination thereof. In some embodiments, a dry etch such as RIE is performed to remove the patterned hard mask layer 266P from the structure.

Figure 23A:
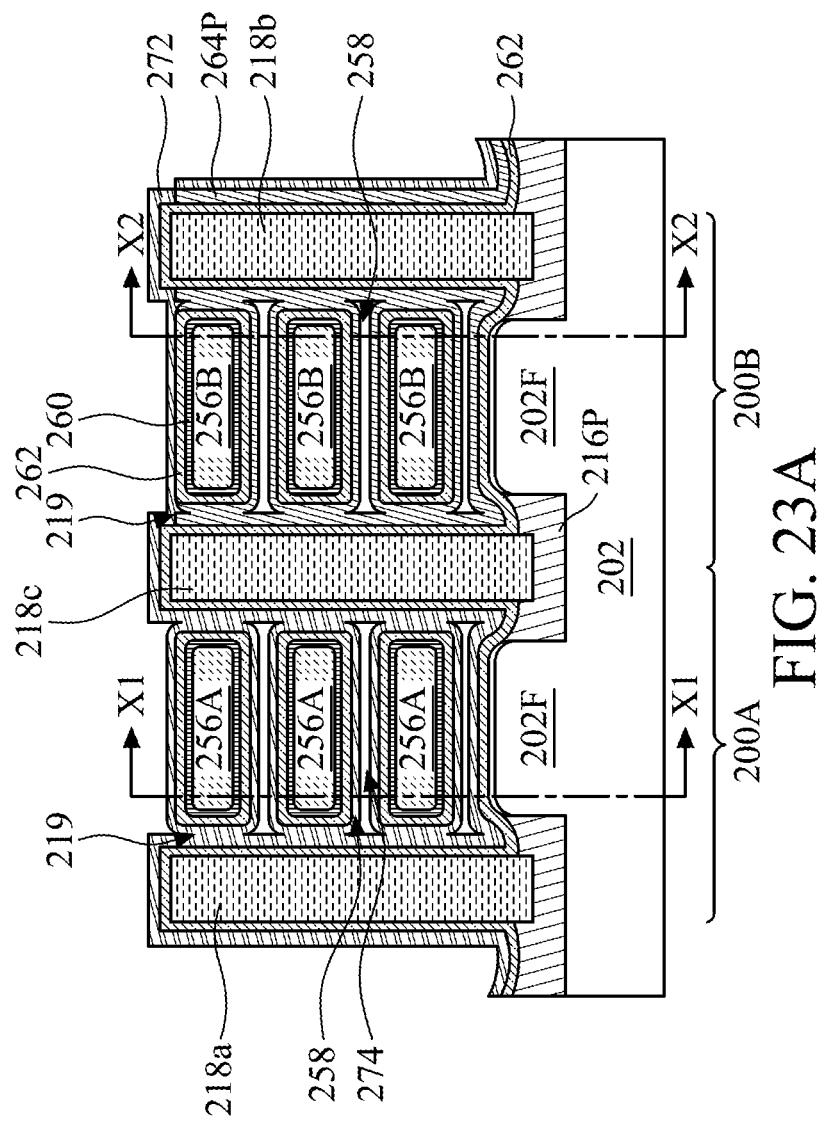
Figure 23C:
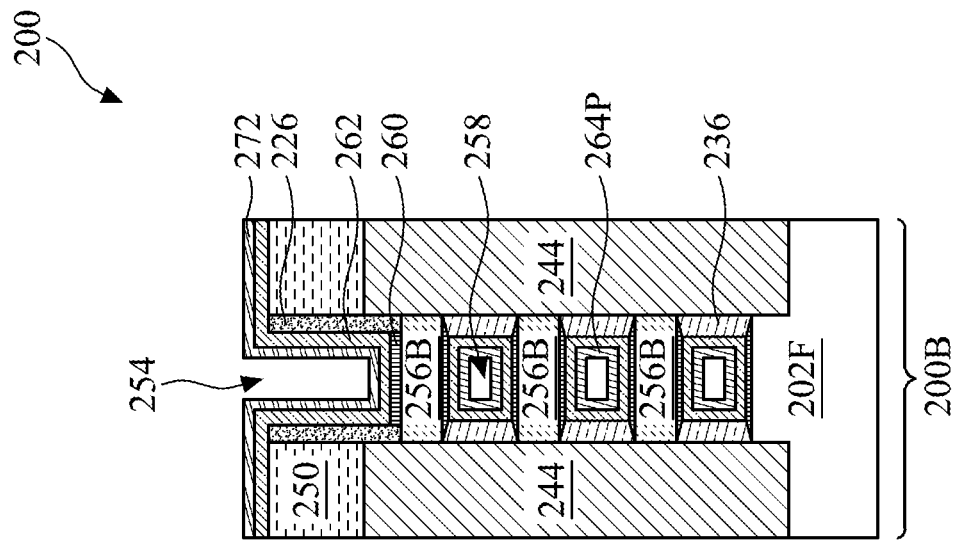
Figure 23B:
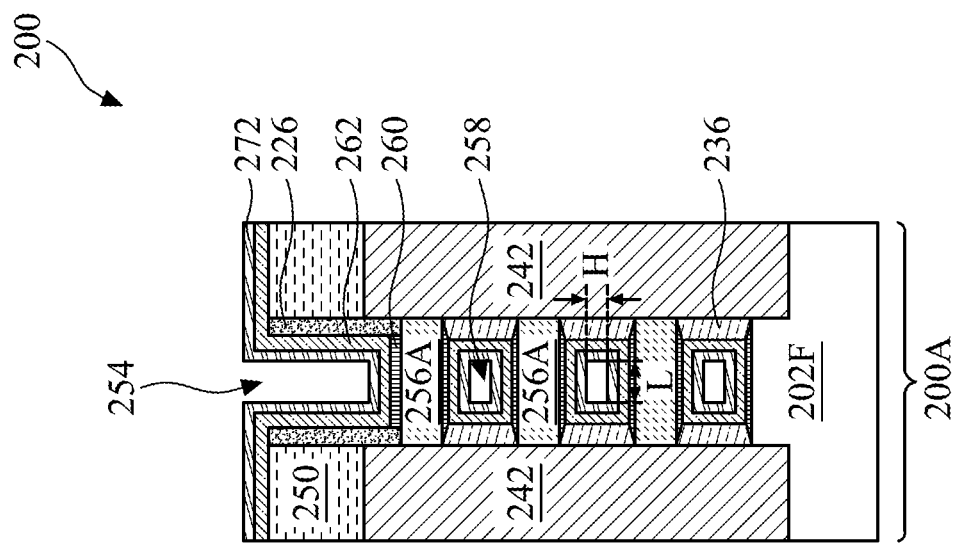

Referring to FIGS. 1 and 23A-23C, the method 100 proceeds to operation 144, in which a first-type work function layer, for example, an n-type work function layer 272 is formed in the NMOS region 200A and the PMOS region 200B, in accordance with some embodiments. FIG. 23A is a cross-sectional view of the semiconductor device 200 of FIG. 22A after forming the n-type work function layer 272. FIG. 23B is a cross-sectional view of the semiconductor device 200 of FIG. 23A along line X1-X1. FIG. 23C is a cross-sectional view of the semiconductor device 200 of FIG. 23A along line X2-X2.

The n-type work function layer 272 is formed as a conformal layer and disposed over the high-k gate dielectric layer 262, the sacrificial layer portion 264P and the dielectric fins 218a-c. In the NMOS region 200A, the n-type work function layer 272 wraps around the first channel nanostructures 256A. In the PMOS regions 200B, since the sacrificial layer portion 264P seals the gaps between the second channel nanostructures 256B and corresponding dielectric fins 218b and 218c, the n-type work function layer 272 is only present on top of the sacrificial layer portion 264P. The thickness of the n-type work function layer 272 is controlled such that in the NMOS region 200A, portions of the n-type work function layer 272 on sidewalls of the dielectric fins 218a and 218c and sidewalls of the first channel nanostructures 256A merge the dielectric fins 218a and 218c and the first channel nanostructures 256A; however, portions of the n-type work function layer 272 on top and bottom surfaces of each of the first channel nanostructures 256A do not merge the adjacent first channel nanostructures 256A. Accordingly, in the NMOS region 200A, the n-type work function layer 272 fully fills the gaps between the first channel nanostructures 256A and adjacent dielectric fins (i.e., dielectric fins 218a and 218c), but only partially fills each of the spaces 258 between adjacent first channel nanostructures 256A, thereby leaving an air gap 274 between every adjacent first channel nanostructure 256A. In some embodiments, the air gap 274 has a length L in the x-direction no less than about 3 nm, a width W in the y-direction from about 10 nm to about 100 nm, and a height H in the z-direction from about 0.1 nm to about 5 nm. Because the air has a low dielectric constant (about 1), air gaps 274 between the adjacent first channel nanostructures 256A help to reduce RC delay and boot performance of the resulting n-type FET.

The n-type work function layer 272 is adapted to tune the threshold voltage Vt1 for an n-type FET formed in the NMOS region 200A. In some embodiments, the n-type work function layer 272 includes titanium aluminum carbide (TiAlC), titanium aluminum (TiAl), tantalum aluminum carbide (TaAlC), tantalum carbide (TaC), tantalum aluminum silicon carbide (TaAlSiC), or titanium aluminum silicon carbide (TiAlSiC). In various embodiments, the n-type work function layer 272 may be formed by a conformal deposition method such as, for example, ALD or CVD.

Figure 24A:
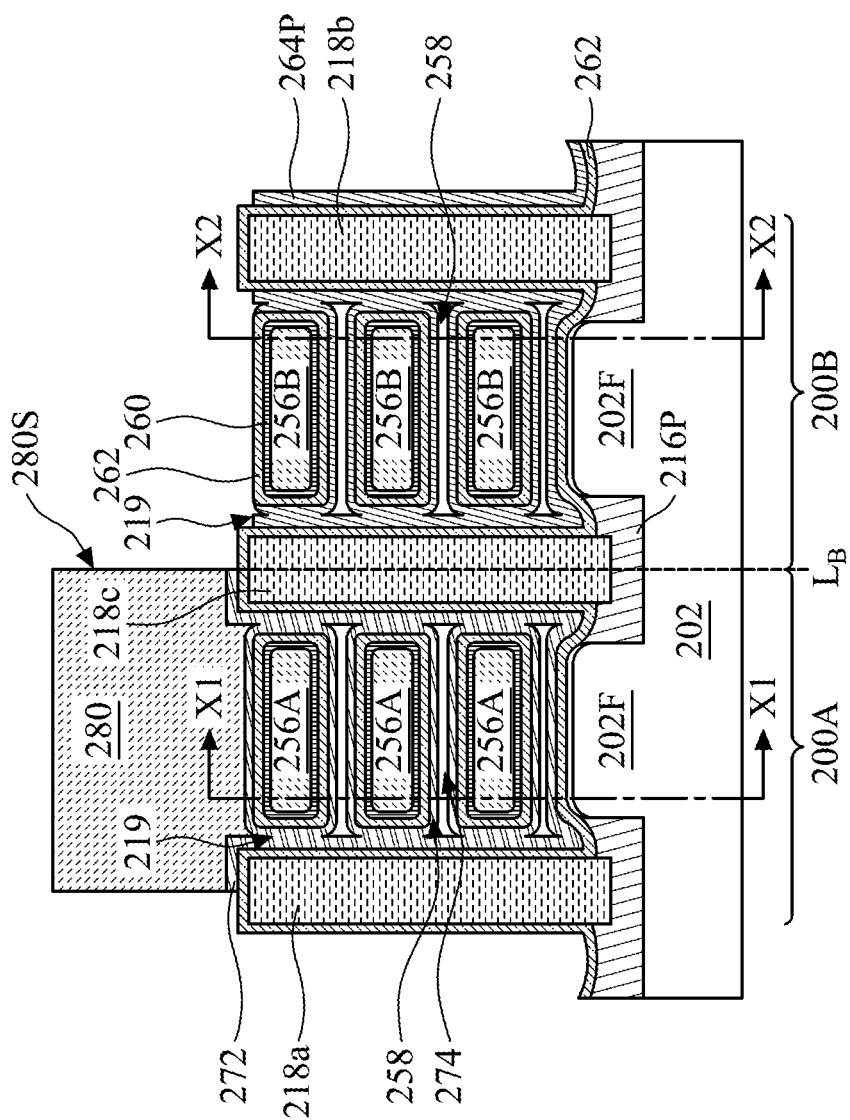
Figure 24B:
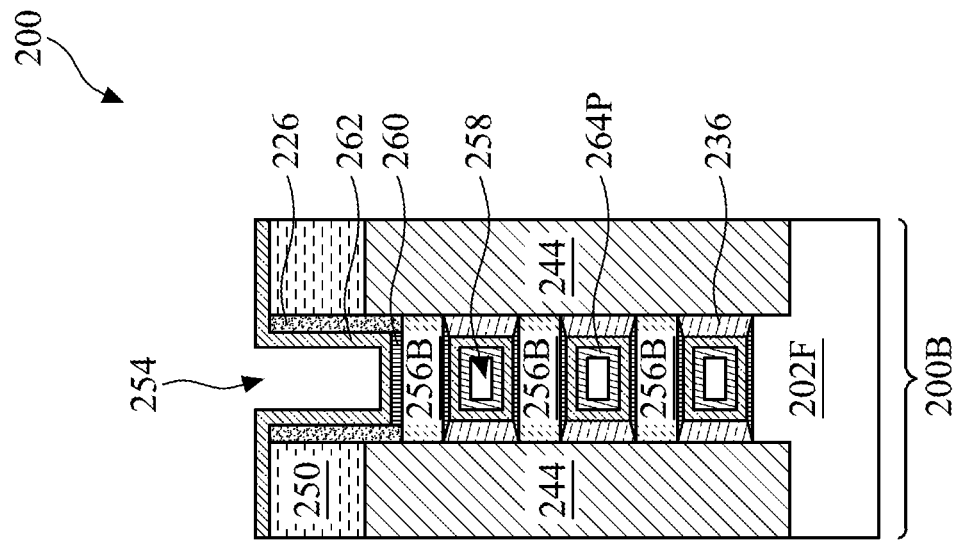
Figure 24C:
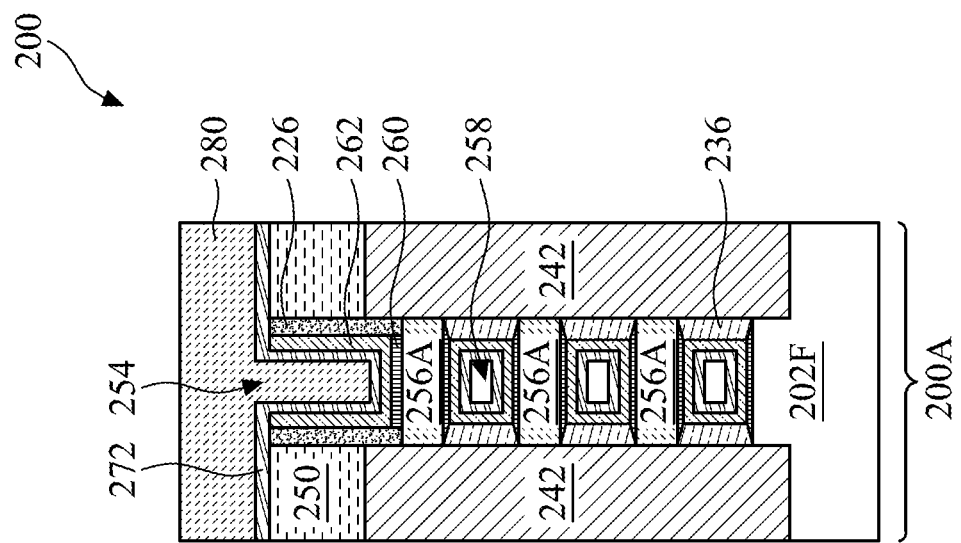

Referring to FIGS. 1 and 24A-24C, the method 100 proceeds to operation 146, in which a portion of the n-type work function layer 272 in the PMOS region 200B is removed, in accordance with some embodiments. FIG. 24A is a cross-sectional view of the semiconductor device 200 of FIG. 23A after removing the n-type work function layer 272 from the PMOS region 200B. FIG. 24B is a cross-sectional view of the semiconductor device 200 of FIG. 24A along line X1-X1. FIG. 24C is a cross-sectional view of the semiconductor device 200 of FIG. 24A along line X2-X2.

In some embodiments, prior to the removal of the portion of the n-type work function layer 272 in the PMOS region 200B, a patterned mask layer 280 is formed to cover the NMOS region 200A, while exposing the PMOS region 200B. In an example, the patterned mask layer 280 includes a patterned photoresist layer and is formed by a lithography process. In another example, the patterned mask layer 280 includes a patterned ARC layer. The patterned ARC layer is formed by depositing an ARC material layer, forming a patterned photoresist layer by a lithography process and etching the ARC material layer through the patterned photoresist layer to form the patterned mask layer 280. The patterned mask layer 280 partially overlaps the dielectric fin 218c between the NMOS region and the PMOS region 200B. In some embodiments, the patterned mask layer 280 has a sidewall 280S at the boundary line of the NMOS region 200A and the PMOS region 200B.

Subsequently, the portion of the n-type work function layer 272 in the PMOS region 200B that is exposed by the patterned mask layer 280 is removed, while leaving the portion of the n-type work function layer 272 in the NMOS region 200A intact. In some embodiments, the portion of the n-type work function metal layer 272 in the PMOS region 200B is removed using an anisotropic etching process. The anisotropic etch can be a dry etch such as RIE, a wet etch, or a combination thereof.

In embodiments of the present disclosure, due to the presence of the sacrificial layer portion 264P that prevents the n-type work function layer 272 from being deposited into the gaps between the second channel nanostructures 256B and the end-cap fins (i.e., dielectric fins 218b and 218c) in the PMOS region 200B, strong etching that is required for complete removal of the n-type work function material from the gaps between the second channel nanostructures 256B and the end-cap fins (i.e., dielectric fins 218b and 218c) in the PMOS region 200B, but would result in over-etching of the n-type work function material in the NMOS region 200A, is no longer needed. As a result, the gate metal loss caused by the over-etching of the work function material in the NMOS region 200A is avoided. The end of the remaining n-type work function layer 272 can, thus, be kept at the boundary of the NMOS region 200A and the PMOS region 200B. In some embodiments and as shown in FIG. 24A, after etching, the ends of the remaining n-type work function layer 272 are on top of the dielectric fins 218a and 218c.

Figure 25A:
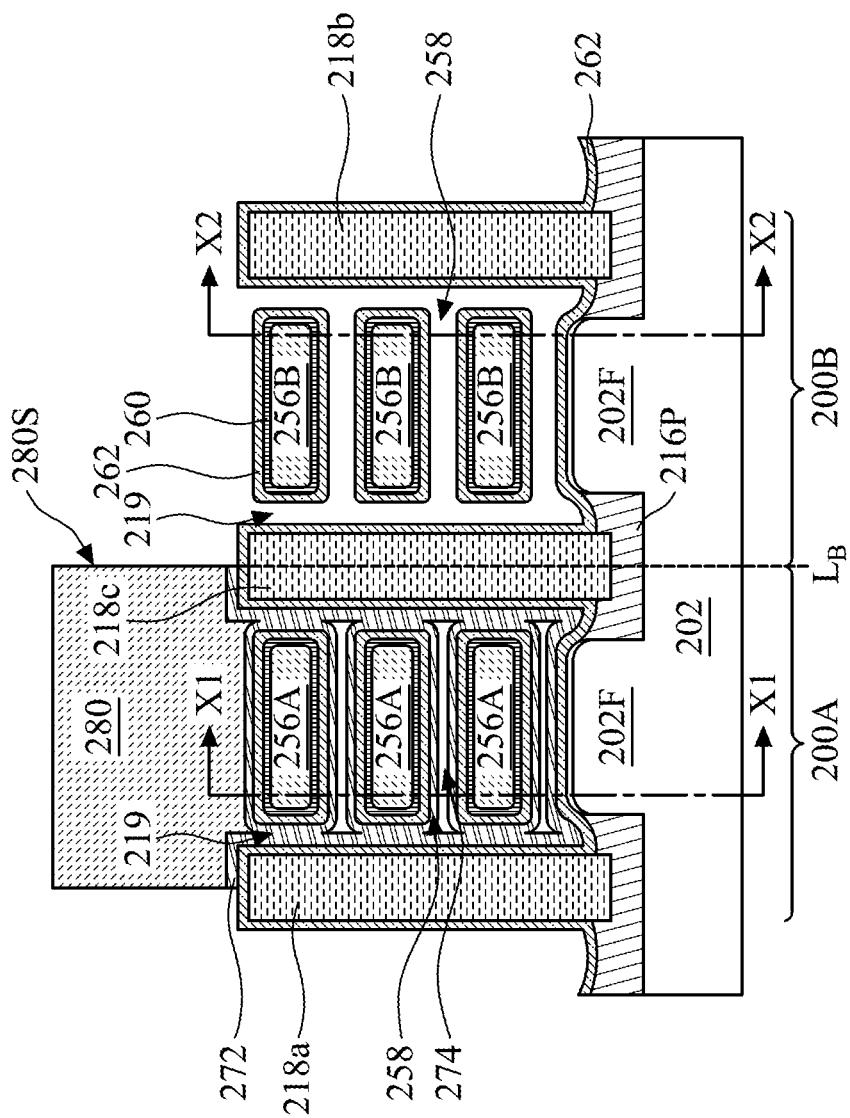
Figure 25C:
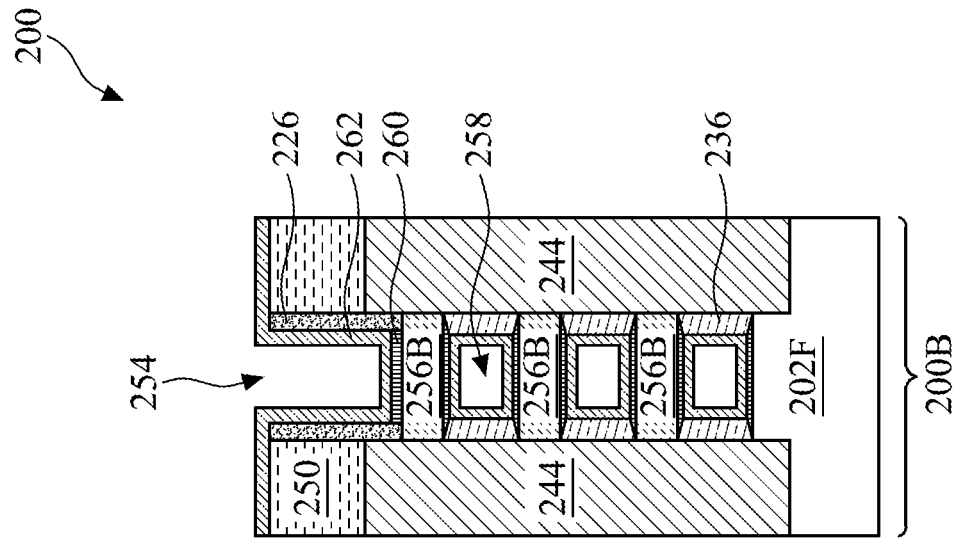
Figure 25B:
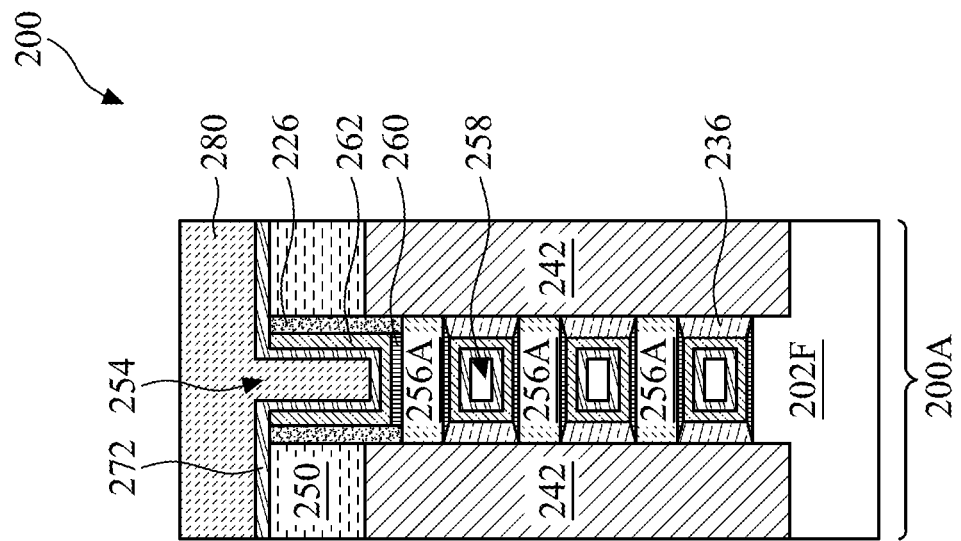

Referring to FIGS. 1 and 25A-25C, the method 100 proceeds to operation 148, in which the sacrificial layer portion 264P in the PMOS region 200B is removed, in accordance with some embodiments. FIG. 25A is a cross-sectional view of the semiconductor device 200 of FIG. 24A after removing the sacrificial layer portion 264P from the PMOS region 200B. FIG. 25B is a cross-sectional view of the semiconductor device 200 of FIG. 25A along line X1-X1. FIG. 25C is a cross-sectional view of the semiconductor device 200 of FIG. 25A along line X2-X2.

As shown in FIG. 25A, the sacrificial layer portion 264P is removed from the trenches 219 between the second channel nanostructures 256B and corresponding dielectric fins 218b and 218c, as well as from the spaces 258 between the second channel nanostructures 256B. The removal of the sacrificial layer portion 264P from the PMOS region 200B thus re-exposes the high-k gate dielectric layer 262 in the PMOS region 200B. In some embodiments, the sacrificial layer portion 264P is removed by an etching process. In some embodiments, a wet etch is performed to selectively etch the sacrificial layer portion 264P without substantially affecting the high-k gate dielectric layer 262. After removal of the sacrificial layer portion 264P, the patterned mask layer 280 is removed from the structure, for example, by plasma etching.

Figure 26A:
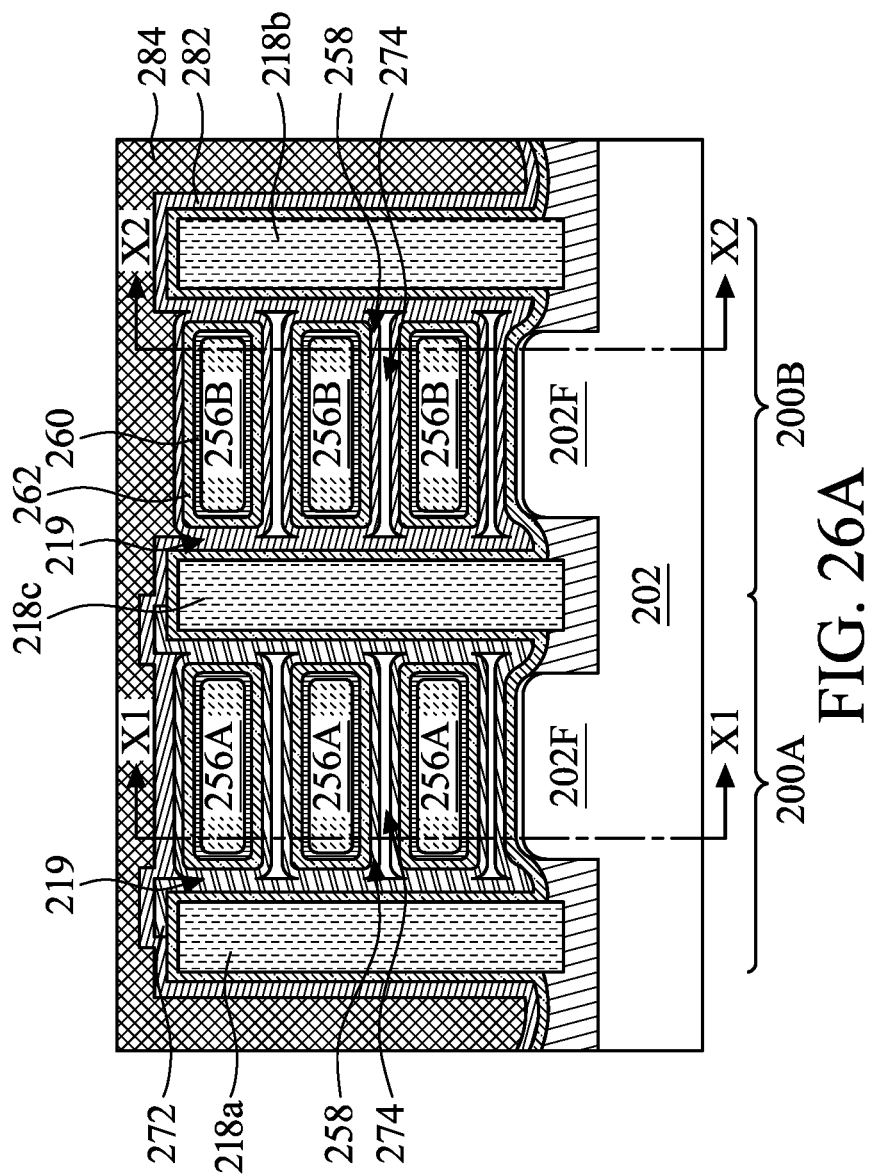

Referring to FIGS. 1 and 26A-26C, the method 100 proceeds to operation 150, in which a second-type work function layer, for example, a p-type work function layer 282, is formed in the NMOS region 200A and the PMOS region 200B, in accordance with some embodiments. FIG. 26A is a cross-sectional view of the semiconductor device 200 of FIG. 25A after forming the p-type work function layer 282 over the n-type work function layer 272 and the high-k gate dielectric layer 262. FIG. 26B is a cross-sectional view of the semiconductor device 200 of FIG. 26A along line X1-X1. FIG. 26C is a cross-sectional view of the semiconductor device 200 of FIG. 26A along line X2-X2.

The p-type work function layer 282 is conformally deposited on the high-k gate dielectric layer 262 in the PMOS region 200B and the n-type work function layer 272 in the NMOS region 200A. In the PMOS region 200B, the p-type work function layer 282 wraps around the high-k gate dielectric layer 262. The thickness of the p-type work function layer 282 is controlled such that in the PMOS region 200B, portions of the p-type work function layer 282 on sidewalls of the dielectric fins 218b and 218c and sidewalls of the second channel nanostructures 256B merges the dielectric fins 218b and 218c and the second channel nanostructures 256B; however, portions of the p-type work function layer 282 on top and bottom surfaces of each of the second channel nanostructures 256B do not merge the adjacent second channel nanostructures 256B. Accordingly, in the PMOS region 200B, the p-type work function layer 282 fully fills the gaps between the second channel nanostructures 256B and adjacent dielectric fins (i.e., dielectric fins 218b and 218c), but only partially fills each of the spaces 258 between adjacent channel nanostructures 256B. An air gap 274 is thus formed between every adjacent second channel nanostructures 256B. Because the air has a low dielectric constant (about 1), the air gaps 274 between the second channel nanostructures 256B help to reduce RC delay and boot performance of the resulting p-type FET.

In some embodiments, the p-type work function layer 282 also fully fills the gate trench 254. In some other embodiments and as shown in FIGS. 26B and 26C, the p-type work function layer 282 only partially fills the gate trench 254. Therefore, after deposition of the p-type work function layer 282, a conductive fill material layer 284 may be deposited on the p-type work function layer 282 to fully fill the gate trench 254.

The p-type work function layer 282 is adapted to tune the threshold voltage Vt2 for a p-type FET formed in the PMOS region 200B. In some embodiments, the p-type work function layer 282 includes titanium nitride (TiN), tungsten carbon nitride (WCN), titanium silicon nitride (TiSiN), or tantalum nitride (TaN). In various embodiments, the p-type work function layer 282 may be formed by a conformal deposition method such as, for example, ALD or CVD.

After deposition of the p-type work function layer 282, a planariazation process such as CMP may be performed to remove the conductive fill material layer 284, the p-type work function layer 282, the n-type work function layer 272, and the high-k gate dielectric layer 262 from a top surface of the ILD layer 250. The top surfaces of the ILD layer 250, the high-k gate dielectric layer 262, the n-type work function layer 272, the p-type work function layer 282, and the conductive fill material layer 284 are thus coplanar with each other.

Figure 27A:
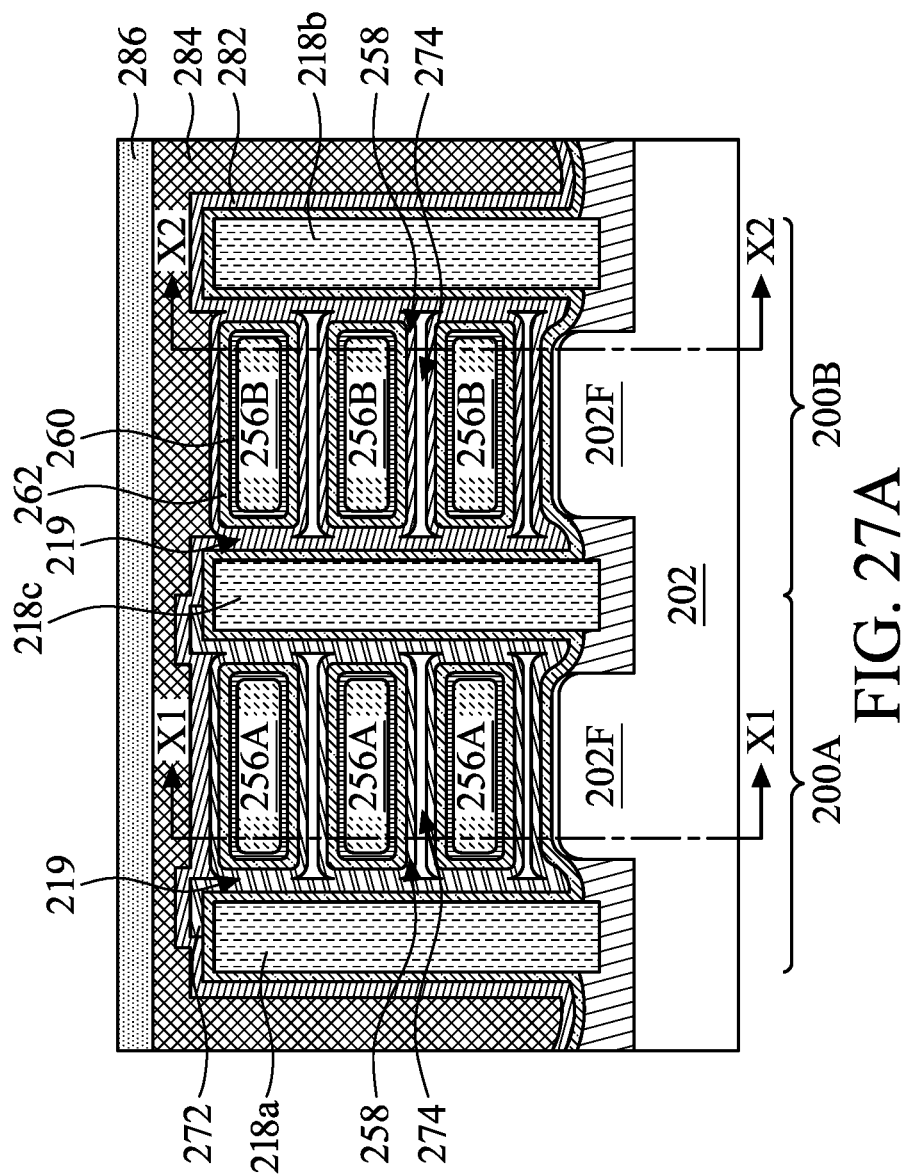
Figure 27C:
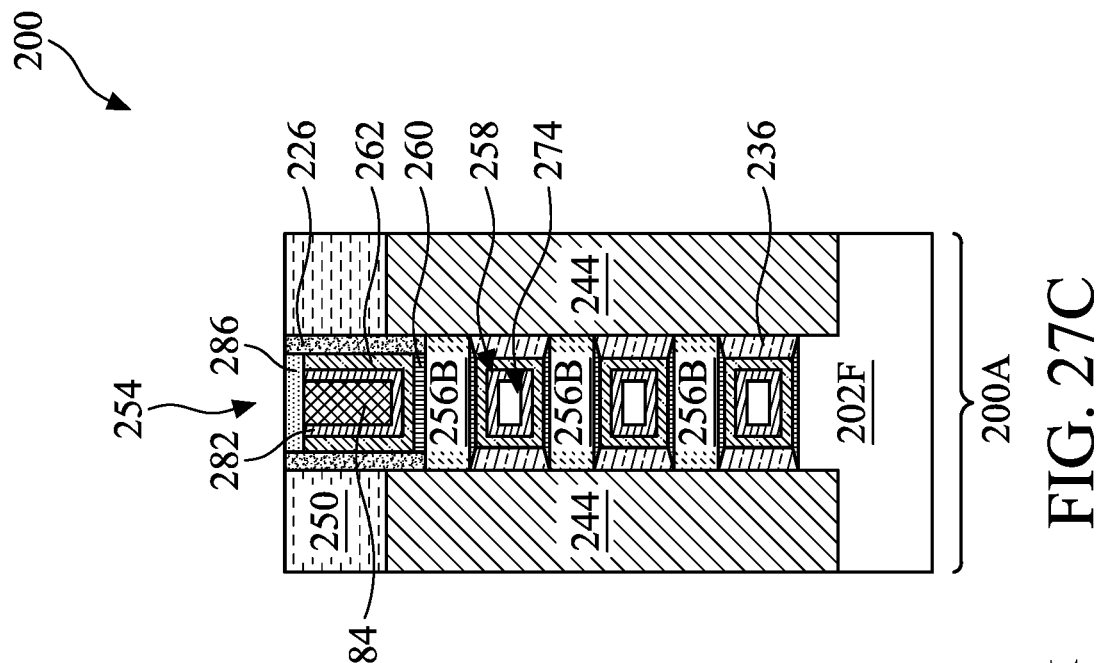
Figure 27B:
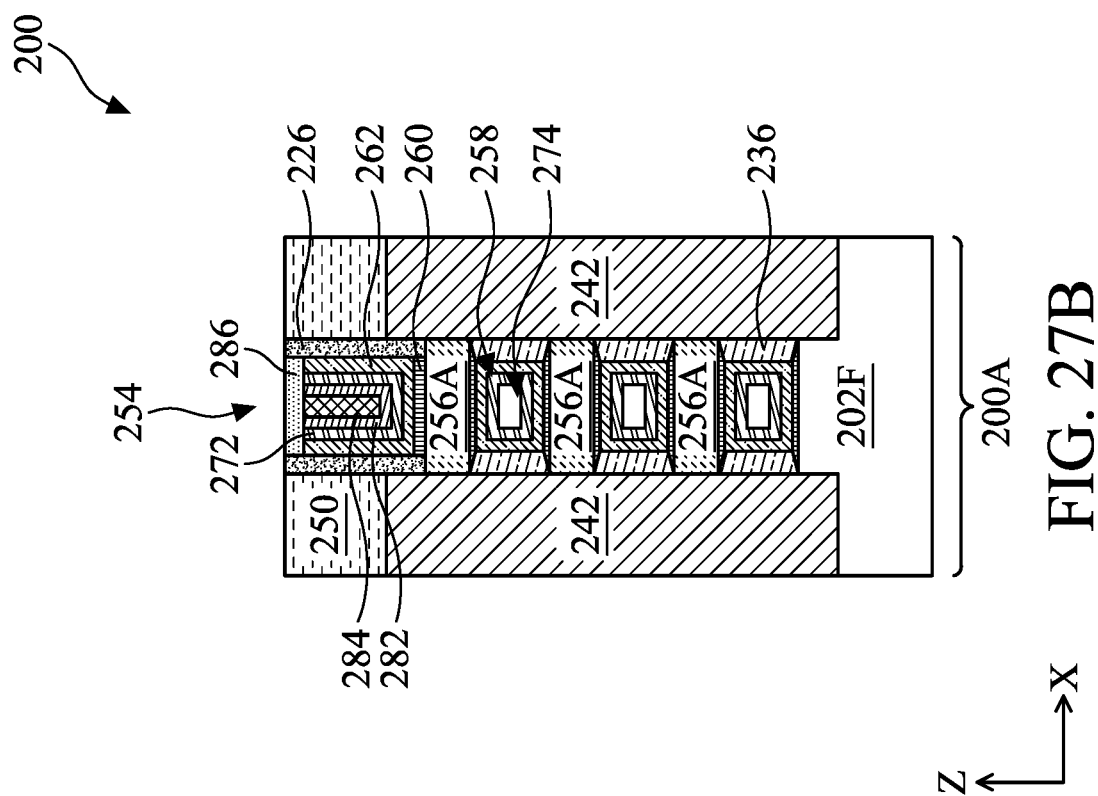

Referring to FIGS. 1 and 27A-27C, the method 100 proceeds to operation 152, in which a gate cap 286 is formed, in accordance with some embodiments. FIG. 27A is a cross-sectional view of the semiconductor device 200 of FIG. 26A after forming the gate cap 286. FIG. 27B is a cross-sectional view of the semiconductor device 200 of FIG. 27A along line X1-X1. FIG. 27C is a cross-sectional view of the semiconductor device 200 of FIG. 27A along line X2-X2.

The gate cap 286 includes a first portion formed over the high-k gate dielectric layer 262, the n-type work function layer 272, the p-type work function layer 282, and the conductive fill material layer 284 in the NMOS region 200A; and a second portion formed over the high-k gate dielectric layer 262, the p-type work function layer 282, and the conductive fill material layer 284 in the PMOS region 200B. In some embodiments, the gate cap 286 is formed by first recessing the high-k gate dielectric layer 262, the n-type work function layer 272, the p-type work function layer 282, and the conductive fill material layer 284 to have the top surfaces of the high-k gate dielectric layer 262, the n-type work function layer 272, the p-type work function layer 282, and the conductive fill material layer 284 below the top surfaces of the gate spacers 226 and then deposited a dielectric material over the recessed surfaces of the high-k gate dielectric layer 262, the n-type work function layer 272, the p-type work function layer 282, and the conductive fill material layer 284. CMP may subsequently performed to remove the deposited dielectric material from the top surface of the ILD layer 250, thereby providing the gate cap 286 having a top surface coplanar with the top surface of the ILD layer 250.

An n-type FET is thus formed in the NMOS region 200A. The n-type FET includes a plurality of first channel nanostructures 256A spaced apart from each other, a first gate structure including a first gate stack and a first portion of a gate cap 286 over the first gate stack, and first source/drain structures 242 adjoining the first channel nanostructures 256A. The first gate stack includes a first portion surrounding each of the first channel nanostructures 256A and a second portion over a topmost first channel nanostructure 256A and in a first portion of a gate trench 254 in the NMOS region 200A. The first portion of the first gate stack includes a first portion of a high-k gate dielectric layer 262 surrounding each of the first channel nanostructures 256A, and a first portion of an n-type work function layer 272 over the first portion of the high-k gate dielectric layer 262 and surrounding each of the first channel nanostructures 256A. An air gap 274 is present between every two adjacent first channel nanostructures 256A. The second portion of the first gate stack includes a second portion of the high-k gate dielectric layer 262 on sidewalls and bottom surfaces of the first portion of the gate trench 254, a second portion of the n-type work function layer 272 on the second portion of the high-k gate dielectric layer 262, a first portion of the p-type work function layer 282, and a first portion of the conductive fill material layer 284.

A p-type FET is thus formed in the PMOS region 200B. The p-type FET includes a plurality of second channel nanostructures 256B spaced apart from each other, a second gate structure including a second gate stack and a second portion of the gate cap over the second gate stack, and second source/drain structures 244 adjoining the second channel nanostructures 256B. The second gate stack includes a first portion surrounding each of the second channel nanostructures 256B and a second portion over a topmost second channel nanostructure 256B and in a second portion of the gate trench 254 in the PMOS region 200B. The first portion of the second gate stack includes a third portion of a high-k gate dielectric layer 262 surrounding each of the second channel nanostructures 256B and a second portion of the p-type work function layer 282 over the third portion of the high-k gate dielectric layer 262 and surrounding each of the second channel nanostructures 256B. An air gap 274 is present between every two adjacent second channel nanostructures 256B. The second portion of the second gate stack includes a fourth portion of the high-k gate dielectric layer 262 on sidewalls and bottom surfaces of the second portion of the gate trench 254, a third portion of the p-type work function layer 282, and a second portion of the conductive fill material layer 284.

A dielectric fin 218c is disposed at the boundary of the NMOS region 200A and the PMOS region 200B to separate the n-type FET and the p-type FET from each other. The n-type work function layer 272 has an edge located on top of the dielectric fin 218c.

Figure 28A:
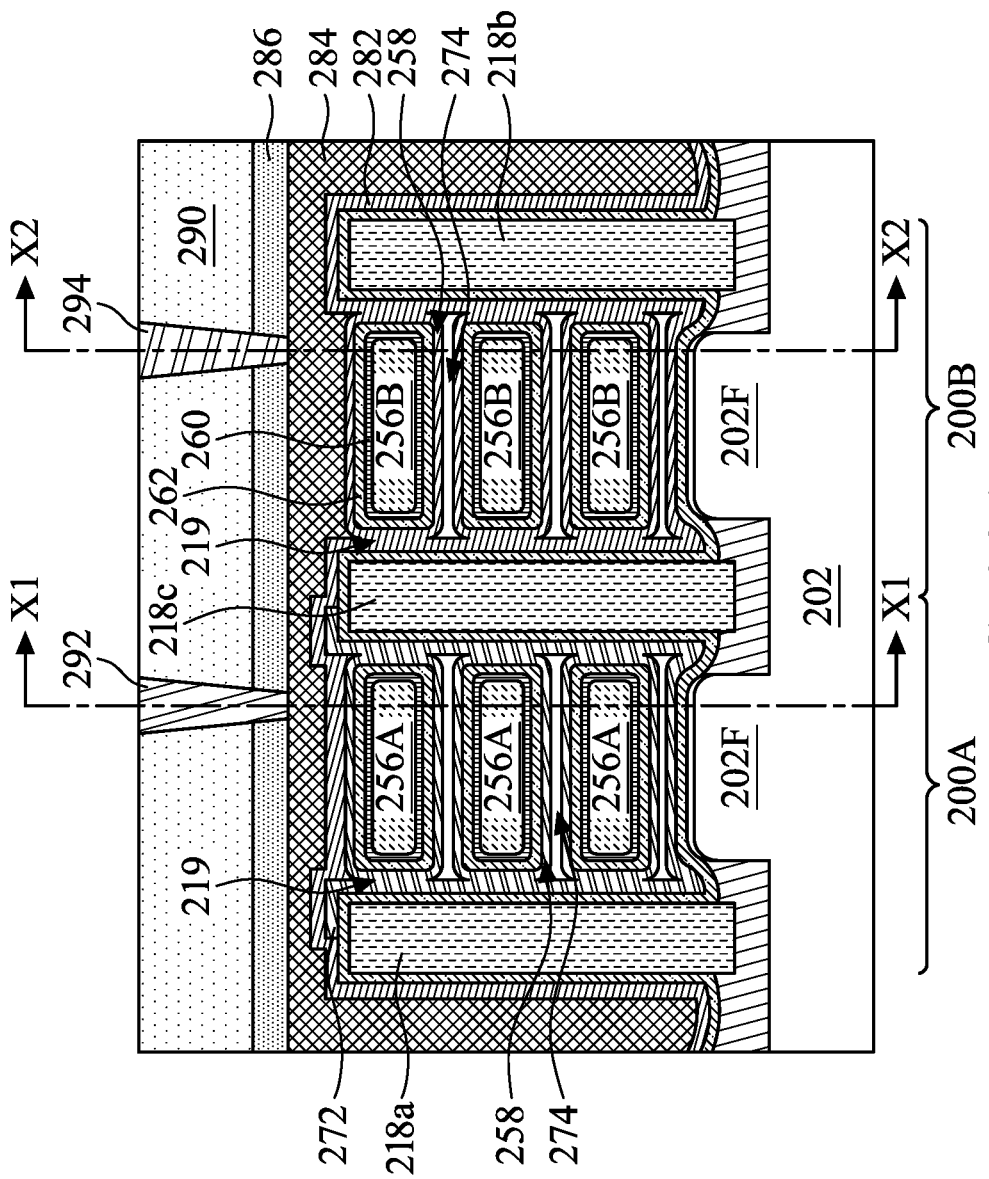
Figure 28C:
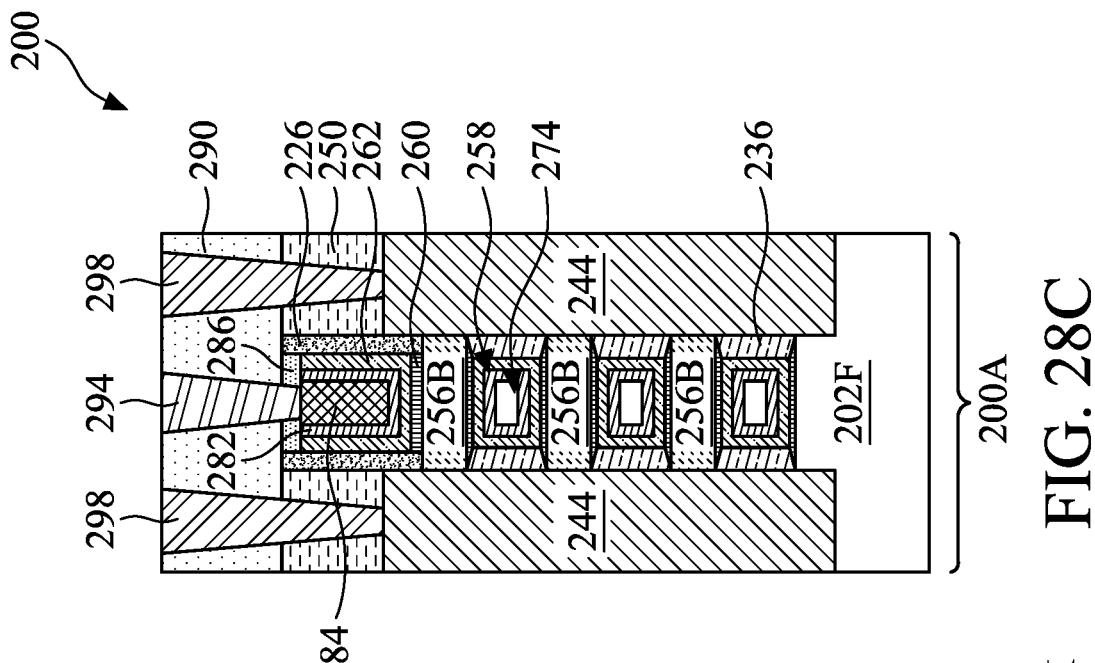
Figure 28B:
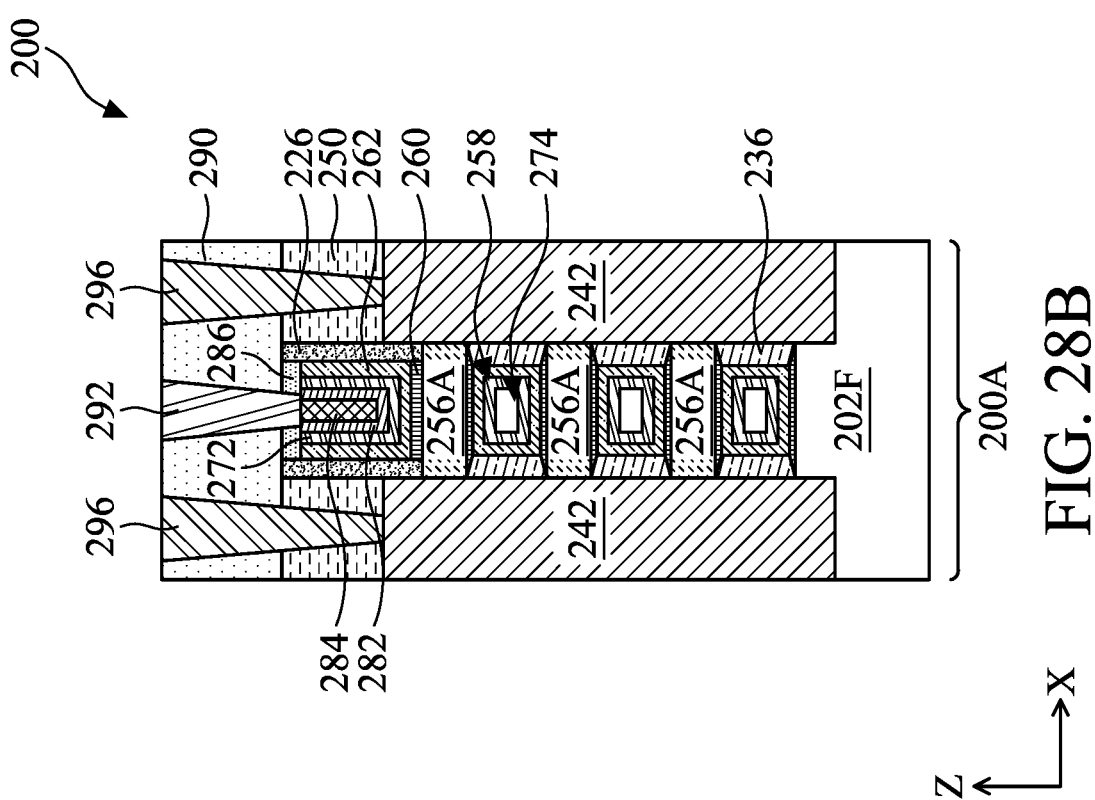

Referring to FIGS. 1 and 28A-28C, the method 100 proceeds to operation 154, in which contacts 292, 294, 296, 298 are formed to provide electrical connections to the n-type FET in the NMOS region 200A and the p-type FET in the PMOS region 200B, in accordance with some embodiments. FIG. 28A is a cross-sectional view of the semiconductor device 200 of FIG. 27A after forming the contacts 292, 294, 296, 298. FIG. 28B is a cross-sectional view of the semiconductor device 200 of FIG. 28A along line X1-X1. FIG. 28C is a cross-sectional view of the semiconductor device 200 of FIG. 28A along line X2-X2.

The contacts includes a first gate contact 292 in contact with the first gate stack 260, 262, 272, 282, 284 in the NMOS region 200A, a second gate contact 294 in contact with the second gate stack 260, 262, 282, 284 in the PMOS region 200B, first source/drain contacts 296 in contact with the first source/drain structures 242 in the NMOS region 200A, and second source/drain contacts 298 in contact with the second source/drains structures 244 in the PMOS region 200B. In some embodiments, the contacts 292, 294, 296, 298 may be formed by first depositing a dielectric layer 290 over the ILD layer 250, the gate cap 286 and the gate spacers 226. Contact openings including gate contact openings extending through the dielectric layer 290 and the gate cap 286 and source/drain contact openings extending through the dielectric layer 290 and the ILD layer 250 are then formed by one or more etching processes. Subsequently, a conductive material is then deposited to fill the contact openings to form the various gate contacts 292, 294 and source/drain contacts 296, 298. In some embodiments, before depositing the conductive material, a diffusion barrier layer may be deposited along sidewalls and bottom surfaces of the contact openings to prevent the diffusion of the conductive material.

One aspect of this description relates to a semiconductor device. The semiconductor device includes a plurality of first channel nanostructures spaced apart from each other and in a first device region as well as a plurality of second channel nanostructures spaced apart from each other and in a second device region. The semiconductor device further includes a plurality of dielectric fins including a first dielectric fin at a shared boundary between the first device region and the second device region, a second dielectric fin at a boundary of the first device region opposite the shared boundary, and a third dielectric fin at a boundary of the second device region opposite the shared boundary. The semiconductor device further includes a gate dielectric layer surrounding each of the first channel nanostructures and each of the second channel nanostructures and over the first, the second and the third dielectric fins. The semiconductor device further includes a first work function layer surrounding each of the first channel nanostructures and over the gate dielectric layer and the first and the second dielectric fins. The semiconductor device further includes a second work function layer surrounding each of the second channel nanostructures and over the gate dielectric layer, the first, the second and the third dielectric fins and the first work function layer. A first gap is present between every adjacent first channel nanostructures, and a second gap is present between every adjacent second channel nanostructures.

Another aspect of this description relates to a semiconductor device. The semiconductor device includes a substrate, first channel nanostructures disposed in a first device region of the substrate and spaced apart from each other by a first space, and second channel nanostructures disposed in a second device region of the substrate and spaced apart from each other by a second space. The semiconductor device further includes a first dielectric fin disposed at a boundary between the first device region and the second device region, the first dielectric fin spaced apart from a first end of each of the first channel nanostructures by a third space and spaced apart from a first end of each of the second channel nanostructures by a fourth space. The semiconductor device further includes a second dielectric fin disposed at a boundary of the first device region, the second dielectric fin spaced apart from a second end of each of the first channel nanostructures opposite the first end by a fifth space. The semiconductor device further includes a third dielectric fin disposed at a boundary of the second device region, the third dielectric fin spaced apart from a second end of each of the second channel nanostructures opposite the first end by a sixth space. The semiconductor device further includes a gate dielectric layer surrounding each of the first channel nanostructures and each of the second channel nanostructures and over the first, the second and the third dielectric fins. The semiconductor device further includes a first work function layer surrounding each of the first channel nanostructures and over the gate dielectric layer and the first and the second dielectric fins, wherein the first work function layer fully fills the third and fifth spaces, but partially fills the first space. The semiconductor device further includes a second work function layer surrounding each of the second channel nanostructures and over the gate dielectric layer, the first, the second and the third dielectric fins and the first work function layer, wherein the second work function layer fully fills the fourth and sixth spaces, but partially fills the second space.

Still another aspect of this description relates to a method for forming a semiconductor device. The method includes forming a plurality of first channel nanostructures in a first device region of a substrate and a plurality of second channel nanostructures in a second device region of the substrate. The method further includes forming a first, a second and a third dielectric fins at boundaries of the first device region and the second device region, wherein the plurality of first channel nanostructures is disposed between the first dielectric fin and the second dielectric fin, and the plurality of second channel nanostructures is disposed between the first dielectric fin and the third dielectric fin. The method further includes depositing a gate dielectric layer to surround each of the first channel nanostructures and each of the second channel nanostructures and over the first, the second and the third dielectric fins. The method further includes depositing a sacrificial layer in the first and the second device regions over the gate dielectric layer to surround each of the first channel nanostructures and each of the second channel nanostructures and over the first, the second and the third dielectric fins, the sacrificial layer merging the first channel nanostructures with the first and the second dielectric fins in the first device region and merging the second channel nanostructures with the first and the third dielectric fins in the second device region. The method further includes recessing the sacrificial layer to provide a recessed sacrificial layer, thereby exposing a top portion of a topmost first channel nanostructure of the plurality of first channel nanostructures and a top portion of a topmost second channel nanostructure of the plurality of second channel nanostructures. The method further includes removing a portion of the recessed sacrificial layer in the first device region. The method further includes depositing a first work function layer in the first and the second device regions to surround each of the first channel nanostructures and over a remaining portion of the recessed sacrificial layer in the second device region and the first, the second and the third dielectric fins, wherein the first work function layer merges the first channel nanostructures with the first and the second dielectric fins, but does not merge adjacent first channel nanostructures. The method further includes removing a portion of the first work function layer in the second device region. The method further includes removing the remaining portion of the recessed sacrificial layer. The method further includes depositing a second work function layer in the first and the second device regions to surround each of the second channel nanostructures, on a remaining portion of the first work function layer in the first device region and over the first, the second and the third dielectric fins, wherein the second work function layer merges the second channel nanostructures with the first and third dielectric fins, but does not merge adjacent second channel nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of first channel nanostructures spaced apart from each other and in a first device region;
   a plurality of second channel nanostructures spaced apart from each other and in a second device region;
   a plurality of dielectric fins including a first dielectric fin at a shared boundary between the first device region and the second device region, a second dielectric fin at a boundary of the first device region opposite the shared boundary, and a third dielectric fin at a boundary of the second device region opposite the shared boundary;
   a gate dielectric layer surrounding each of the first channel nanostructures and each of the second channel nanostructures and over the first, the second and the third dielectric fins;
   a first work function layer surrounding each of the first channel nanostructures and over the gate dielectric layer and the first and the second dielectric fins, the first work function layer comprising a first material;
   a second work function layer surrounding each of the second channel nanostructures and over the gate dielectric layer, the first, the second and the third dielectric fins and the first work function layer, the second work function layer comprising a second material different from the first material;
a first gap present between every adjacent first channel nanostructures with ends of the first gap closed off by the first work function layer; and
a second gap present between every adjacent second channel nanostructures with ends of the second gap closed off by the second work function layer.

2. The semiconductor device of claim 1, wherein the first work function layer has an edge located above the first dielectric fin.

3. The semiconductor device of claim 1, wherein the first work function layer comprises an n-type work function material, and the second work function layer comprises a p-type work function material.

4. The semiconductor device of claim 1, wherein the first work function layer merges the first channel nanostructures with the first and the second dielectric fins.

5. The semiconductor device of claim 1, wherein the second work function layer merges the second channel nanostructures with the first and the third dielectric fins.

6. The semiconductor device of claim 1, wherein the gate dielectric layer includes an interfacial layer and a high-k gate dielectric layer over the interfacial layer.

7. The semiconductor device of claim 1, further comprising:
first source/drain structures on opposite sides of the first channel nanostructures; and
second source/drain structures on opposite sides of the second channel nanostructures.

8. A semiconductor device, comprising:
a substrate;
first channel nanostructures disposed in a first device region of the substrate and spaced apart from each other by a first space;
second channel nanostructures disposed in a second device region of the substrate and spaced apart from each other by a second space;
a first dielectric fin disposed at a boundary between the first device region and the second device region, the first dielectric fin spaced apart from a first end of each of the first channel nanostructures by a third space and spaced apart from a first end of each of the second channel nanostructures by a fourth space;
a second dielectric fin disposed at a boundary of the first device region, the second dielectric fin spaced apart from a second end of each of the first channel nanostructures opposite the first end by a fifth space;
a third dielectric fin disposed at a boundary of the second device region, the third dielectric fin spaced apart from a second end of each of the second channel nanostructures opposite the first end by a sixth space;
a gate dielectric layer surrounding each of the first channel nanostructures and each of the second channel nanostructures and over the first, the second and the third dielectric fins;
a first work function layer surrounding each of the first channel nanostructures and over the gate dielectric layer and the first and the second dielectric fins, wherein the first work function layer fully fills the third and fifth spaces, but partially fills the first space; and
a second work function layer surrounding each of the second channel nanostructures and over the gate dielectric layer, the first, the second and the third dielectric fins and the first work function layer, wherein the second work function layer fully fills the fourth and sixth spaces, but partially fills the second space.

9. The semiconductor device of claim 8, wherein the first work function layer partially overlaps the first dielectric fin.

10. The semiconductor device of claim 8, wherein each of the third, the fourth, the fifth and the six spaces is in the range from about 5 nm to about 15 nm.

11. The semiconductor device of claim 8, wherein each of the first and the second spaces is from about 10 nm to about 20 nm.

12. The semiconductor device of claim 8, wherein the first work function layer comprises titanium aluminum carbide (TiAlC), titanium aluminum (TiAl), tantalum aluminum carbide (TaAlC), tantalum carbide (TaC), tantalum aluminum silicon carbide (TaAlSiC), or titanium aluminum silicon carbide (TiAlSiC).

13. The semiconductor device of claim 8, wherein the second work function layer comprises titanium nitride (TiN), tungsten carbon nitride (WCN), titanium silicon nitride (TiSiN), or tantalum nitride (TaN).

14. The semiconductor device of claim 8, further comprising:
first source/drain structures on opposite sides of the first channel nanostructures; and
second source/drain structures on opposite sides of the second channel nanostructures,
wherein the first source/drain structures and the second source/drain structures are spaced from the gate dielectric layer by an inner spacer.

15. The semiconductor device of claim 14, further comprising source/drain contact structures contacting first source/drain structures and second source/drain structures.

16. An integrated circuit, comprising:
a substrate including a first substrate region and a second substrate region adjacent to the first substrate region;
a first device over the first substrate region, the first device comprising:
a first vertical stack of first channel nanostructures,
a first gate structure including a first portion surrounding the first vertical stack of the first channel nanostructures and a second portion over a topmost first channel nanostructure, the first gate structure comprising an n-type work function material,
first source/drain structures contacting opposite ends of the first vertical stack of the first channel nanostructures, and
a first air gap between two adjacent first channel nanostructures with ends of the first air gap closed off by the n-type work function material;
a second device over the second substrate region, the second device comprising:
a second vertical stack of second channel nanostructures,
a second gate structure including a first portion surrounding the second vertical stack of the second channel nanostructures, and a second portion over a topmost second channel nanostructure, the second gate structure comprising a p-type work function material,
second source/drain structures contacting opposite ends of the second vertical stack of the second channel nanostructures, and
a second air gap between two adjacent second channel nanostructures with ends of the second air gap closed off by the p-type work function material; and
a dielectric fin positioned between the first device and the second device, wherein the first portion of the first gate structure contacts a first sidewall of the dielectric fin, and the first portion of the second gate structure contacts a second sidewall of the dielectric fin opposite to the first sidewall.

17. The integrated circuit of claim 16, wherein the first portion of the first gate structure comprises a first portion of a high-k dielectric layer surrounding each of the first channel nanostructures and a first portion of an n-type work function layer over the first portion of the high-k dielectric layer, and wherein the second portion of the first gate structure comprises a second portion of the high-k dielectric layer, a second portion of the n-type work function layer surrounded by the second portion of the high-k dielectric layer, a first portion of a p-type work function layer surrounded by the second portion of the n-type work function layer, and a first portion of a conductive material layer surrounded by the first portion of the p-type work function layer, the first portion of the n-type work function layer contacting the first sidewall of the dielectric fin, wherein the n-type work function layer comprises the n-type work function material.

18. The integrated circuit of claim 17, wherein the first portion of the second gate structure comprises a third portion of the high-k dielectric layer surrounding each of the second channel nanostructures and a second portion of the p-type work function layer over the third portion of the high-k dielectric layer, and wherein the second portion of the second gate structure comprises a fourth portion of the high-k dielectric layer, a third portion of the p-type work function layer surrounded by the fourth portion of the high-k dielectric layer, and a second portion of the conductive material layer surrounded by the third portion of the p-type work function layer, the second portion of the p-type work function layer contacting the second sidewall of the dielectric fin, wherein the p-type work function layer comprises the p-type work function material.

19. The integrated circuit of claim 16, wherein the first air gap and second air gap independently have a height ranging from about 0.1 nm to about 5 nm.

20. The integrated circuit of claim 17, wherein one end of the second portion of the n-type work function layer is above a top surface of the dielectric fin.

* * * * *